(12) United States Patent
Harada et al.

(10) Patent No.: US 10,510,770 B2
(45) Date of Patent: Dec. 17, 2019

(54) THREE-DIMENSIONAL MEMORY DEVICE

(71) Applicant: TOSHIBA MEMORY CORPORATION, Minato-ku (JP)

(72) Inventors: Hisashi Harada, Yokkaichi (JP); Jun Nishimura, Kuwana (JP); Ayaha Hachisuga, Yokkaichi (JP); Hiroshi Nakaki, Yokkaichi (JP); Yukie Miyazaki, Mie (JP); Keisuke Suda, Yokkaichi (JP); Yu Hirotsu, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/127,763

(22) Filed: Sep. 11, 2018

(65) Prior Publication Data

US 2019/0287998 A1 Sep. 19, 2019

(30) Foreign Application Priority Data

Mar. 14, 2018 (JP) .................................. 2018-046578

(51) Int. Cl.
*H01L 27/11582* (2017.01)
*H01L 29/06* (2006.01)
(Continued)

(52) U.S. Cl.
CPC .... *H01L 27/11582* (2013.01); *H01L 21/8221* (2013.01); *H01L 23/528* (2013.01);
(Continued)

(58) Field of Classification Search
CPC .......... H01L 27/11578; H01L 27/2481; H01L 29/40117; H01L 23/5226; H01L 27/0688;
(Continued)

(56) References Cited

U.S. PATENT DOCUMENTS 8,692,311 B2   4/2014   Shinohara et al.
8,791,524 B2   7/2014   Ichinose et al.
(Continued)

FOREIGN PATENT DOCUMENTS

JP   2012-204592   10/2012
JP   2013-065693    4/2013
(Continued)

*Primary Examiner* — Ngan V Ngo
(74) *Attorney, Agent, or Firm* — Oblon, McClelland, Maier & Neustadt, L.L.P.

(57) ABSTRACT

A semiconductor device includes a base body portion, a stacked body, a pedestal portion, a plate portion, and first and second columnar portions. The base body portion includes a doped semiconductor film and a semiconductor portion. The doped semiconductor film includes first and second portions. The semiconductor portion includes a first region overlapping the first portion, and a second region overlapping the second portion and being a body different from the first region. The pedestal portion is provided in the second region. The plate portion contacts the pedestal portion and the first region. The first columnar portion includes a semiconductor layer. The semiconductor layer is adjacent to the plate portion with the stacked body interposed, and contacts the first region. The second columnar portion is adjacent to the plate portion with the stacked body interposed, and is adjacent to the pedestal portion with the second region interposed.

2 Claims, 44 Drawing Sheets

(51) Int. Cl.

| | |
|---|---|
| *H01L 27/11565* | (2017.01) |
| *H01L 23/528* | (2006.01) |
| *H01L 29/10* | (2006.01) |
| *H01L 21/28* | (2006.01) |
| *H01L 27/11551* | (2017.01) |
| *H01L 27/11578* | (2017.01) |
| *H01L 23/522* | (2006.01) |
| *H01L 27/24* | (2006.01) |
| *H01L 27/06* | (2006.01) |
| *H01L 21/822* | (2006.01) |
| *H01L 21/02* | (2006.01) |
| *H01L 29/66* | (2006.01) |
| *H01L 29/51* | (2006.01) |
| *H01L 21/311* | (2006.01) |
| *H01L 21/027* | (2006.01) |

(52) U.S. Cl.
CPC ...... *H01L 23/5226* (2013.01); *H01L 27/0688* (2013.01); *H01L 27/11551* (2013.01); *H01L 27/11565* (2013.01); *H01L 27/11578* (2013.01); *H01L 27/2481* (2013.01); *H01L 29/0649* (2013.01); *H01L 29/1037* (2013.01); *H01L 29/40117* (2019.08); *H01L 21/0217* (2013.01); *H01L 21/0273* (2013.01); *H01L 21/02164* (2013.01); *H01L 21/02532* (2013.01); *H01L 21/02636* (2013.01); *H01L 21/31111* (2013.01); *H01L 21/31144* (2013.01); *H01L 29/513* (2013.01); *H01L 29/518* (2013.01); *H01L 29/66545* (2013.01); *H01L 2224/32145* (2013.01); *H01L 2224/48145* (2013.01)

(58) Field of Classification Search
CPC ..... H01L 27/11551; H01L 2224/32145; H01L 21/8221; H01L 2224/48145
See application file for complete search history.

(56) References Cited

U.S. PATENT DOCUMENTS

| | | | |
|---|---|---|---|
| 2012/0003800 A1* | 1/2012 | Lee | H01L 27/11551 438/261 |
| 2013/0234235 A1 | 9/2013 | Matsuda et al. | |
| 2014/0054675 A1 | 2/2014 | Lee et al. | |
| 2015/0104916 A1* | 4/2015 | Lee | H01L 27/1157 438/268 |
| 2015/0255483 A1 | 9/2015 | Noda | |
| 2015/0263037 A1 | 9/2015 | Noda | |
| 2015/0372003 A1 | 12/2015 | Noda | |
| 2017/0148810 A1* | 5/2017 | Kai | H01L 27/11582 |
| 2017/0278859 A1* | 9/2017 | Sharangpani | H01L 27/11573 |
| 2018/0047744 A1* | 2/2018 | Utsumi | H01L 29/792 |
| 2018/0269219 A1* | 9/2018 | Ito | H01L 27/11565 |
| 2018/0374529 A1* | 12/2018 | Kimura | G11C 11/40 |
| 2019/0035733 A1* | 1/2019 | Park | H01L 27/11582 |
| 2019/0043881 A1* | 2/2019 | Kim | H01L 27/11582 |
| 2019/0259772 A1* | 8/2019 | Takahashi | H01L 45/143 |
| 2019/0267392 A1* | 8/2019 | Nakatsuka | H01L 29/517 |
| 2019/0280001 A1* | 9/2019 | Terasawa | H01L 27/11582 |
| 2019/0280002 A1* | 9/2019 | Kai | H01L 29/40117 |

FOREIGN PATENT DOCUMENTS

| | | |
|---|---|---|
| JP | 2015-170742 | 9/2015 |
| JP | 2015-177134 | 10/2015 |
| JP | 2016-009743 | 1/2016 |

* cited by examiner

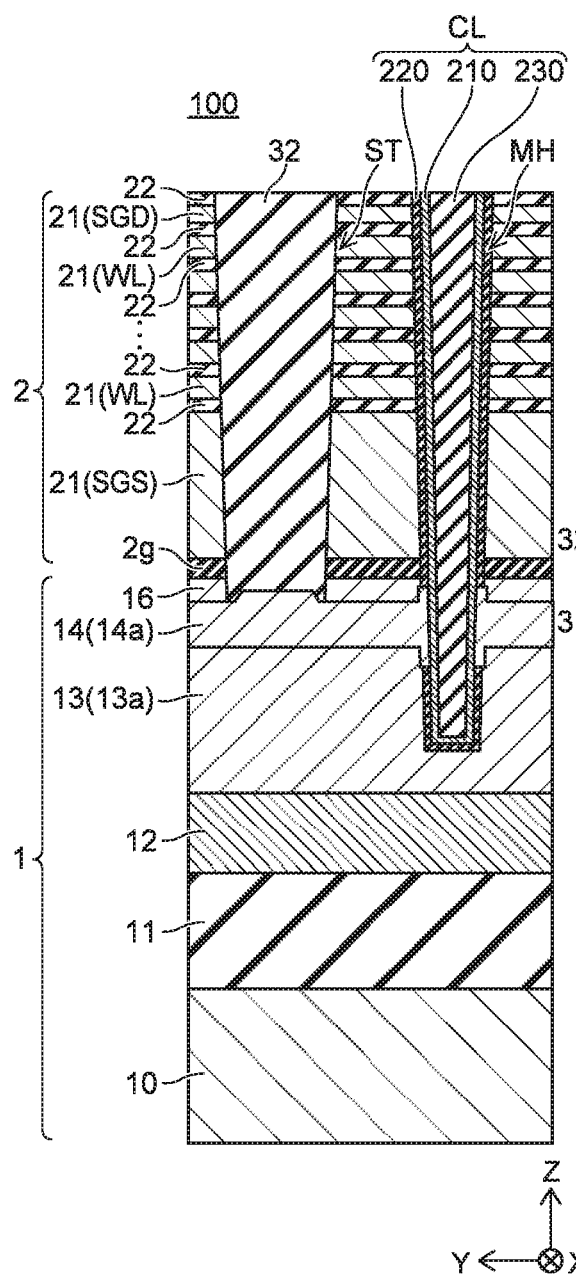
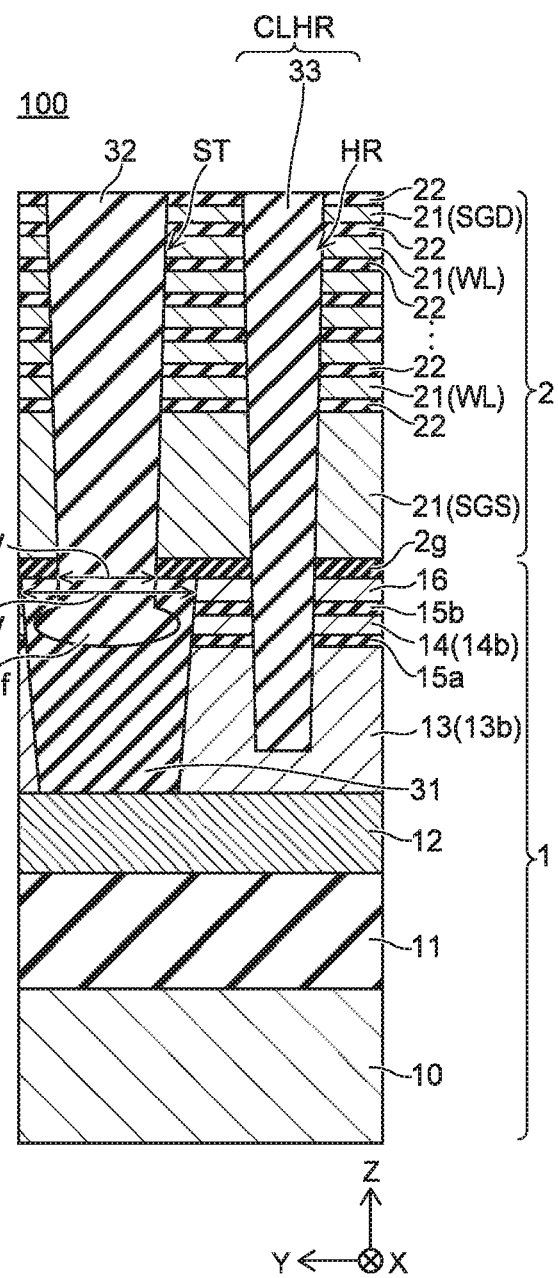

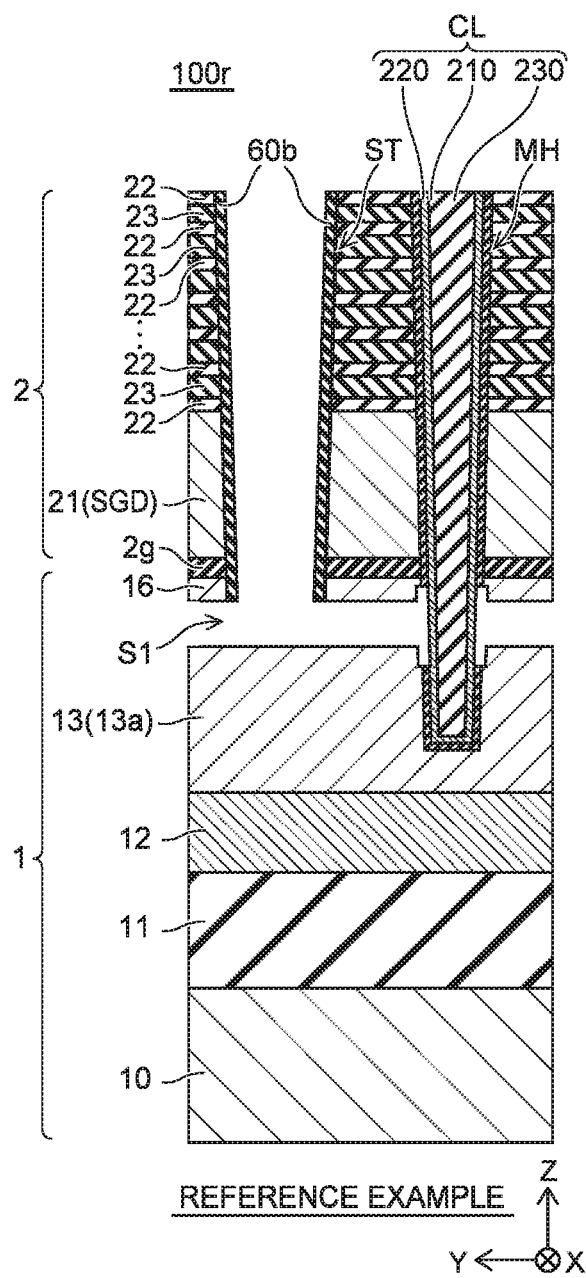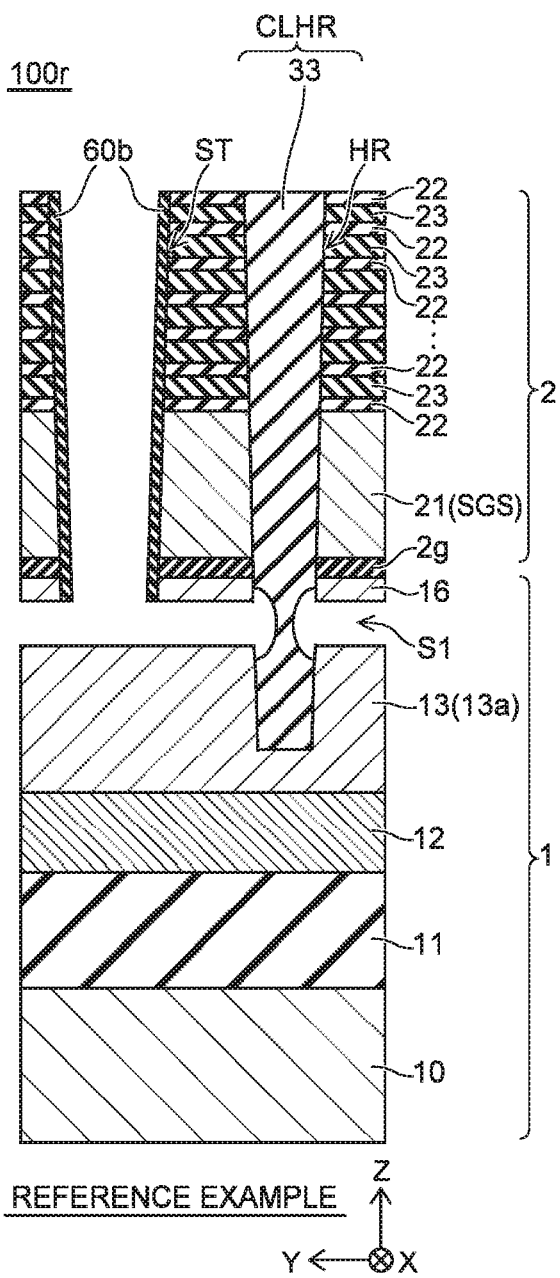

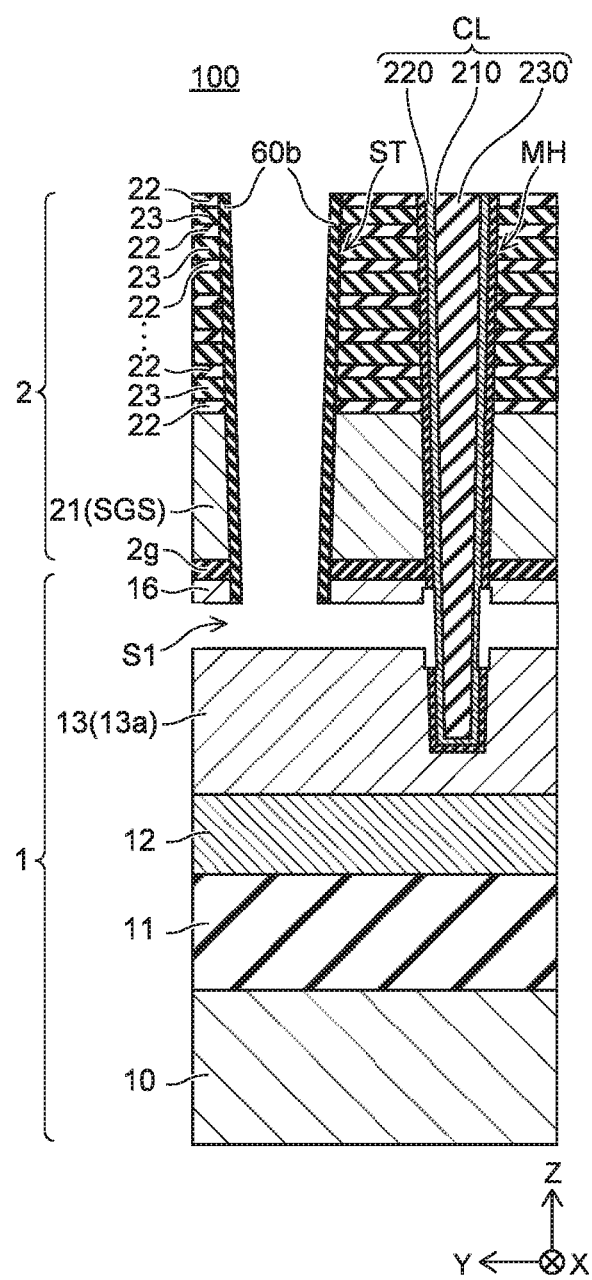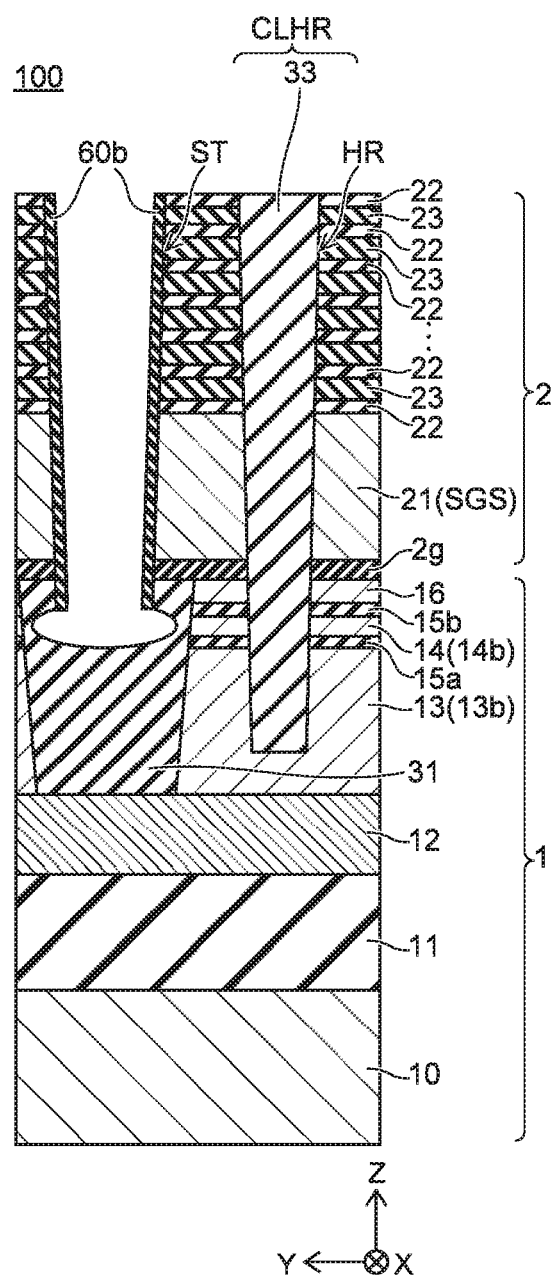

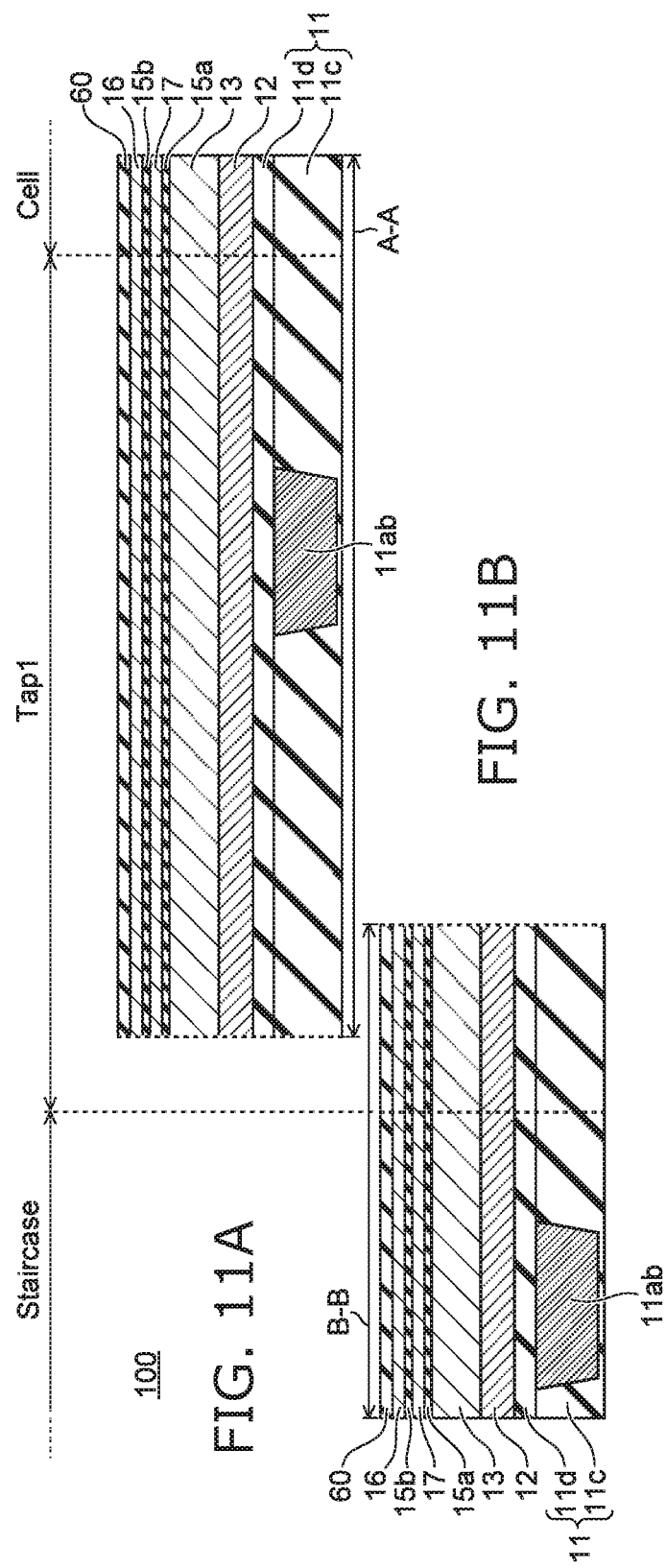

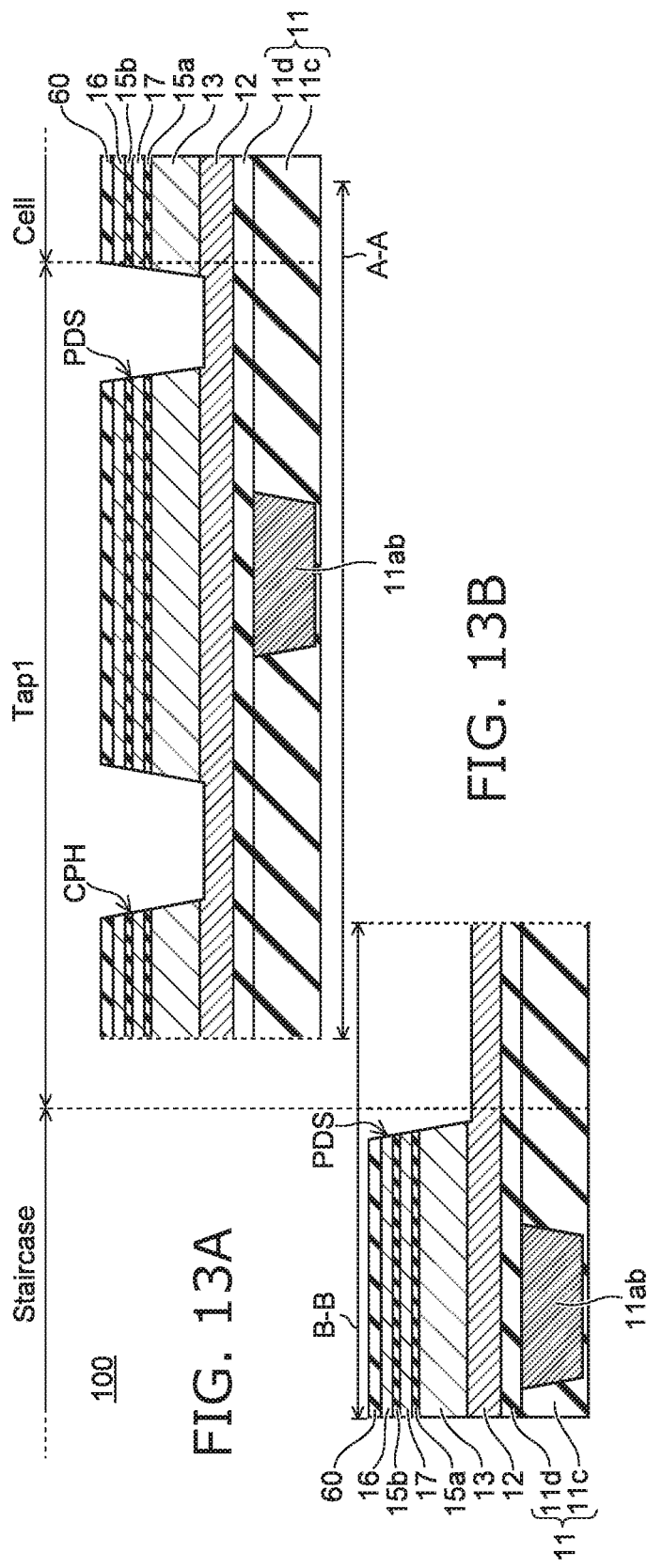

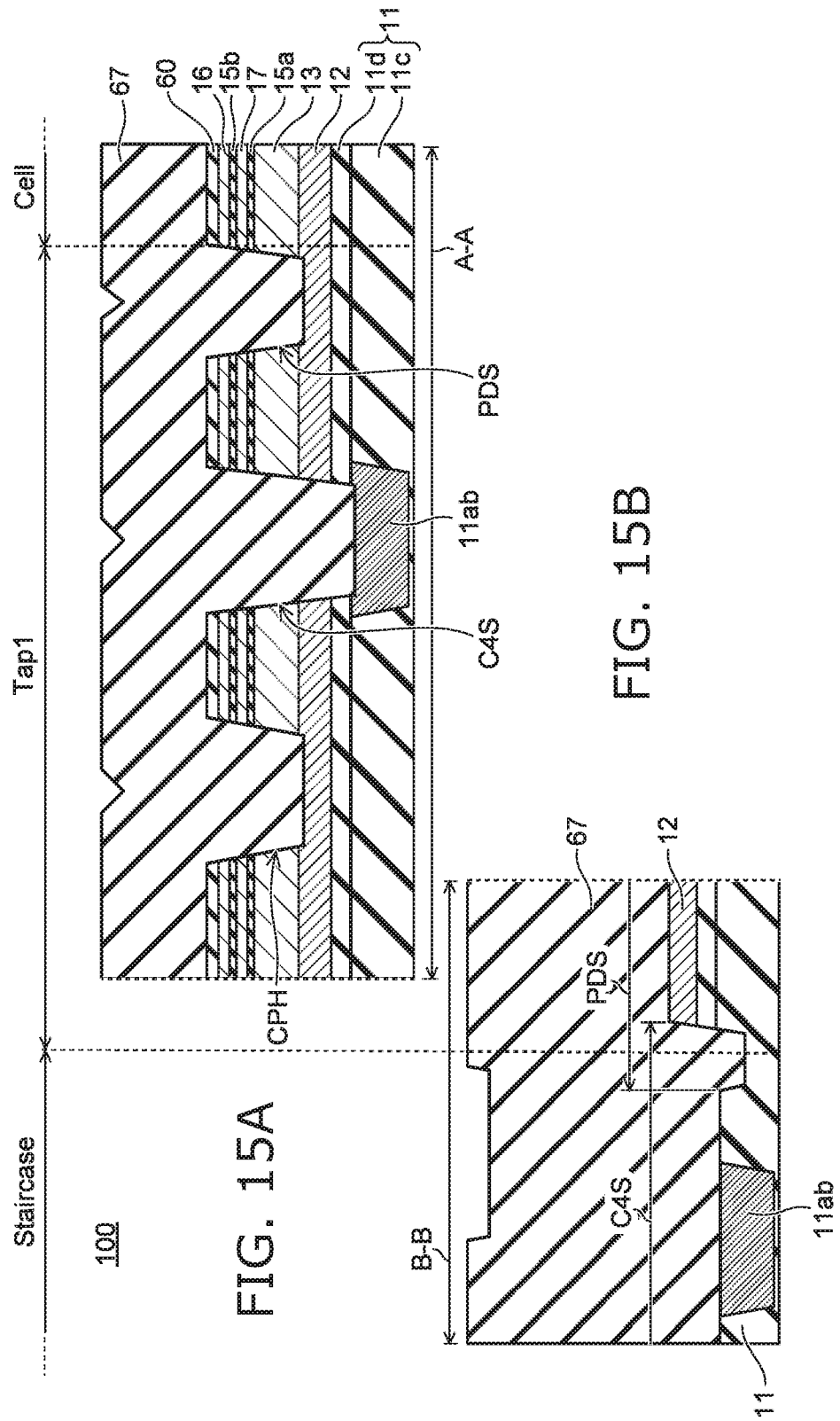

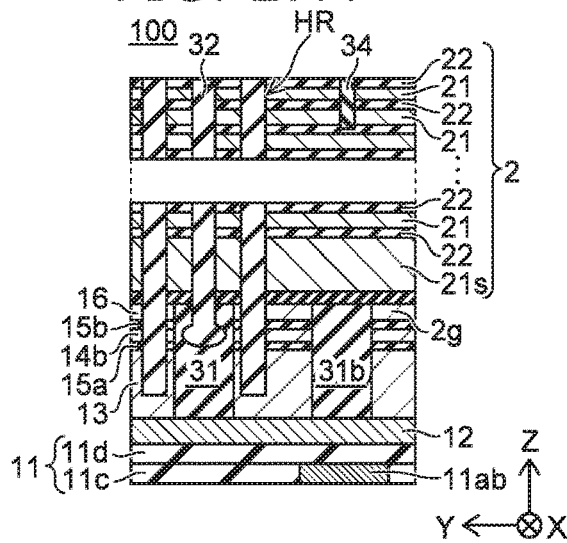
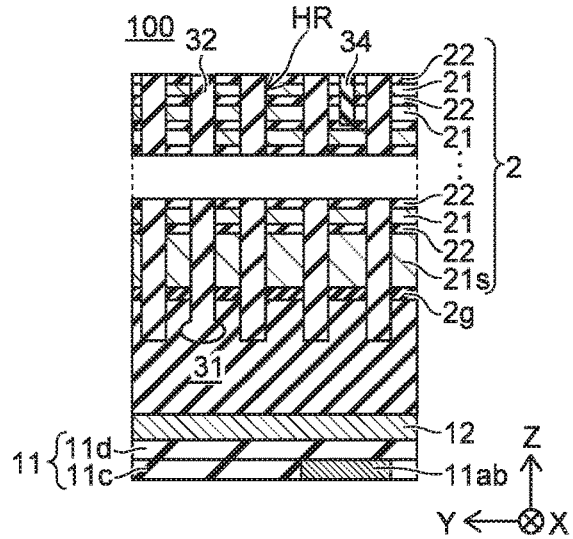
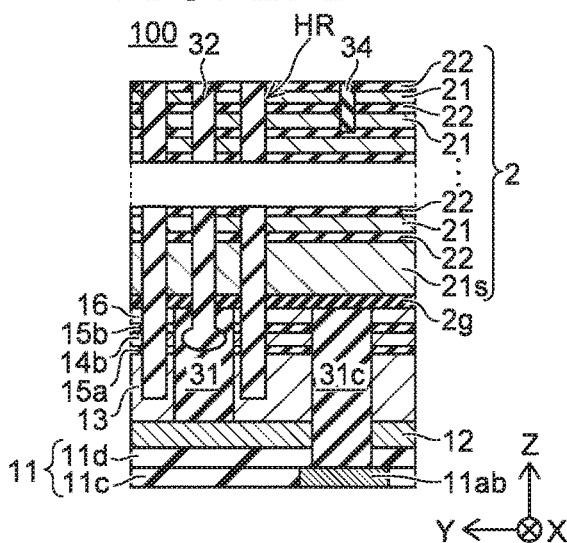
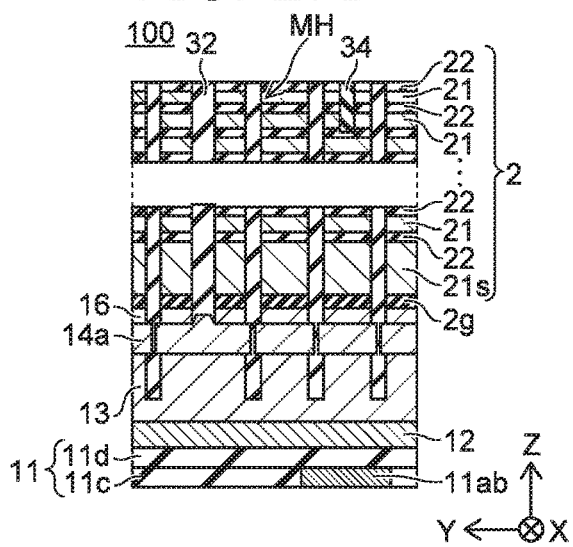
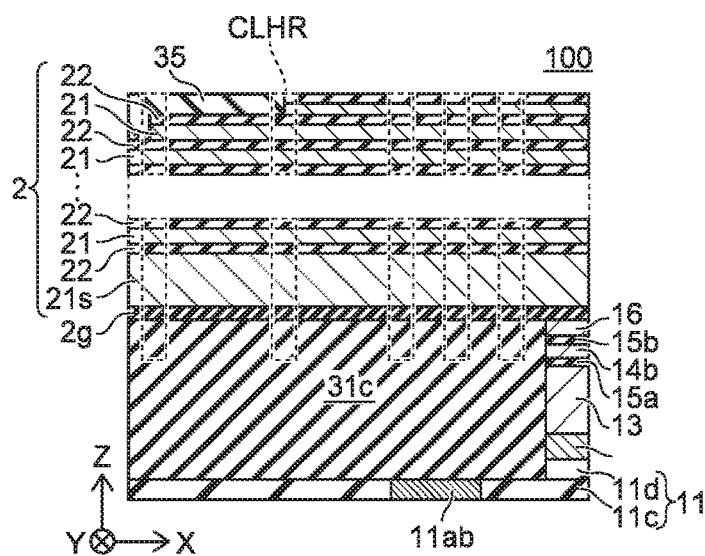

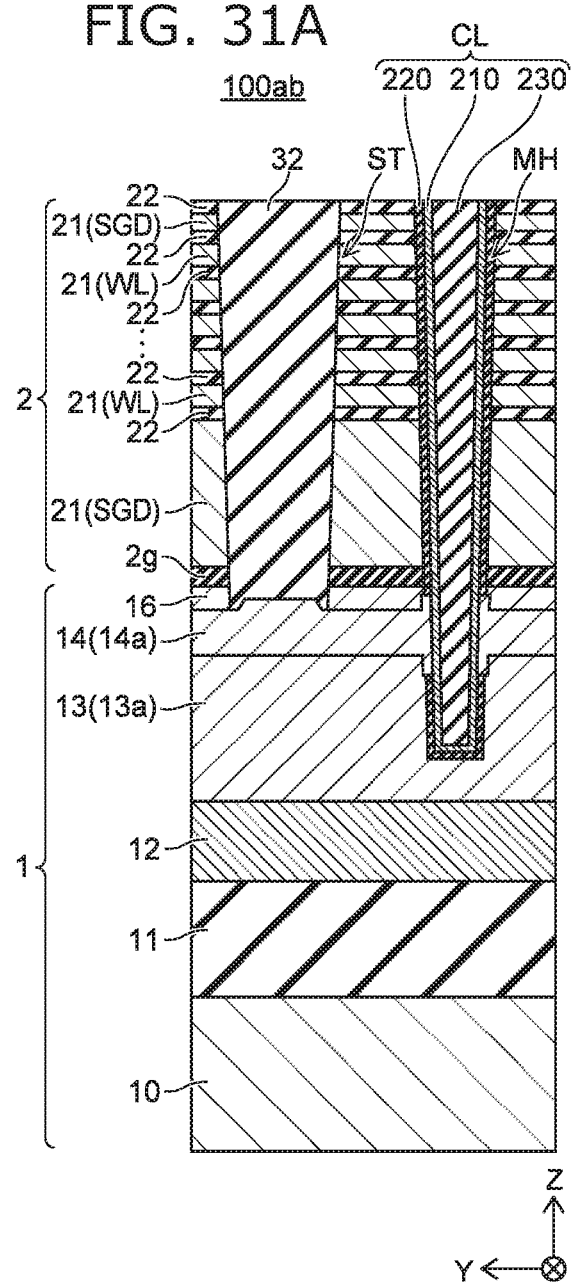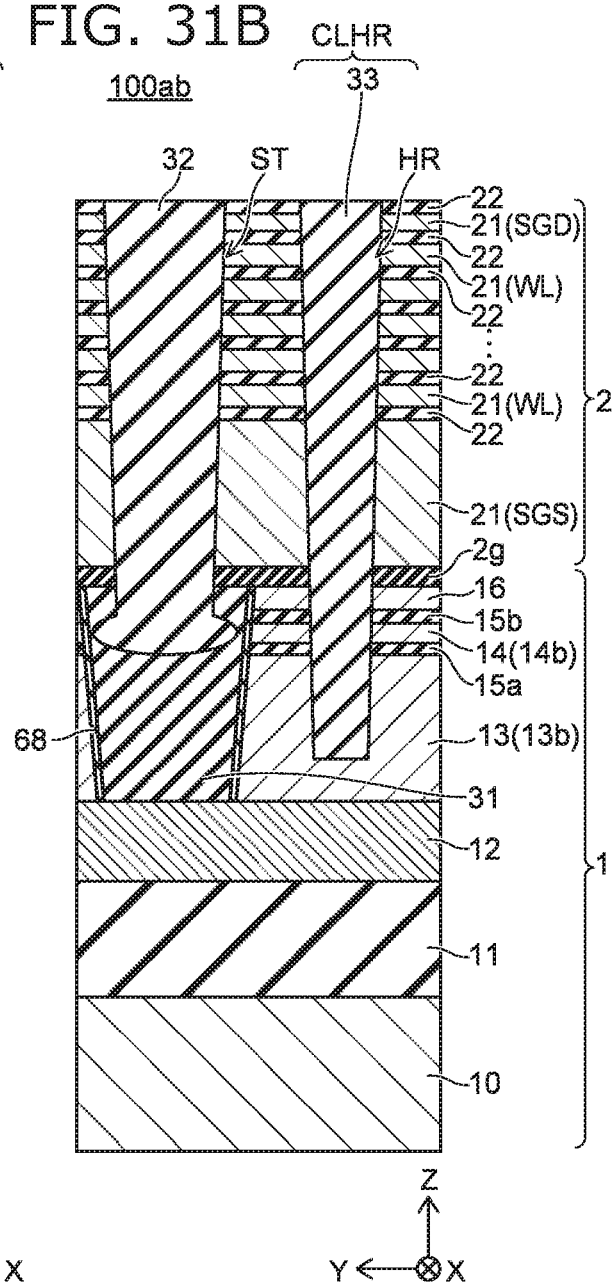

SECOND REFERENCE EXAMPLE

SECOND REFERENCE EXAMPLE

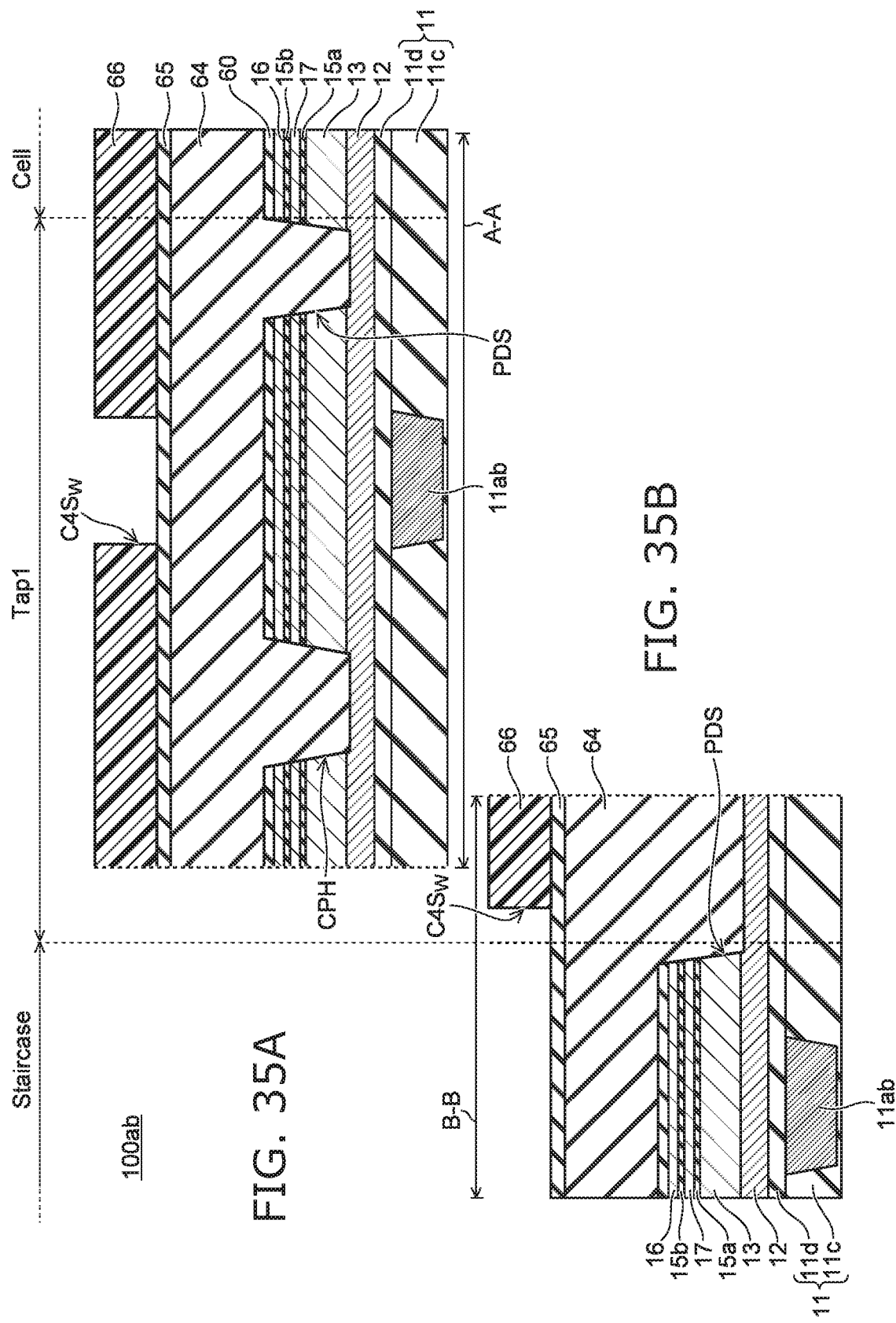

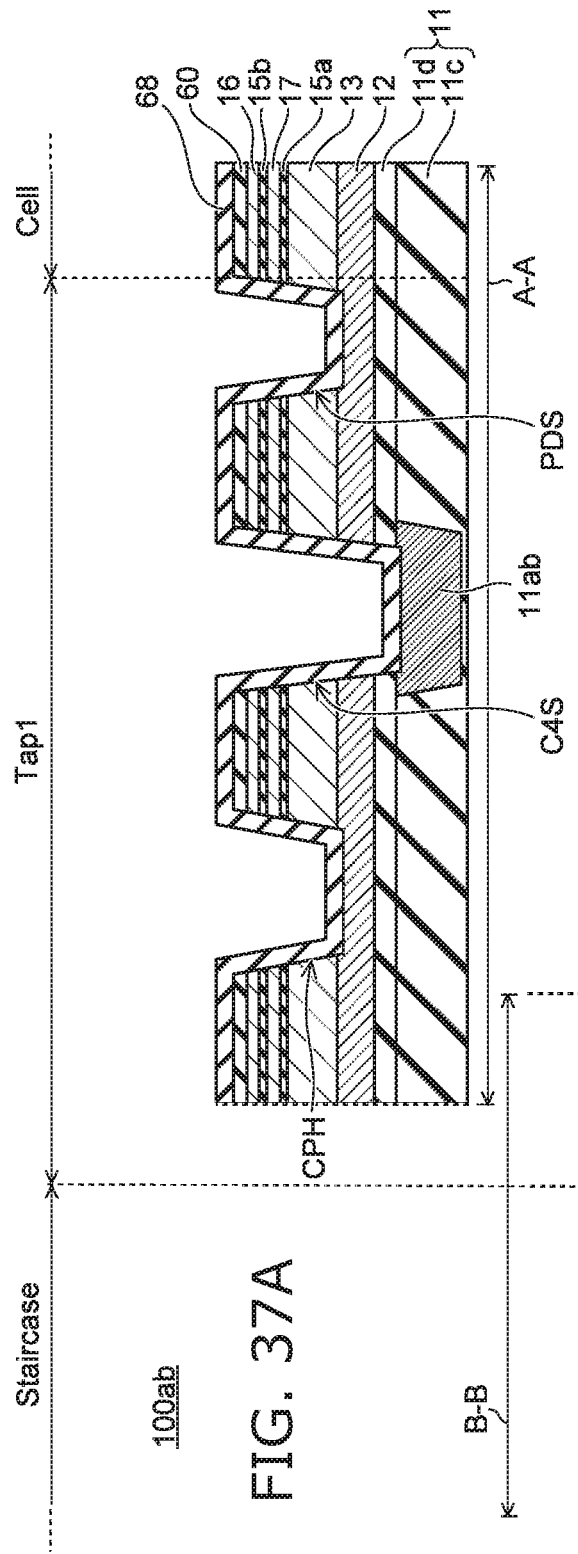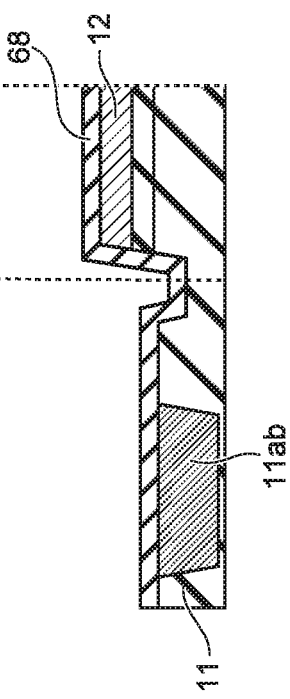

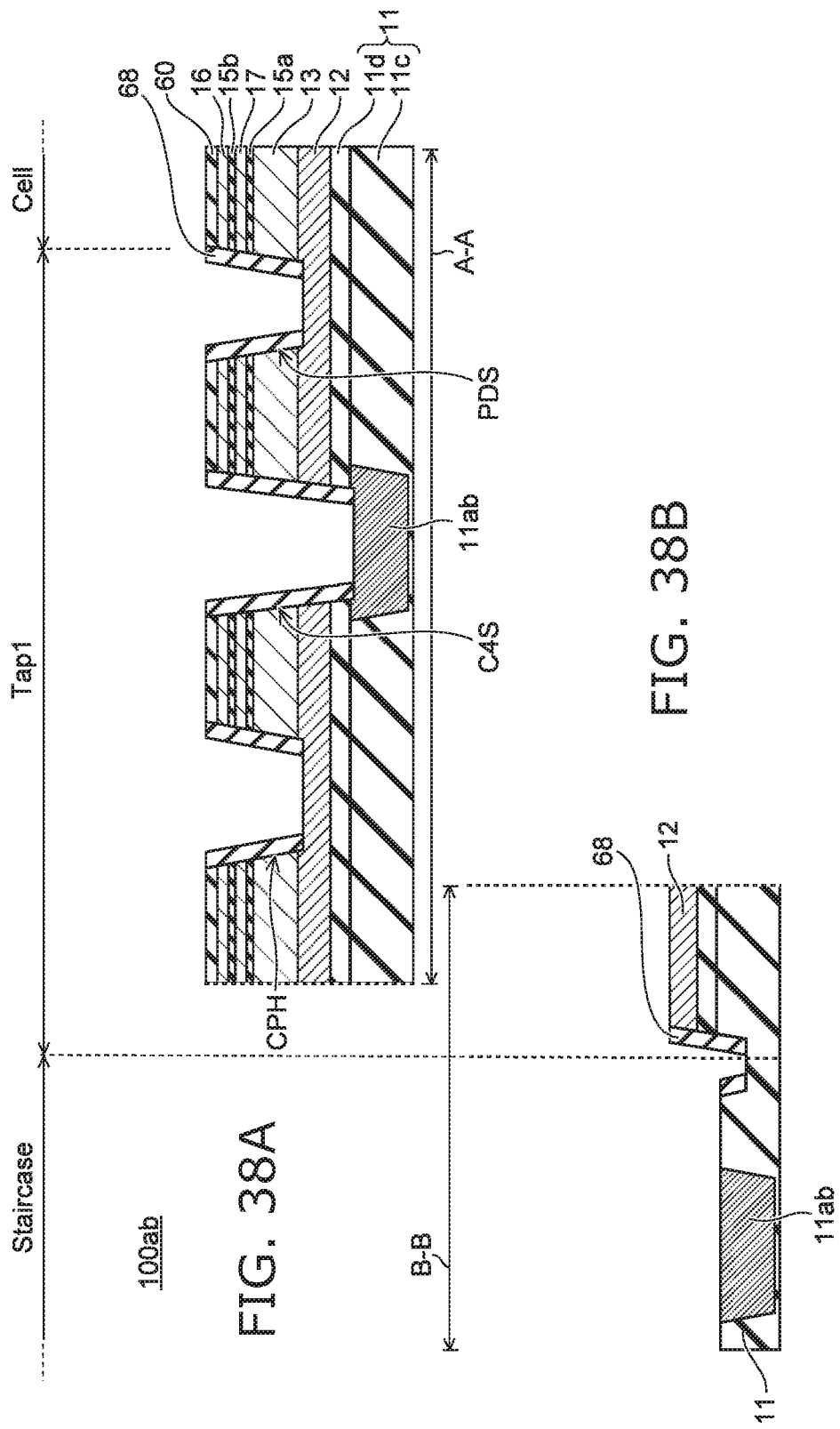

US 10,510,770 B2

THREE-DIMENSIONAL MEMORY DEVICE

CROSS-REFERENCE TO RELATED APPLICATIONS

This application is based upon and claims the benefit of priority from Japanese Patent Application No. 2018-046578, filed on Mar. 14, 2018; the entire contents of which are incorporated herein by reference.

FIELD

Embodiments relate to a semiconductor device.

BACKGROUND

Nonvolatile memory is known in which insulating layers and conductive layers are stacked alternately in a stacked body, and multiple memory cells are stacked in a three-dimensional structure in the height direction of the stacked body. The memory cells are provided between the stacked body and a columnar portion including a semiconductor layer along the height direction of the stacked body. The memory cells are connected electrically in series between, for example, a drain-side select transistor provided in the upper region of the stacked body and, for example, a source-side select transistor provided in the lower region of the stacked body. This is called a NAND string (or a memory string). The conductive layers that are stacked in the height direction of the stacked body are used as a gate (a drain-side select gate) of the drain-side select transistor, control gates (word lines) of the memory cells, and a gate (a source-side select gate) of the source-side select transistor. There are cases where transistors that are included in a memory peripheral circuit are provided under the stacked body. Recently, for the source formation region of the NAND string, for example, a method has been attempted in which a sacrificial film is formed in a portion of the lower region of the stacked body; and the sacrificial film is replaced with a semiconductor layer used to form the source. It is desirable to suppress the collapse of the stacked body when replacing the sacrificial film with the semiconductor layer.

BRIEF DESCRIPTION OF THE DRAWINGS

FIG. 5A is a schematic cross-sectional view along line VA-VA of FIG. 3; and FIG. 5B is a schematic cross-sectional view along line VB-VB of FIG. 3;

FIG. 7A and FIG. 7B are schematic cross-sectional views illustrating a stage partway through a formation of a semiconductor device according to a reference example;

FIG. 8A and FIG. 8B are schematic cross-sectional views illustrating a stage partway through a formation of the semiconductor device according to the first embodiment;

FIG. 11A to FIG. 16B are schematic cross-sectional views in order of the processes, illustrating a method for manufacturing the semiconductor device according to the first embodiment;

FIG. 18A to FIG. 29E are schematic cross-sectional views in order of the processes, illustrating the method for manufacturing the semiconductor device according to the first embodiment;

FIG. 31A and FIG. 31B are schematic cross-sectional views illustrating a semiconductor device according to a second modification of the first embodiment;

FIG. 35A to FIG. 40B are schematic cross-sectional views in order of the processes, illustrating a method for manufacturing the semiconductor device according to the second modification of the first embodiment;

DETAILED DESCRIPTION

Figure 1A:
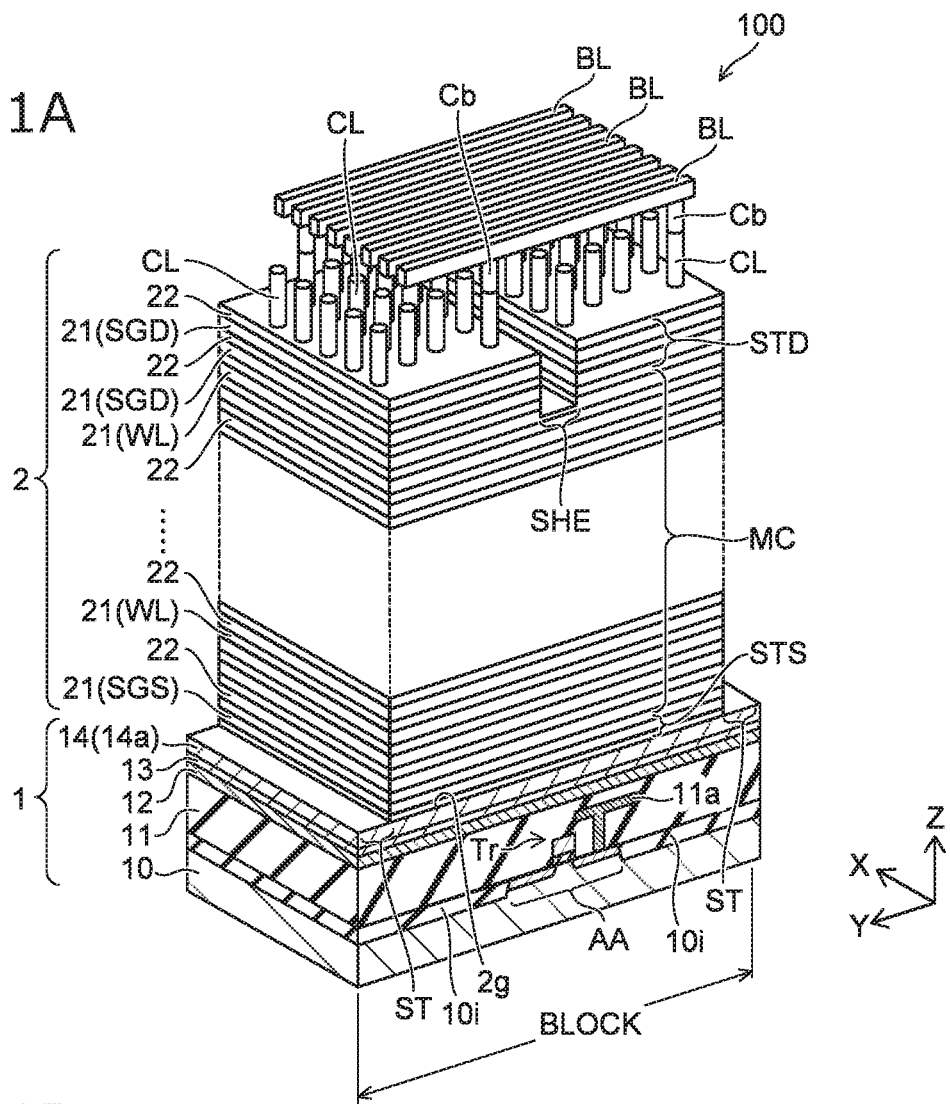
FIG. 1A is a schematic perspective view illustrating a semiconductor device according to a first embodiment.

A semiconductor device according one embodiment, includes a base body portion, a stacked body, a first pedestal portion, a plate portion, a plurality of first columnar portions, and a plurality of second columnar portions. The base body portion includes a substrate, a first insulating film, a first conductive film, a first doped semiconductor film, and a first semiconductor portion. The first insulating film is provided on the substrate. The first conductive film is provided on the first insulating film. The first doped semiconductor film includes a first portion and a second portion provided on the first conductive film. The first portion and the second portion are made of an identical body with each other. The first semiconductor portion is provided on the first doped semiconductor film and includes a first region and a second region. The first region overlaps the first portion and is positioned on the first portion. The second region overlaps the second portion. The second region is a body different from the first region. The stacked body is provided above the base body portion. The stacked body alternately includes a conductive layer and an insulating layer. The first pedestal portion is provided in at least the second region of the first semiconductor portion. The plate portion is provided from an upper end of the stacked body to the first semiconductor portion. The plate portion extends in a first direction, and contacts the first pedestal portion and the first region of the first semiconductor portion. The first direction crosses a stacking direction of the conductive layer and the insulating layer of the stacked body. The plate portion includes at least a first insulator. The first columnar portion is provided from the upper end of the stacked body to the first semiconductor portion. The first columnar portion includes a semiconductor layer and a memory film. The semiconductor layer is adjacent to the plate portion in a second direction with the stacked body interposed. The second direction crosses the first direction. The semiconductor layer contacts the first region of the first semiconductor portion. The memory film includes a charge trapping portion between the semiconductor layer and the conductive layer. The second columnar portion is provided from the upper end of the stacked body to the first semiconductor portion. The second columnar portion includes at least a second insulator. The second columnar portion is adjacent to the plate portion in the second direction with the stacked body interposed, and is adjacent to the first pedestal portion in the second direction with the second region of the first semiconductor portion interposed.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. There are also cases where the dimensions and/or the proportions are illustrated differently between the drawings, even in the case where the same portion is illustrated. In this specification and each drawing, components similar to ones described in reference to an antecedent drawing are marked with the same reference numerals; and a detailed description is omitted as appropriate.

First Embodiment

Semiconductor Device

Figure 1B:
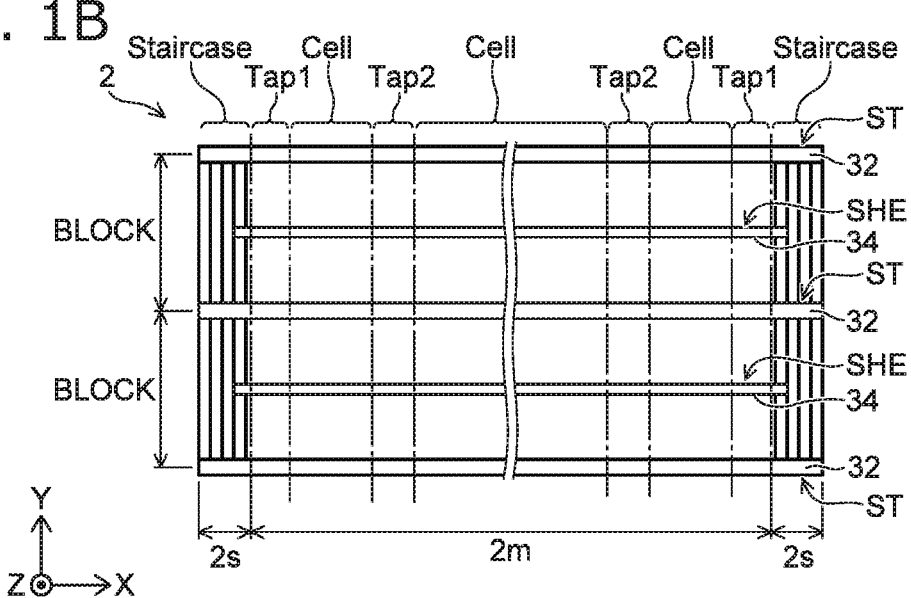
FIG. 1B is a schematic plan view showing a stacked body.

FIG. 1A is a schematic perspective view illustrating a semiconductor device 100 according to a first embodiment. FIG. 1B is a schematic plan view showing a stacked body 2. In the specification, the stacking direction of the stacked body 2 is taken as a Z-axis direction. One direction crossing, e.g., orthogonal to, the Z-axis direction is taken as a first direction. The first direction is an X-axis direction. One direction crossing, e.g., orthogonal to, the Z- and X-axis directions is taken as a second direction. The second direction is a Y-axis direction.

Figure 2A:
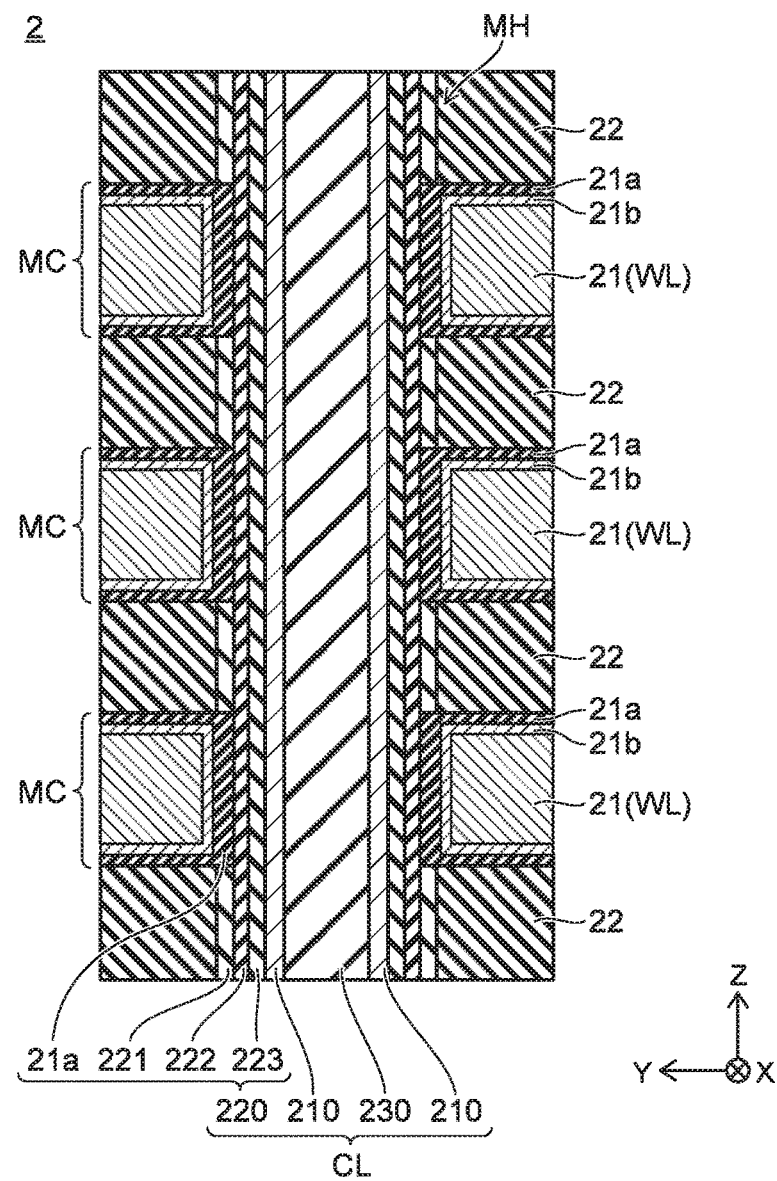
FIG. 2A and FIG. 2B are schematic cross-sectional views illustrating memory cells having a three-dimensional structure.
Figure 2B:
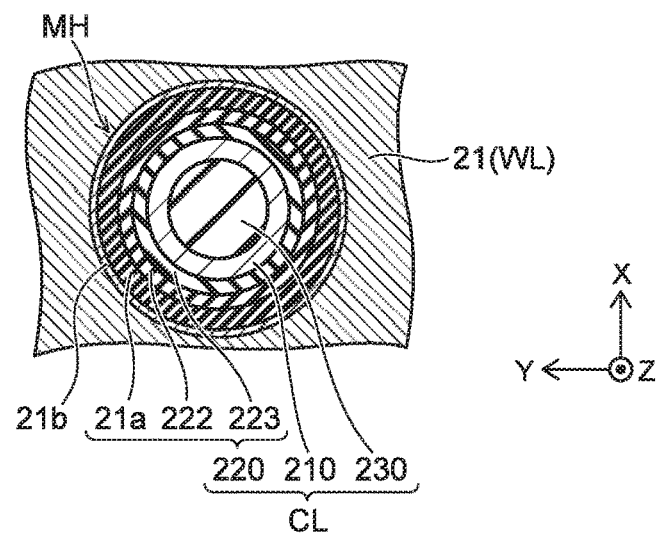
Figure 3:
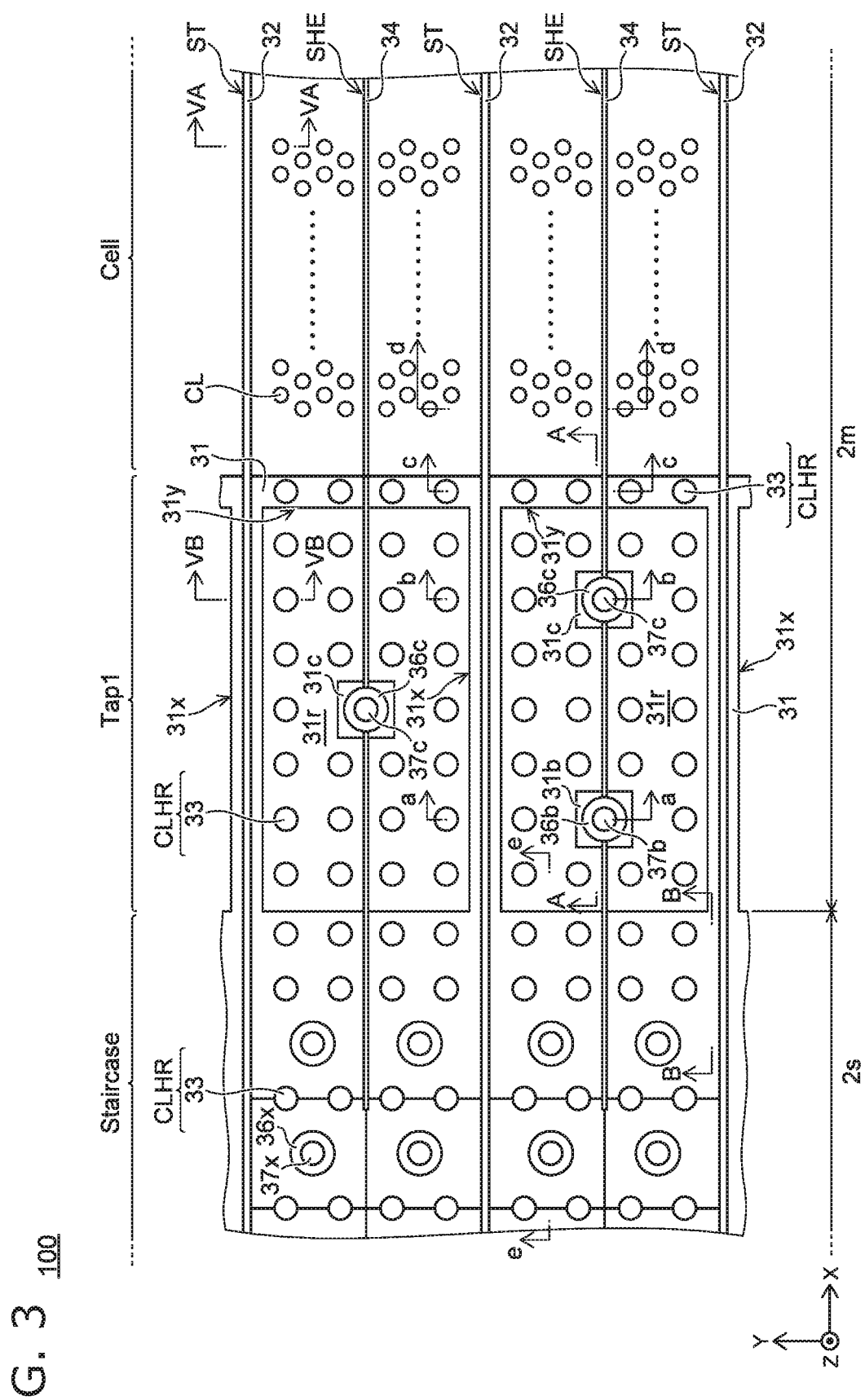
FIG. 3 is a schematic plan view illustrating a periphery of a tap region.
Figure 4:
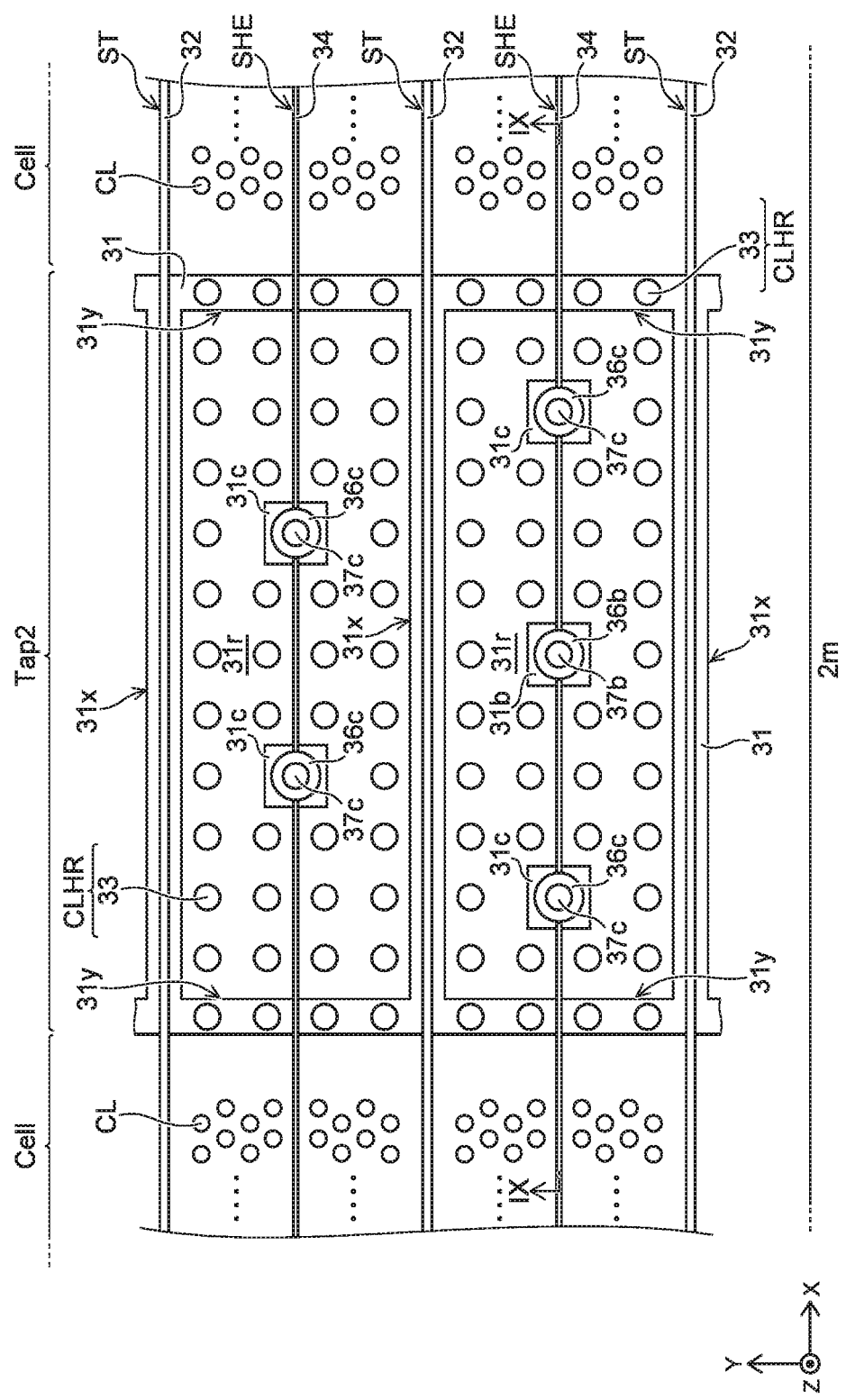
FIG. 4 is a schematic plan view illustrating a periphery of another tap region.

FIG. 2A and FIG. 2B are schematic cross-sectional views illustrating memory cells having a three-dimensional structure. FIG. 3 is a schematic plan view illustrating the periphery of a tap region Tap1 of the semiconductor device 100 according to the first embodiment. FIG. 4 is a schematic plan view illustrating the periphery of another tap region Tap2 of the semiconductor device 100 according to the first embodiment. FIG. 5A is a schematic cross-sectional view along line VA-VA of FIG. 3. FIG. 5B is a schematic cross-sectional view along line VB-VB of FIG. 3.

As shown in FIG. 1A to FIG. 5B, the semiconductor device 100 according to the first embodiment is nonvolatile memory including memory cells having a three-dimensional structure.

The semiconductor device includes a base body portion 1, the stacked body 2, a first pedestal portion 31 (FIG. 3, FIG. 4, and FIG. 5B), a plate portion 32 (FIG. 3 to FIG. 5B), first columnar portions CL (FIG. 3 to FIG. 5A), and second columnar portions CLHR (FIG. 3, FIG. 4, and FIG. 5B).

The base body portion 1 includes a substrate 10, a first insulating film 11, a first conductive film 12, a first doped semiconductor film 13, and a first semiconductor portion 14. The first insulating film 11 is provided on the substrate 10. The first conductive film 12 is provided on the first insulating film 11. The first doped semiconductor film 13 is provided on the first conductive film 12. For example, the first semiconductor portion 14 overlaps the first doped semiconductor film 13 and positioned on the first doped semiconductor film 13.

The substrate 10 is a semiconductor substrate, e.g., a silicon substrate. The conductivity type of the silicon is, for example, a P-type. For example, an element separation region 10i is provided in the surface region of the substrate 10. The element separation region 10i is, for example, an insulating region including silicon oxide and partitions an active area AA in the surface region of the substrate 10. Source and drain regions of a transistor Tr are provided in the active area AA. The transistor Tr is included in the peripheral circuit of the nonvolatile memory. For example, the first insulating film 11 includes silicon oxide and insulates the transistor Tr. An interconnect 11a is provided inside the first insulating film 11. The interconnect 11a is an interconnect that is electrically connected to the transistor Tr. The first conductive film 12 includes a conductive metal, e.g., tungsten.

Figure 6A:
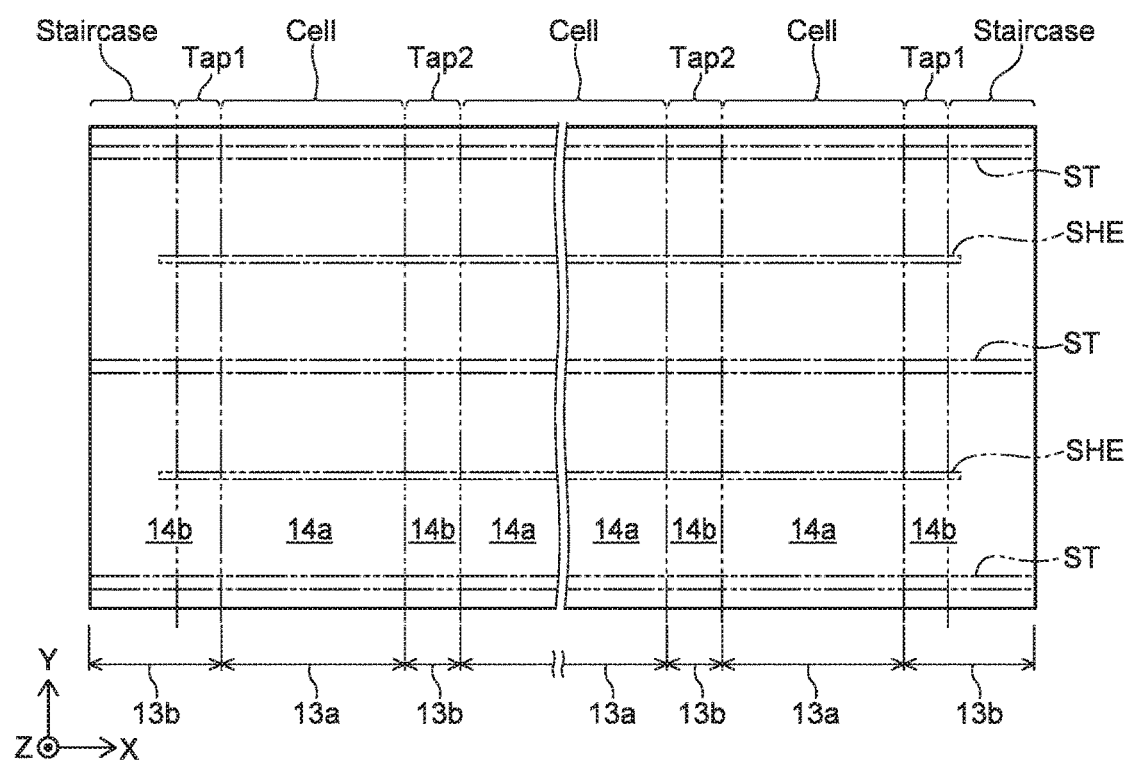
FIG. 6A is a schematic plan view illustrating a first doped semiconductor film and a first semiconductor portion.

FIG. 6A is a schematic plan view illustrating the first doped semiconductor film 13 and the first semiconductor portion 14. For example, FIG. 6A shows the "overlap" state in the Z-axis direction of the first doped semiconductor film 13 (a first layer) and the first semiconductor portion 14 (a second layer).

As shown in FIG. 6A, the first doped semiconductor film 13 includes a first portion 13a and a second portion 13b made of an identical body with each other. The first portion 13a and the second portion 13b are provided on the first conductive film 12. For example, the first doped semiconductor film 13 is crystallized as one body from the first portion 13a to the second portion 13b and is included in one crystallized semiconductor layer. The first doped semiconductor film 13 that includes the first portion 13a and the second portion 13b includes, for example, an N-type semiconductor. The N-type semiconductor is, for example, N-type silicon. The N-type silicon includes, for example, at least one conductive impurity selected from the group consisting of phosphorus, arsenic, and antimony.

For example, the first portion 13a is positioned in a cell region (Cell). The second portion 13b is positioned in a staircase region (Staircase) and tap regions (Tap1 and Tap2). The staircase region is provided at the peripheral edge of the stacked body 2. For example, the cell region is provided on the inner side of the stacked body 2 interposed between the staircase regions. The tap region (Tap1) is provided between the cell region and the staircase region. The tap region (Tap2) is provided between the cell regions. The cell region is a region where the memory cells are provided. The staircase region is a region where electrical interconnects that are electrically connected to the conductive layers provided inside the stacked body 2 are provided. The tap region is, for example, a region where electrical interconnects that are electrically connected to the transistor Tr, the electrical interconnect 11a, etc., provided below the stacked body 2 are provided through the stacked body 2.

The first semiconductor portion 14 includes a first region 14a and a second region 14b. For example, the second region 14b is a body different from the first region 14a. The first region 14a of the first semiconductor portion 14 includes an N-type semiconductor. The second region 14b of the first semiconductor portion 14 includes an undoped semiconductor or an N-type semiconductor. The N-type semiconductor is, for example, N-type silicon. The N-type silicon includes, for example, at least one conductive impurity selected from the group consisting of phosphorus, arsenic, and antimony. The undoped semiconductor is, for example, silicon.

The first region 14a overlaps the first portion 13a in the cell region. For example, the first region 14a is provided directly on the first portion 13a. The second region 14b overlaps the second portion 13b in the staircase region and the tap regions. For example, the second region 14b is provided on the second portion 13b with a first intermediate film 15a interposed (FIG. 5B). The first intermediate film 15a includes, for example, silicon oxide. For example, the first region 14a is crystallized. The second region 14b may or may not be crystallized.

The first embodiment is an example that further includes a second doped semiconductor film 16 (FIG. 5A and FIG. 5B). The second doped semiconductor film 16 includes an N-type semiconductor. The N-type semiconductor is, for example, N-type silicon. The N-type silicon includes, for example, at least one conductive impurity selected from the group consisting of phosphorus, arsenic, and antimony.

For example, the second doped semiconductor film 16 overlaps the first semiconductor portion 14. For example, the second doped semiconductor film 16 that overlaps the first region 14a is provided directly on the first region 14a. For example, the second doped semiconductor film 16 that overlaps the second region 14b is provided on the second region 14b with a second intermediate film 15b interposed. The second intermediate film 15b includes, for example, silicon oxide. The second doped semiconductor film 16 may not be provided.

Other than silicon oxide ($SiO_2$), for example, the first and second intermediate films 15a and 15b may further include silicon nitride (SiN), silicon oxynitride (SiON), etc. Only one of the first or second intermediate film 15a or 15b may be provided. Neither of the first or second intermediate film 15a or 15b may be provided.

The stacked body 2 is provided above the base body portion 1. In the embodiment, the stacked body 2 is provided on the second doped semiconductor film 16. The stacked body 2 includes multiple conductive layers 21 and multiple insulating layers 22 stacked alternately along the Z-axis direction. For example, an insulating film 2g is provided between the stacked body 2 and the base body portion 1. The conductive layers 21 include, for example, tungsten. The insulating film 2g and the insulating layers 22 include, for example, silicon oxide ($SiO_2$). The insulating layers 22 insulate the conductive layers 21 from each other. The number of stacks of the conductive layers 21 and the number of stacks of the insulating layers 22 are arbitrary.

The conductive layers 21 include at least one source-side select gate SGS, multiple word lines WL, and at least one drain-side select gate SGD. The source-side select gate SGS is a gate electrode of a source-side select transistor STS. The word lines WL are gate electrodes of memory cells MC. The drain-side select gate SGD is a gate electrode of a drain-side select transistor STD. The source-side select gate SGS is provided in the lower region of the stacked body 2. The drain-side select gate SGD is provided in the upper region of the stacked body 2. The lower region refers to the region of the stacked body 2 on the side proximal to the base body portion 1; and the upper region refers to the region of the stacked body 2 on the side distal to the base body portion 1. The word lines WL are provided between the source-side select gate SGS and the drain-side select gate SGD.

Among the multiple insulating layers 22, the thickness in the Z-axis direction of the insulating layer 22 insulating the source-side select gate SGS and the word line WL may be set to be thicker than, for example, the thickness in the Z-axis direction of the insulating layer 22 insulating the word line WL and the word line WL. The insulating layer 22 may be formed of an air gap.

The semiconductor device 100 includes multiple memory cells MC connected in series between the drain-side select transistor STD and the source-side select transistor STS. The structure in which the drain-side select transistor STD, the memory cells MC, and the drain-side select transistor STD are connected in series is called a "memory string" or a "NAND string." For example, the memory string is connected to a bit line BL via a contact Cb. The bit line BL is provided above the stacked body 2 and extends in the Y-axis direction. On the other hand, as shown in FIG. 5A, the first portion 13a of the first doped semiconductor film 13, the first conductive film 12 under the first portion 13a, the first region 14a of the first semiconductor portion 14, and the second doped semiconductor film 16 on the first region 14a of the base body portion 1 are electrically connected to a semiconductor body (a semiconductor layer) 210 of the memory string and form the source of the memory string.

Figure 6B:
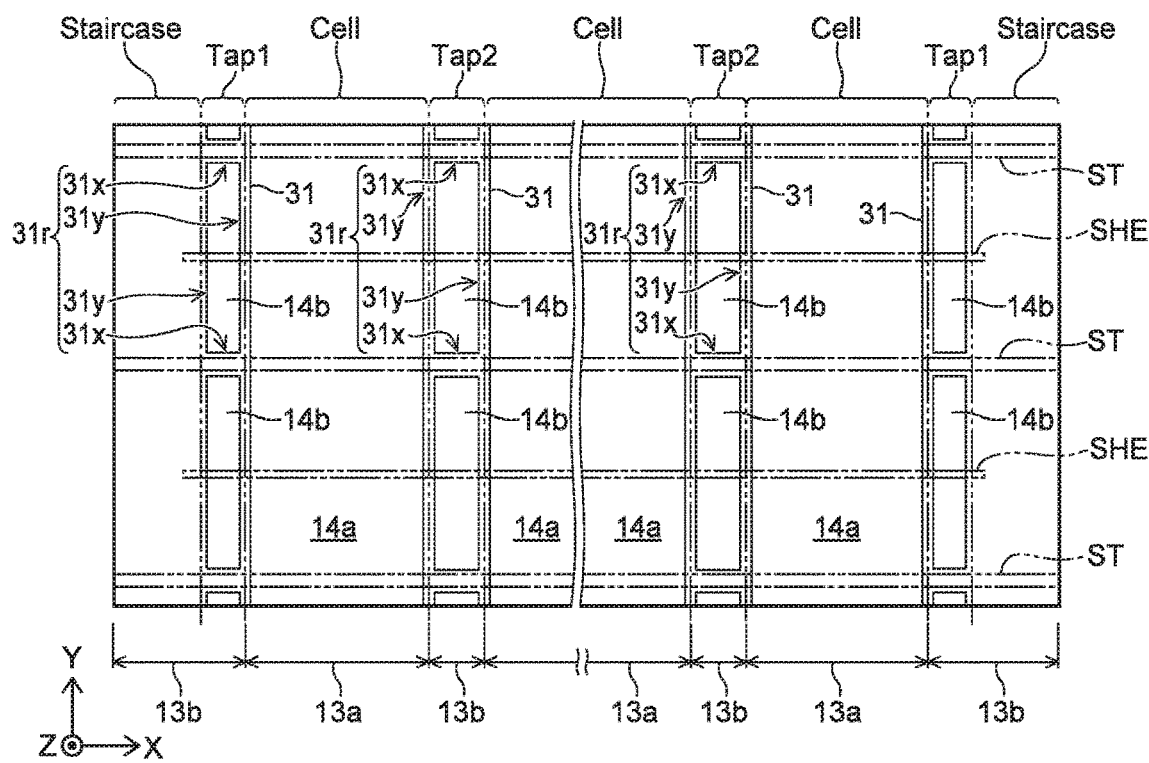
FIG. 6B is a schematic plan view illustrating a first doped semiconductor film, a first semiconductor portion, and a first pedestal portion.

FIG. 6B is a schematic plan view illustrating the first doped semiconductor film 13, the first semiconductor portion 14, and the first pedestal portion 31. For example, FIG. 6B shows the "overlap" state in the Z-axis direction of the first pedestal portion 31 with the first doped semiconductor film 13 and the first semiconductor portion 14.

As shown in FIG. 5B and FIG. 6B, the first pedestal portion 31 is provided at least inside the second region 14b of the first semiconductor portion 14. Although an example is shown in the embodiment in which the first pedestal portion 31 reaches the first conductive film 12 through the first doped semiconductor film 13, it is sufficient for the first pedestal portion 31 to be provided at least inside the second region 14b of the first semiconductor portion 14.

For example, the first pedestal portion 31 is provided to correspond to the location of the base body portion 1 where the staircase region (Staircase) and the tap regions (Tap1 and Tap2) are provided. For example, the first region 14a of the first semiconductor portion 14 is provided in the location of the base body portion 1 where the multiple cell regions (Cell) are provided. In the X-Y plane, the first pedestal portion 31 includes multiple portions 31x extending in the X-axis direction and multiple portions 31y extending in the Y-axis direction. Then, in the X-Y plane, the first pedestal portion 31 is formed to have a ring-like region 31r surrounded with two of the portions 31x and two of the portions 31y. The ring-like region 31r is multiply provided in the first pedestal portion 31. The multiple ring-like regions 31r are arranged in at least one column along the Y-axis direction. The second region 14b exists on the inner side of each of the ring-like regions 31r. The portion 31y contacts the first region 14a and the second region 14b. The portion 31y partitions the first semiconductor portion 14 into the first region 14a and the second region 14b. The first pedestal portion 31 includes an insulator. The insulator is, for example, silicon oxide ($SiO_2$).

The stacked body 2 includes, for example, a staircase portion 2s that includes the staircase region (Staircase) provided at each of the two ends in the X-axis direction of the stacked body 2, and a memory cell array 2m that includes the tap regions (Tap1 and Tap2) and the cell region (Cell) and is interposed between the staircase portions 2s (FIG. 1B). Multiple deep slits ST and multiple shallow slits SHE are provided in the stacked body 2. The deep slits ST each are provided from one staircase portion 2s of the stacked body 2 through the memory cell array 2m to the other staircase portion 2s. The shallow slits SHE each are provided in the memory cell array 2m.

The deep slits ST each extend along the X-axis direction and are provided inside the stacked body 2 along the Z-axis direction from the upper end of the stacked body 2 to the lower end of the stacked body 2. The plate portion 32 is provided in the interior of each of the slits ST. The plate portions 32 each extend in the X-axis direction and contact the first pedestal portion 31 and the first region 14a of the first semiconductor portion 14. For example, the plate portions 32 respectively contact the portions 31x of the first pedestal portion 31. The plate portion 32 includes at least a first insulator. An example of the first insulator is, for example, silicon oxide ($SiO_2$). The plate portion 32 may include a conductor electrically insulated from the stacked body 2 by the first insulator. In such a case, the conductor is electrically connected to at least the first region 14a of the first semiconductor portion 14. The portion of the stacked body 2 interposed between the insulators is called a block (BLOCK) and is included in, for example, the minimum unit of the data erase.

The shallow slits SHE each are provided inside the stacked body 2 along the Z-axis direction from the upper end of the stacked body 2 to partway through the stacked body 2 and extend along the X-axis direction. The shallow slit SHE is positioned inside the block. An insulator 34 is provided inside the shallow slit SHE. The insulator 34 pierces the conductive layer 21 forming the drain-side select gate SGD in the upper region of the stacked body 2. The insulator 34 is, for example, silicon oxide. The region that is between the deep slit ST and the shallow slit SHE is called a "finger." The drain-side select gate SGD is subdivided every finger. Therefore, when reading and programming data, one finger inside the block can be set to the selected state by the drain-side select gate SGD.

Each of the multiple first columnar portions CL is provided inside a memory hole MH provided inside the stacked body 2. The memory hole MH pierces the stacked body 2 along the Z-axis direction from the upper end of the stacked body 2 and is provided to the first region 14a of the first semiconductor portion 14. In the embodiment, the memory hole MH pierces the stacked body 2, the second doped semiconductor film 16, and the first region 14a and reaches the first portion 13a of the first doped semiconductor film 13. Thereby, the first columnar portion CL is provided from the upper end of the stacked body 2 to at least the first region 14a of the first semiconductor portion 14 and is adjacent to the plate portion 32 in the Y-axis direction with at least the stacked body 2 interposed. In the embodiment, the first columnar portion CL is adjacent to the plate portion 32 in the Y-axis direction with the stacked body 2 and the second doped semiconductor film 16 interposed. The first columnar portions CL each include the semiconductor body 210 that contacts the first region 14a of the first semiconductor portion 14, a memory film 220 that includes a charge trapping portion and is between the semiconductor body 210 and the conductive layers 21, and a core layer 230 (FIG. 5A). One of the multiple first columnar portions CL selected from each finger are connected commonly, via the contacts Cb, to one bit line BL extending in the Y-axis direction (FIG. 2A).

As shown in FIG. 2A and FIG. 2B, the configuration of the memory hole MH in the X-Y plane is a circle or an ellipse. A blocking insulating film 21a that is included in a portion of the memory film 220 may be provided between the conductive layer 21 and the insulating layer 22. The blocking insulating film 21a is, for example, a silicon oxide film or a metal oxide film. One example of the metal oxide is aluminum oxide. Also, a barrier film 21b may be provided between the conductive layer 21 and the insulating layer 22 and between the conductive layer 21 and the memory film 220. For example, in the case where the conductive layer 21 is tungsten, a stacked structure film of titanium nitride and titanium is selected as the barrier film 21b. The blocking insulating film 21a suppresses back-tunneling of charge from the conductive layer 21 toward the memory film 220 side. The barrier film 21b improves the adhesion between the conductive layer 21 and the blocking insulating film 21a.

The configuration of the semiconductor body 210 is, for example, a tubular configuration having a bottom. The semiconductor body 210 includes, for example, silicon. The silicon is, for example, polysilicon made of amorphous silicon that is crystallized. The conductivity type of the silicon is, for example, a P-type. The semiconductor body 210 is used to form each channel of the drain-side select transistor STD, the memory cells MC, and the source-side select transistor STS.

The portion of the memory film 220 other than the blocking insulating film 21a is provided between the semiconductor body 210 and the inner wall of the memory hole MH. The configuration of the memory film 220 is, for example, a tubular configuration. The multiple memory cells MC are stacked in the Z-axis direction and are disposed between the semiconductor body 210 and each conductive layer 21 used to form the word lines WL. The memory film 220 includes a cover insulating film 221, a charge trapping film 222, and a tunneling insulating film 223. The semiconductor body 210, the charge trapping film 222, and the tunneling insulating film 223 each extend along the Z-axis direction.

The cover insulating film 221 is provided between the insulating layer 22 and the charge trapping film 222. The cover insulating film 221 includes, for example, silicon oxide. The cover insulating film 221 provides protection so that the charge trapping film 222 is not etched when replacing sacrificial films (not illustrated) with the conductive layers 21 (a replacement process). The cover insulating film 221 may be removed from between the conductive layer 21 and the memory film 220 in the "replacement process." In such a case, as shown in FIG. 2A and FIG. 2B, for example, the blocking insulating film 21a is provided between the conductive layer 21 and the charge trapping film 222. The cover insulating film 221 may not be provided in the case where the "replacement process" is not utilized to form the conductive layers 21.

The charge trapping film 222 is provided between the blocking insulating film 21a and the tunneling insulating film 223 and between the cover insulating film 221 and the tunneling insulating film 223. For example, the charge trapping film 222 includes silicon nitride and has trap sites that trap charge inside a film. The portion of the charge trapping film 222 interposed between the semiconductor body 210 and the conductive layer 21 used to form the word line WL functions as a charge trapping portion. The threshold voltage of the memory cell MC changes according to the existence or absence of the charge inside the charge trapping portion or the amount of the charge trapped inside the charge trapping portion. Thereby, the memory cell MC stores information.

The tunneling insulating film 223 is provided between the semiconductor body 210 and the charge trapping film 222. The tunneling insulating film 223 includes, for example, silicon oxide, or silicon oxide and silicon nitride. The tunneling insulating film 223 is a potential barrier between the semiconductor body 210 and the charge trapping film 222. Tunneling of electrons or holes occurs in the tunneling insulating film 223 when the electrons are injected from the semiconductor body 210 into the charge trapping portion (a program operation) and when the holes are injected from the semiconductor body 210 into the charge trapping portion (an erase operation).

The core layer 230 fills the semiconductor body 210 having the tubular configuration. The configuration of the core layer 230 is, for example, a columnar configuration. The core layer 230 includes, for example, silicon oxide and is insulative.

Each of the multiple second columnar portions CLHR is provided inside a hole HR provided inside the stacked body 2. The hole HR pierces the stacked body 2 along the Z-axis direction and is provided from the upper end of the stacked body 2 to the second region 14b of the first semiconductor portion 14. In the embodiment, the hole HR pierces the stacked body 2, the second doped semiconductor film 16, the second intermediate film 15b, the second region 14b, and the first intermediate film 15a and reaches the second portion 13b of the first doped semiconductor film 13. Thereby, the second columnar portion CLHR is provided from the upper end of the stacked body 2 to at least the second region 14b of the first semiconductor portion 14, is adjacent to the plate portion 32 in the Y-axis direction with the stacked body 2 interposed, and is adjacent to the first pedestal portion 31 with at least the second region 14b of the first semiconductor portion 14 interposed. In the embodiment, the second columnar portion CLHR is adjacent to the first pedestal portion 31 in the Y-axis direction with the second doped semiconductor film 16, the second intermediate film 15b, the second region 14b, and the first intermediate film 15a interposed. The second columnar portions CLHR each include at least a second insulator 33. The second insulator 33 is, for example, silicon oxide ($SiO_2$). The second columnar portions CLHR each may have the same structure as the columnar portion CL instead of the second insulator 33.

The semiconductor device 100 according to the first embodiment includes the first pedestal portion 31 provided inside at least the second region 14b of the first semiconductor portion 14. The plate portion 32 contacts the first pedestal portion 31 and the first region 14a of the first semiconductor portion 14. The first columnar portions CL contact the first region 14a of the first semiconductor portion 14; and the second columnar portions CLHR contact the second region 14b of the first semiconductor portion 14. Thereby, the collapse of the stacked body 2 in the semiconductor device 100 can be suppressed.

FIG. 7A and FIG. 7B are schematic cross-sectional views illustrating a stage partway through the formation of a semiconductor device 100r according to a reference example. FIG. 7A and FIG. 7B correspond respectively to the cross sections shown in FIG. 5A and FIG. 5B.

Compared to the semiconductor device 100 according to the first embodiment, the semiconductor device 100r according to the reference example shows an example in which there is no first pedestal portion 31. For example, the first region 14a of the first semiconductor portion 14 is formed by replacing an undoped semiconductor film with the first region 14a (the doped semiconductor film). For example, the replacing is performed via the deep slit ST. For example, FIG. 7A and FIG. 7B show a stage when the undoped semiconductor film is removed by etching via the deep slit ST. The second insulator 33 of the second columnar portion CLHR becomes narrow by being exposed to the etchant when etching the undoped semiconductor film. For example, the mechanical strength of the second columnar portion CLHR weakens in the case where the second insulator 33 becomes narrow. For example, the second columnar portion CLHR is used as a pillar supporting the stacked body 2 when the undoped semiconductor film is etched and in the stage when a first space S1 occurs between the first intermediate film 15a and the second intermediate film 15b and between the first doped semiconductor film 13 and the second doped semiconductor film 16 and in the stage when a space occurs between the insulating layers 22. Therefore, there is a possibility that the stacked body 2 may collapse in the case where the second insulator 33 becomes narrow. In particular, in the case where the second insulator 33 includes silicon oxide, the second insulator 33 becomes narrow easily in the stage when the first and second intermediate films 15a and 15b and the memory film 220 are etched continuing from the etching of the undoped semiconductor film.

FIG. 8A and FIG. 8B are schematic cross-sectional views illustrating a stage partway through the formation of the semiconductor device 100 according to the first embodiment. FIG. 8A and FIG. 8B correspond respectively to the cross sections shown in FIG. 5A and FIG. 5B.

Compared to the semiconductor device 100r, the semiconductor device 100 includes the first pedestal portion 31. The deep slit ST includes a portion contacting the first pedestal portion 31. The portion where the deep slit ST and the first pedestal portion 31 contact each other suppresses the progress of the etching. Therefore, for example, at least the second region 14b of the first semiconductor portion 14 (the undoped semiconductor film or the N-type semiconductor film) can remain at the periphery of the second columnar portion CLHR. FIG. 8A and FIG. 8B show an example in which the first and second intermediate films 15a and 15b also remain.

In such a semiconductor device 100, the narrowing of the second insulator 33 that is included in the second columnar portion CLHR can be suppressed.

Accordingly, according to the semiconductor device 100, a semiconductor device can be provided in which it is possible to suppress the collapse of the stacked body 2.

For example, the following configurations are further included in the semiconductor device 100 according to the first embodiment.

In the semiconductor device 100, for example, the second columnar portions CLHR are disposed at least on the inner side of the ring-like region 31r in the X-Y cross section. In the X-Y cross section, for example, the first columnar portions CL are disposed on the outer side of the ring-like region 31r (FIG. 3 and FIG. 4). Thereby, the second region 14b can remain at the peripheries of the second columnar portions CLHR; and, for example, it is possible to better suppress the narrowing of the second insulator 33. For example, at the first columnar portions CL, it is possible to provide better contact between the semiconductor body 210 and the first region 14a (FIG. 5A).

In the X-Y cross section, the second columnar portions CLHR may be further disposed in the portion 31y of the first pedestal portion 31 (FIG. 3 and FIG. 4). For example, by further disposing the second columnar portions CLHR in the portion 31y, compared to the case where the second columnar portions CLHR are not disposed in the portion 31y, the number of the second columnar portions CLHR can be increased; and the collapse of the stacked body 2 can be suppressed better.

For example, there are cases where the structure inside the second columnar portion CLHR is set to be a structure similar to the structure inside the first columnar portion CL. In such a case, for example, the hole HR in which the second columnar portion CLHR is formed is formed by the same exposure process as the memory hole MH in which the first columnar portion CL is formed. At this time, the tap region, and in particular, the tap region Tap2 is provided inside the memory cell array 2m; and there is a possibility that the periodicity of the exposure pattern of the first columnar portions CL, e.g., the periodicity along the X-axis direction, may degrade inside the memory cell array 2m due to the tap region Tap2. In the case where the periodicity of the exposure pattern degrades, there is a possibility that the downscaling of the first columnar portions CL undesirably may be impeded.

In such circumstances, the second columnar portions CLHR are disposed in the ring-like region 31r and the portion 31y. Thereby, for example, it is possible to provide the first columnar portions CL and the second columnar portions CLHR inside the memory cell array 2m from the cell region (Cell) to the portion 31y to the ring-like region 31r to the portion 31y to the cell region (Cell) without degrading the periodicity of the exposure pattern.

Thus, by disposing the second columnar portions CLHR in the ring-like region 31r and the portion 31y, for example, an advantage can be obtained in that further suppression of the collapse of the stacked body 2 is promoted. Moreover, in the case where the holes HR and the memory holes MH are formed by the same exposure process, it is possible to obtain an advantage in that further downscaling of the first columnar portions CL is promoted.

In the semiconductor device 100, a width 31wy along the Y-axis direction of the first pedestal portion 31 at the contact portion between the first pedestal portion 31 and the plate portion 32 is wider than a width 32wy along the Y-axis direction of the plate portion 32 (FIG. 5B). Also, for example, the plate portion 32 completely overlaps the first pedestal portion 31 in the Y-axis direction. Thereby, for example, unforeseen etching of the first semiconductor portion 14, the first intermediate film 15a, and the second intermediate film 15b at the peripheries of the second columnar portions CLHR can be suppressed; and it is possible for a non-replaced sacrificial film used as the second region 14b as well as the first intermediate film 15a and the second intermediate film 15b to remain more reliably at the peripheries of the second columnar portions CLHR. Accordingly, the narrowing of the second insulator 33 that is included in the second columnar portions CLHR can be suppressed more reliably.

The plate portion 32 of the semiconductor device 100 includes a flange portion 32f of the plate portion 32 having a wider width in the Y-axis direction inside the first pedestal portion 31 (FIG. 5B). For example, in the case where the first region 14a of the first semiconductor portion 14 (the doped semiconductor film) is formed by replacing the undoped semiconductor film (the second region 14b), the flange portion 32f is a trace from when the first and second intermediate films 15a and 15b were removed by etching via the deep slit ST.

Figure 9:
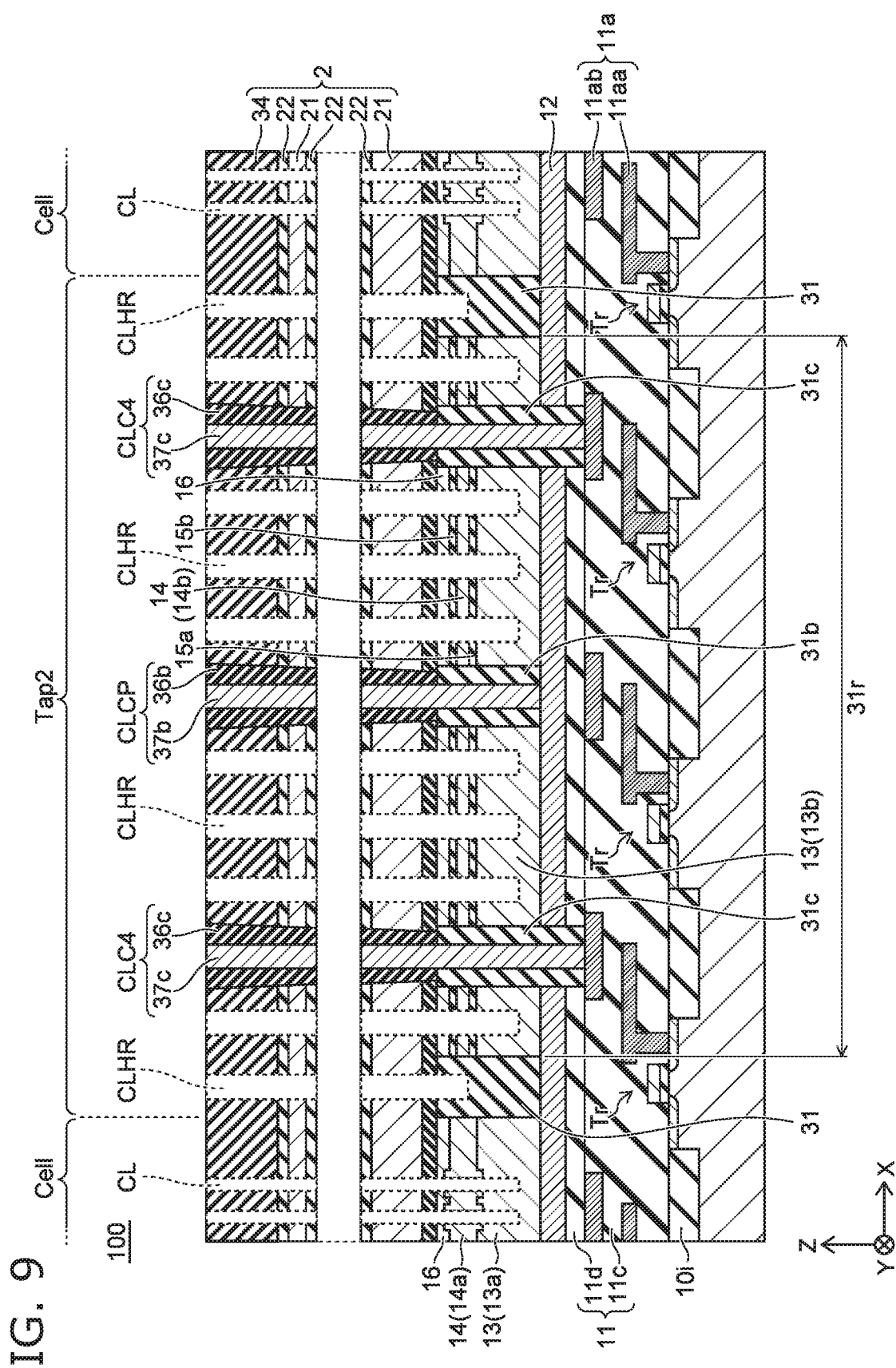
FIG. 9 is a schematic cross-sectional view along line IX-IX of FIG. 4.

FIG. 9 is a schematic cross-sectional view along line IX-IX of FIG. 4.

As shown in FIG. 9, an interconnect 11a that is electrically connected to the transistor Tr is provided inside the first insulating film 11. In FIG. 9, interconnects of multiple layers are shown as the interconnect 11a. The interconnect 11a includes, for example, a lower layer interconnect 11aa and an upper layer interconnect 11ab. The lower layer interconnect 11aa is electrically connected as appropriate to the upper layer interconnect 11ab at a not-illustrated location. The first insulating film 11 includes multiple insulating layers as inter-layer insulating layers insulating the interconnects of the multiple layers. An insulating layer 11c and an insulating layer 11d are illustrated as one example in FIG. 9. For example, the insulating layer 11c insulates between the upper layer interconnect 11ab and the upper layer interconnect 11ab and between the lower layer interconnect 11aa and the upper layer interconnect 11ab. The insulating layer 11d insulates between the upper layer interconnect 11ab and the first conductive film 12.

The semiconductor device 100 includes a second pedestal portion 31b that includes an insulator, and a third pedestal portion 31c that includes an insulator. The second and third pedestal portions 31b and 31c each include, for example, silicon oxide as the insulator.

The second pedestal portion 31b contacts the first conductive film 12 and is provided inside, for example, the second portion 13b of the first doped semiconductor film 13, for example, the second region 14b of the first semiconductor portion 14, the first and second intermediate films 15a and 15b, and the second doped semiconductor film 16. The third pedestal portion 31c contacts the upper layer interconnect 11ab and is further provided inside the first conductive film 12 and the insulating layer 11d of the first insulating film 11.

A third columnar portion CLCP is provided on the second pedestal portion 31b. The third columnar portion CLCP is provided to extend in the Z-axis direction from the upper end of the stacked body 2 to the second pedestal portion 31b. A fourth columnar portion CLC4 is provided on the third pedestal portion 31c. The fourth columnar portion CLC4 is provided to extend in the Z-axis direction from the upper end of the stacked body 2 to the third pedestal portion 31c. For example, the third columnar portion CLCP and the fourth columnar portion CLC4 each are disposed inside the ring-like region 31r.

The third columnar portion CLCP includes an insulator 36b, and a conductor 37b that is electrically insulated by the insulator 36b from the stacked body 2, the first and second doped semiconductor films 13 and 16, etc. For example, the conductor 37b is an electrical interconnect, pierces the second pedestal portion 31b, and is electrically connected to the first conductive film 12. The fourth columnar portion CLC4 includes an insulator 36c, and a conductor 37c that is electrically insulated by the insulator 36c from the stacked body 2, the first and second doped semiconductor films 13 and 16, the first conductive film 12, etc. For example, the conductor 37c also is an electrical interconnect, pierces the third pedestal portion 31c, and is electrically connected to the upper layer interconnect 11ab.

In the tap region (in FIG. 9, the tap region (Tap2)), the first pedestal portion 31 contacts the first conductive film 12 and is provided inside the first doped semiconductor film 13, the first semiconductor portion 14, the first and second intermediate films 15a and 15b, and the second doped semiconductor film 16. For example, the depth along the Z-axis direction of the first pedestal portion 31 is the same as the depth along the Z-axis direction of the second pedestal portion 31b. Two side surfaces of the first pedestal portion 31 respectively contact the first and second portions 13a and 13b of the first doped semiconductor film 13. Further, the two side surfaces of the first pedestal portion 31 respectively contact the first and second regions 14a and 14b of the first semiconductor portion 14. The first pedestal portion 31 includes the same silicon oxide as the second pedestal portion 31b as the insulator.

According to such a first pedestal portion 31, for example, it is possible to form the first pedestal portion 31 simultaneously with the second pedestal portion 31b in the formation process of the second pedestal portion 31b. Therefore, the semiconductor device 100 can be obtained while suppressing an increase of manufacturing processes due to the first pedestal portion 31 being provided.

For example, the first conductive film 12 is provided as "one plate" over the entire memory cell array 2m. Therefore, it is also possible for the first pedestal portion 31 to contact the first conductive film 12 regardless of the pattern of the first pedestal portion 31.

Figure 10:
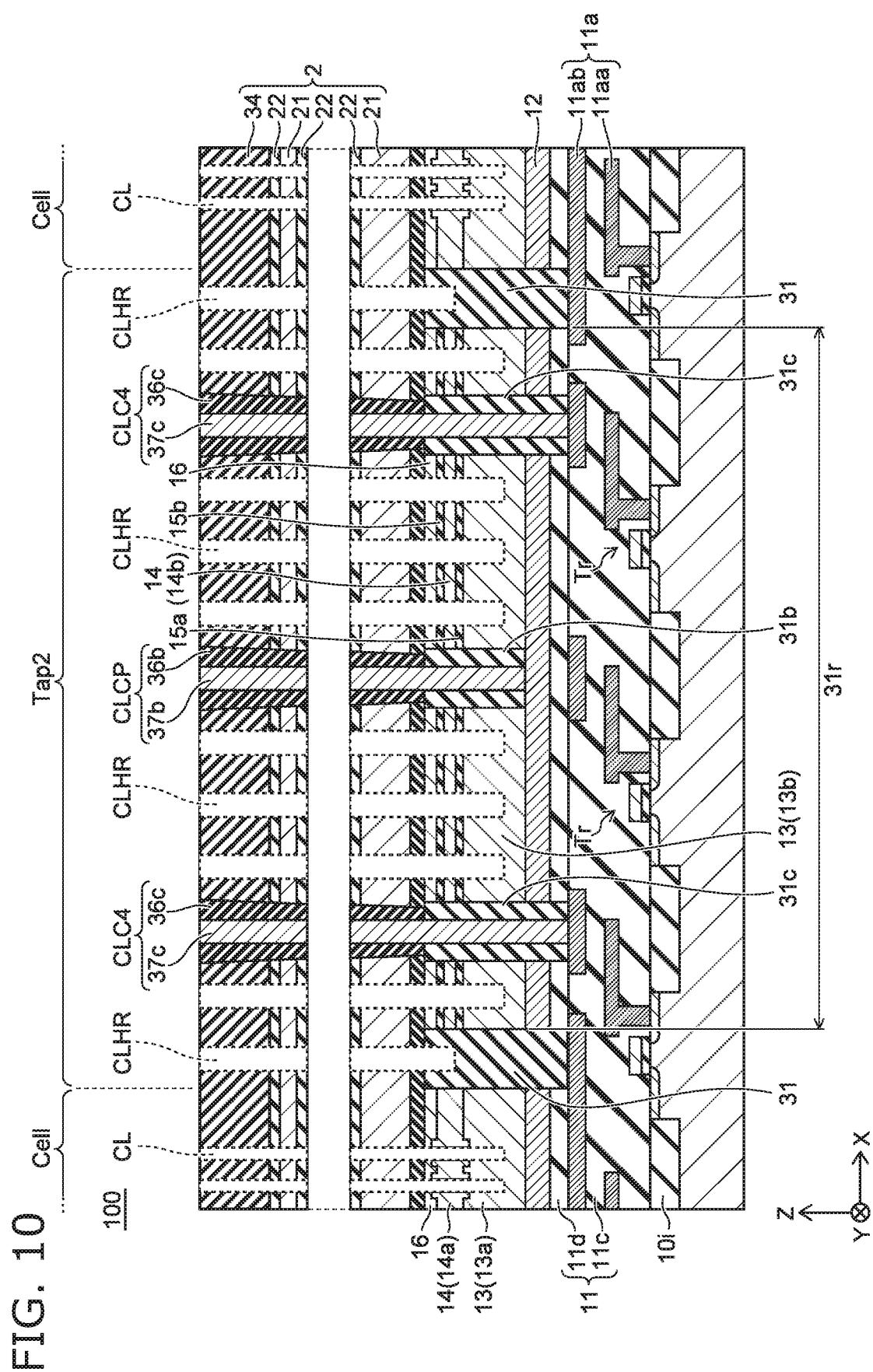
FIG. 10 is another schematic cross-sectional view along line IX-IX of FIG. 4.

FIG. 10 is another schematic cross-sectional view along line IX-IX of FIG. 4.

As shown in FIG. 10, the first pedestal portion 31 may be further provided inside the first conductive film 12 and the insulating layer 11d of the first insulating film 11 and may contact the upper layer interconnect 11ab. In such a case, for example, the depth along the Z-axis direction of the first pedestal portion 31 is the same as the depth along the Z-axis direction of the third pedestal portion 31c. Similarly to the third pedestal portion 31c, the first pedestal portion 31 includes, for example, silicon oxide as an insulator.

According to such a first pedestal portion 31, for example, it is possible to form the first pedestal portion 31 simultaneously with the third pedestal portion 31c. In another example as well, the semiconductor device 100 can be obtained while suppressing an increase of manufacturing processes due to the first pedestal portion 31 being provided.

Manufacturing Method

FIG. 11A to FIG. 16B are schematic cross-sectional views in order of the processes, illustrating a method for manufacturing the semiconductor device according to the first embodiment. FIG. 11A to FIG. 16A are cross-sectional views along line A-A of FIG. 3. FIG. 11B to FIG. 16B are cross-sectional views along line B-B of FIG. 3.

As shown in FIG. 11A and FIG. 11B, the first conductive film 12 is formed on the first insulating film 11. The insulating layer 11c that insulates the lower surface and the side surface of the upper layer interconnect 11ab and the insulating layer 11d that insulates the upper surface of the upper layer interconnect 11ab are shown as the first insulating film 11. The first conductive film 12 is formed on the insulating layer 11d. The insulating layers 11c and 11d each are, for example, silicon oxide. The first conductive film 12 is, for example, tungsten.

Then, the first doped semiconductor film 13 is formed on the first conductive film 12. The first doped semiconductor film 13 includes, for example, N-type silicon. The N-type silicon includes at least one conductive impurity selected from the group consisting of phosphorus, arsenic, and antimony. Then, the first intermediate film 15a is formed on the first doped semiconductor film 13. The first intermediate film 15a includes, for example, a silicon oxide film.

Then, a first sacrificial film 17 is formed on the first intermediate film 15a. The first sacrificial film 17 includes, for example, undoped silicon. For example, it is sufficient for the first sacrificial film 17 to be an etchable film having etching selectivity that is different from that of the first intermediate film 15a. The first sacrificial film 17 is not limited to undoped silicon. The first sacrificial film 17 may include conductive silicon, e.g., conductive silicon (n-type silicon) including at least one conductive impurity selected from the group consisting of phosphorus, arsenic, and antimony. Then, the second intermediate film 15b is formed on the first sacrificial film 17. The second intermediate film 15b includes, for example, a silicon oxide film.

Then, the second doped semiconductor film 16 is formed on the second intermediate film 15b. The second doped semiconductor film 16 includes, for example, N-type silicon. The N-type silicon includes at least one conductive impurity selected from the group consisting of phosphorus, arsenic, and antimony. Then, a stopper film 60 is formed on the second doped semiconductor film 16. The stopper film 60 includes, for example, silicon nitride.

Figure 12A:
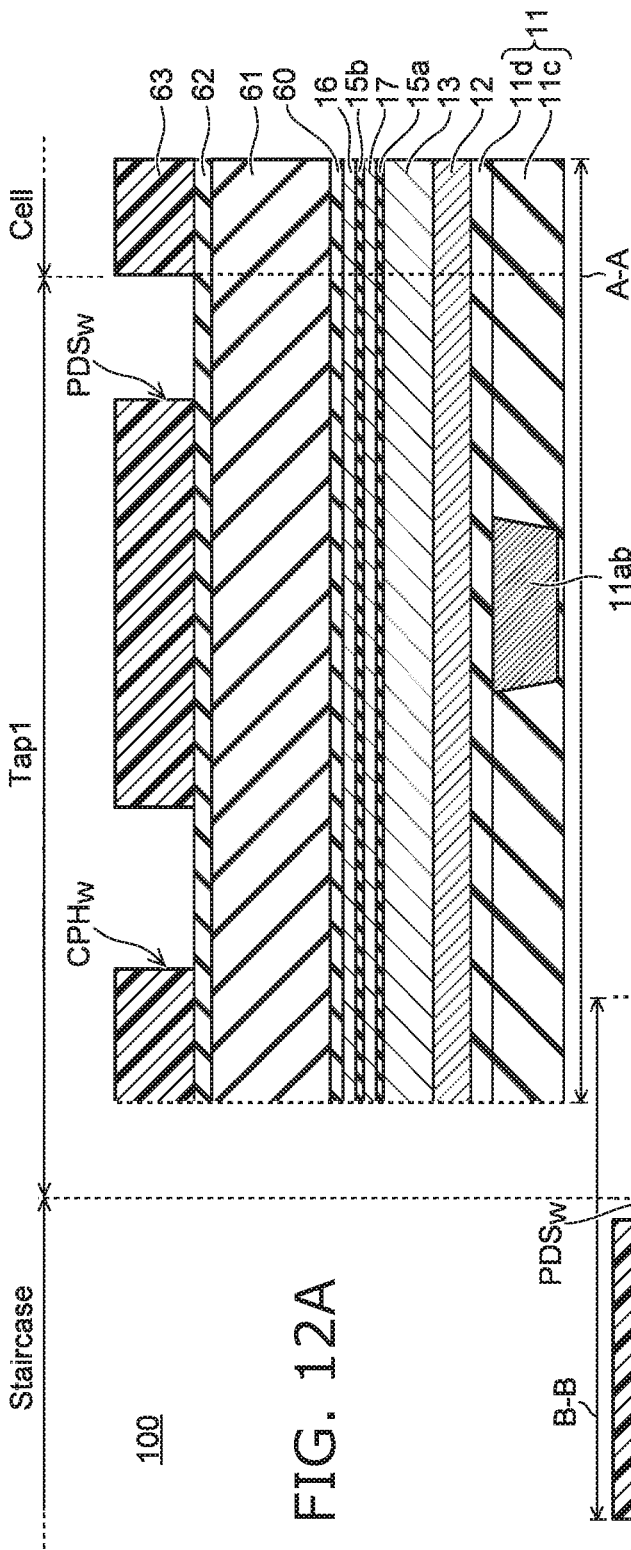
Figure 12B:
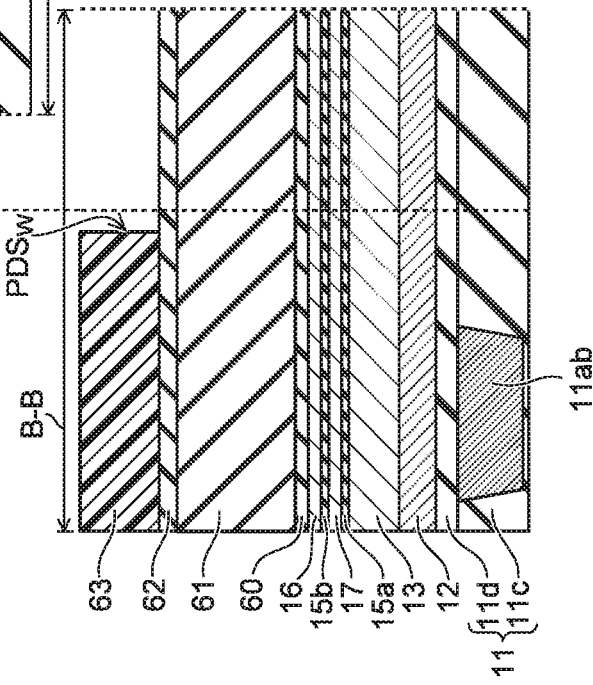

Continuing as shown in FIG. 12A and FIG. 12B, a silicon oxide film 61 is formed on the stopper film 60. Then, an anti-reflection film 62 is formed on the silicon oxide film 61. Then, a photoresist film 63 is formed on the anti-reflection film 62. Then, a window PDSw that corresponds to the first pedestal portion 31 and a window CPHw that corresponds to the second pedestal portion 31b are formed in the photoresist film 63.

Continuing as shown in FIG. 13A and FIG. 13B, the anti-reflection film 62 and the silicon oxide film 61 are etched using the photoresist film 63 as a mask of the etching. Then, the photoresist film 63 is removed by ashing. Then, the stopper film 60, the second doped semiconductor film 16, the second intermediate film 15b, the first sacrificial film 17, the first intermediate film 15a, and the first doped semiconductor film 13 are etched using the silicon oxide film 61 as a mask of the etching. Then, the silicon oxide film 61 is removed. Thereby, a shallow slit PDS that corresponds to the first pedestal portion 31 and a hole CPH that corresponds to the second pedestal portion 31b are formed in the stopper film 60, the second doped semiconductor film 16, the second intermediate film 15b, the first sacrificial film 17, the first intermediate film 15a, and the first doped semiconductor film 13.

Figure 14A:
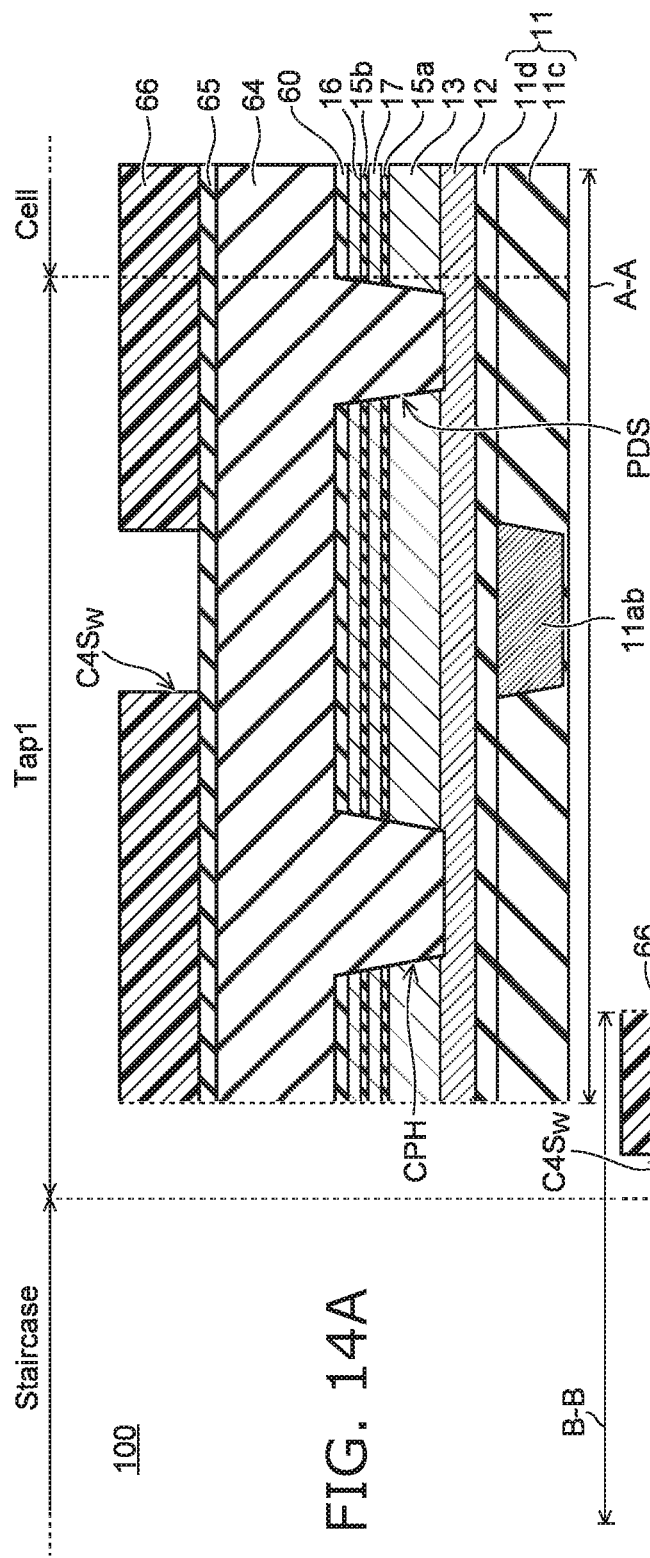
Figure 14B:
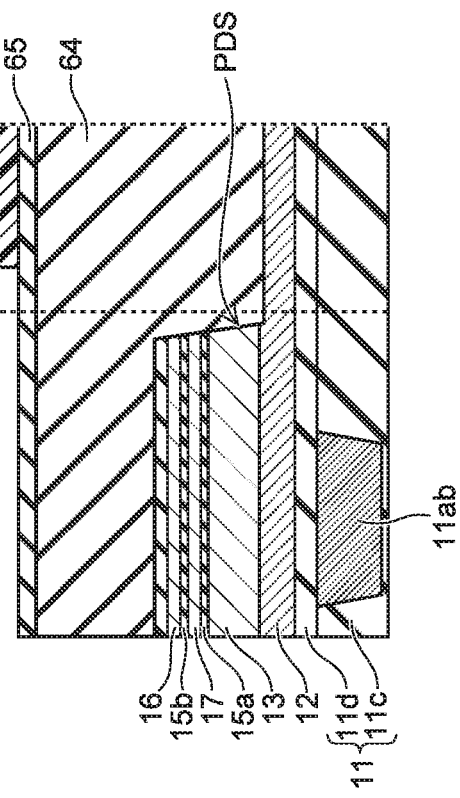

Continuing as shown in FIG. 14A and FIG. 14B, a hard mask 64 is formed on the structure body in which the shallow slit PDS and the hole CPH are formed (FIG. 13A and FIG. 13C). Then, an anti-reflection film 65 is formed on the hard mask 64. Then, a photoresist film 66 is formed on the anti-reflection film 65. Then, a window C4Sw that corresponds to the third pedestal portion 31c is formed in the photoresist film 66. In the manufacturing method example, the window C4Sw is provided to spread also onto the staircase region (Staircase) and overlaps a portion of the shallow slit PDS extending in the X-axis direction at the boundary vicinity between the staircase region (Staircase) and the first tap region (Tap1).

Then, as shown in FIG. 15A and FIG. 15B, the anti-reflection film 65 and the hard mask 64 are etched using the photoresist film 66 as a mask of the etching. Then, the photoresist film 66 is removed by ashing. Then, the stopper film 60, the second doped semiconductor film 16, the second intermediate film 15b, the first sacrificial film 17, the first doped semiconductor film 13, the first conductive film 12, and the insulating layer 11d are etched using the hard mask 64 as a mask of the etching.

Then, the hard mask 64 is removed. Thereby, a hole C4S that corresponds to the third pedestal portion 31c is formed in the stopper film 60, the second doped semiconductor film 16, the second intermediate film 15b, the first sacrificial film 17, the first intermediate film 15a, the first doped semiconductor film 13, the first conductive film 12, and the insulating layer 11d. The hole C4S overlaps a portion of the shallow slit PDS extending in the X-axis direction at the boundary vicinity between the staircase region (Staircase) and the first tap region (Tap1). Then, a silicon oxide film 67 is formed on the structure body in which the shallow slit PDS, the hole CPH, and the hole C4S are formed.

Figures 16A, 16B:
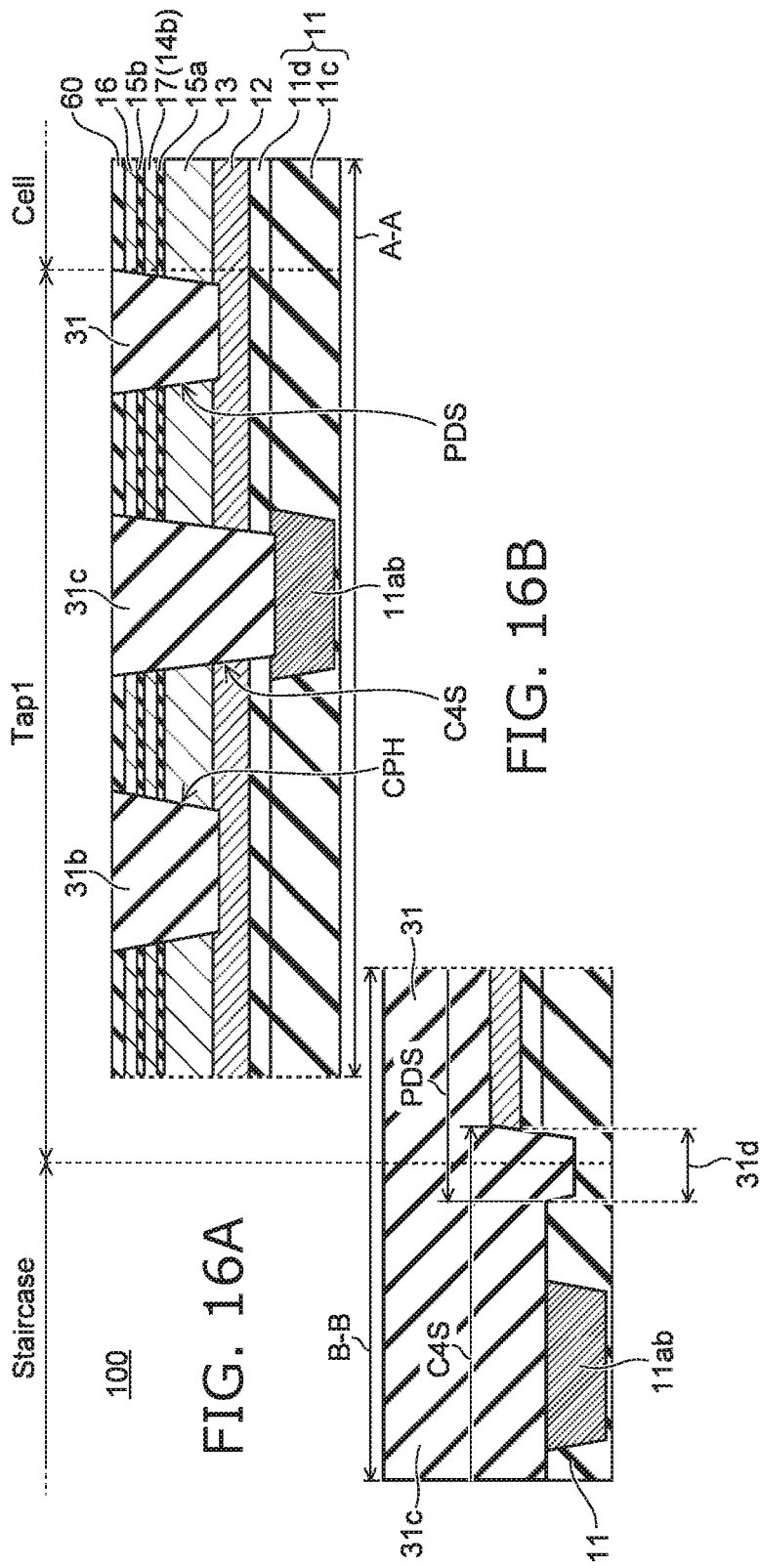

Continuing as shown in FIG. 16A and FIG. 16B, chemical mechanical polishing of the silicon oxide film 67 is performed using the stopper film 60 as a stopper of the chemical mechanical polishing. Thereby, a structure body that includes the first to third pedestal portions 31, 31b, and 31c formed by filling the shallow slit PDS and the holes CPH and C4S with silicon oxide is formed.

Figure 17:
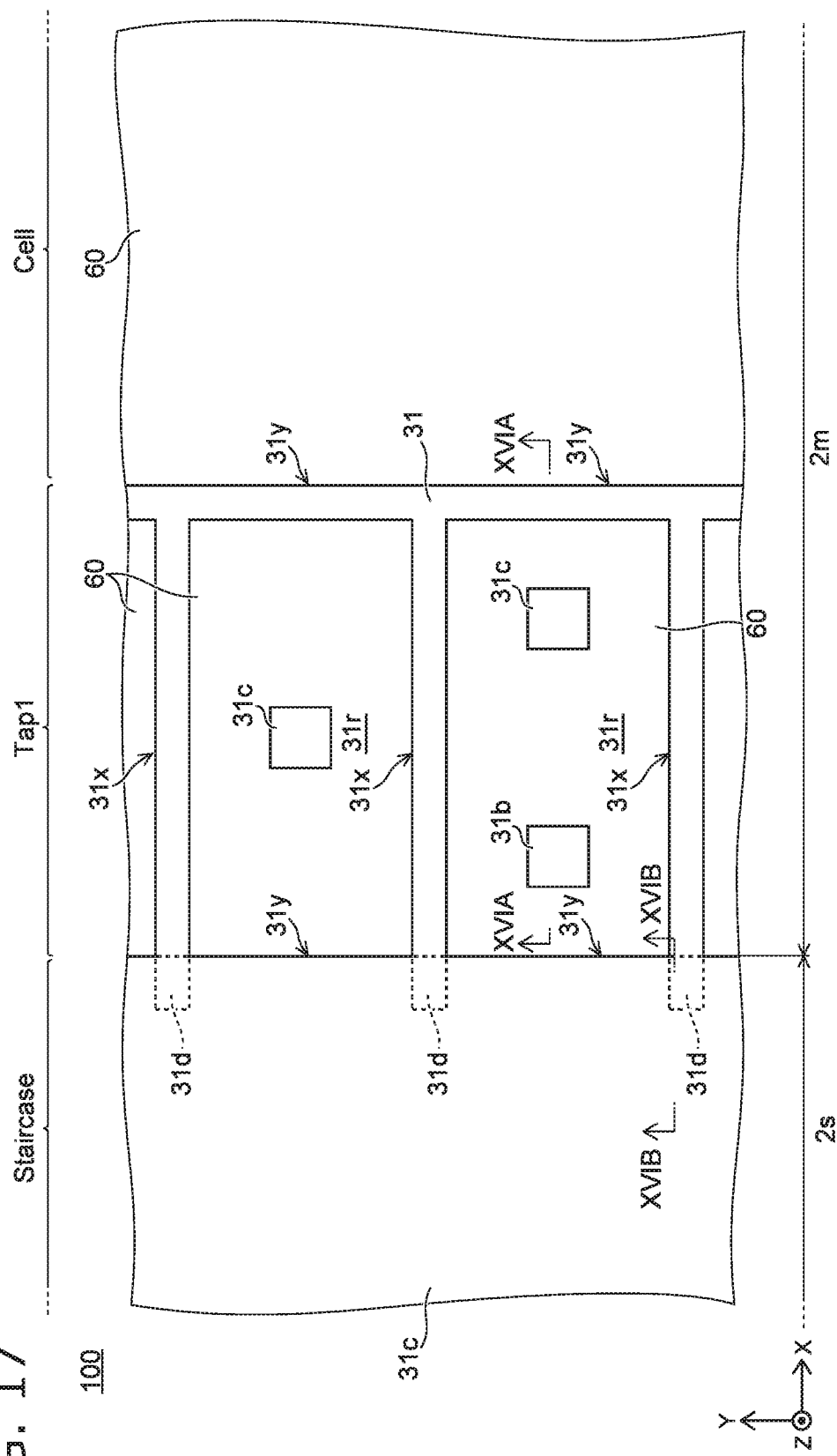
FIG. 17 is a schematic plan view illustrating a plane in a stage shown in FIG. 16A and FIG. 16B.
Figure 18A:
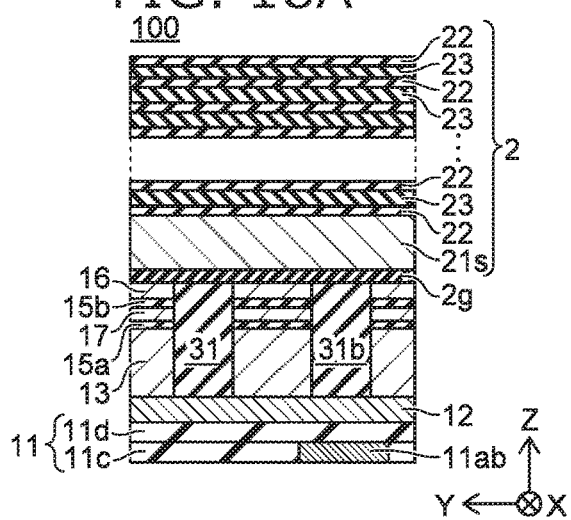
Figure 18C:
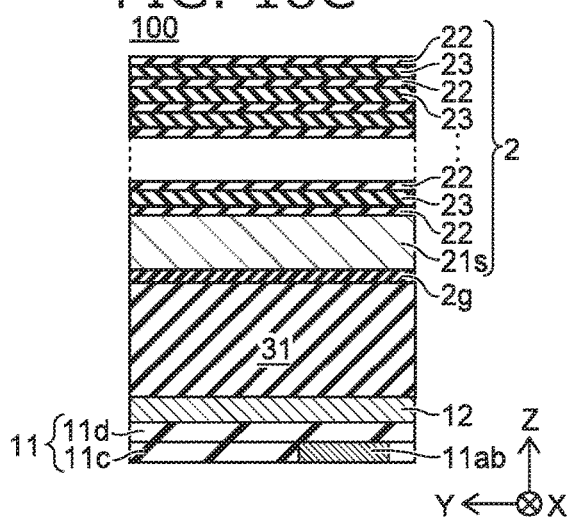
Figure 18B:
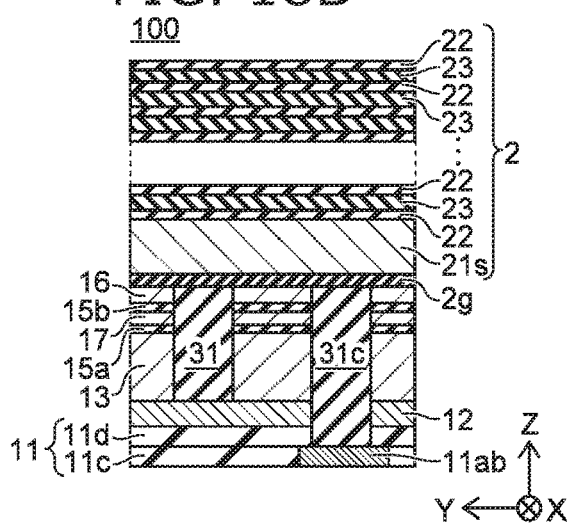
Figure 18D:
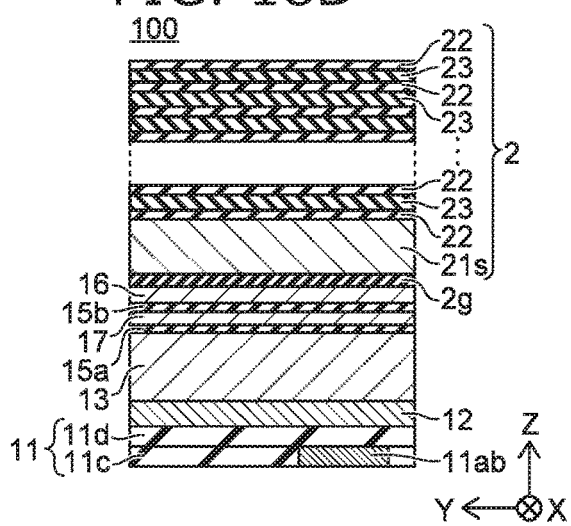
Figure 18E:
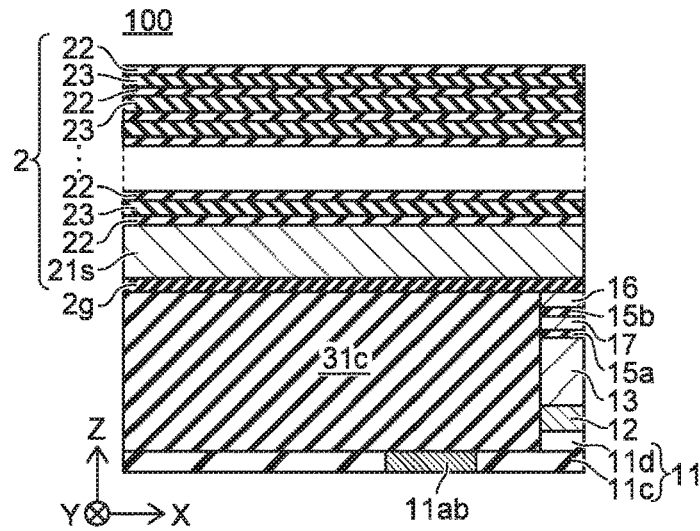
Figure 19A:
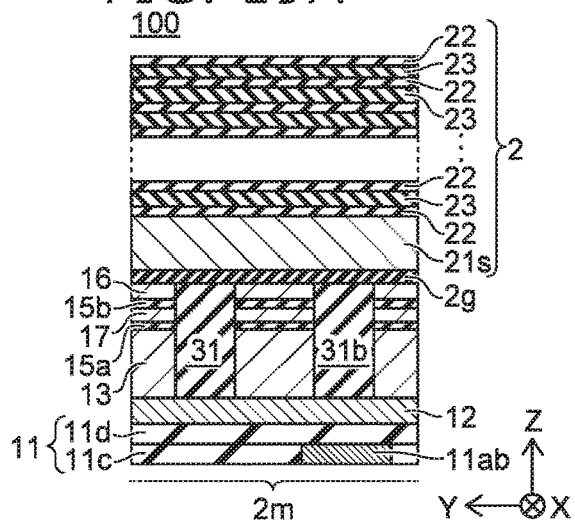
Figure 19C:
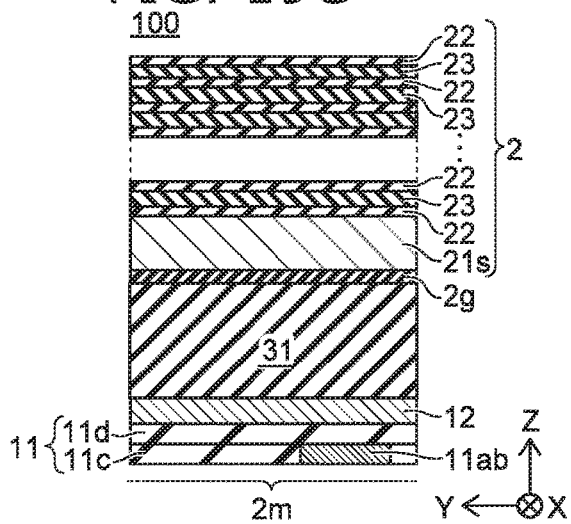
Figure 19B:
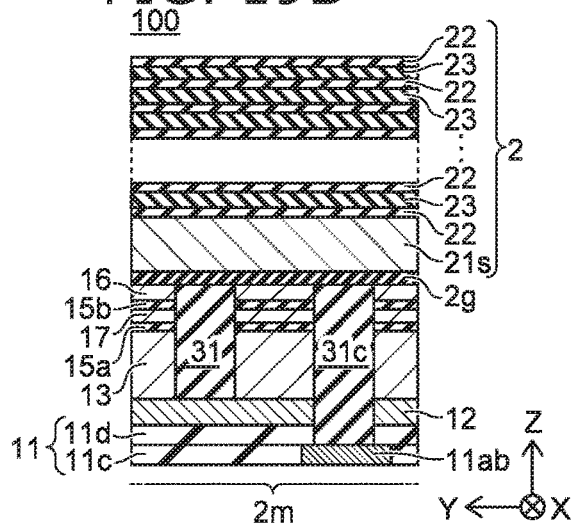
Figure 19D:
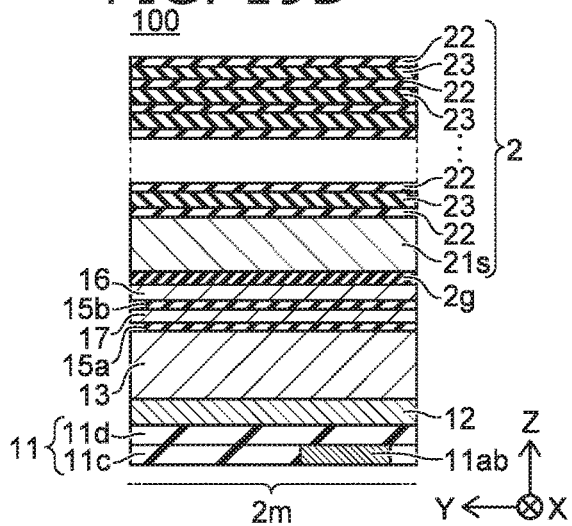
Figure 19E:
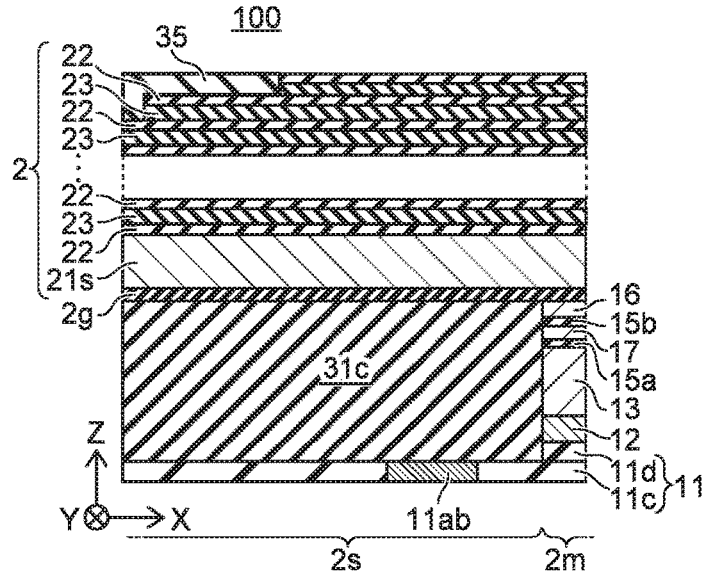
Figure 20A:
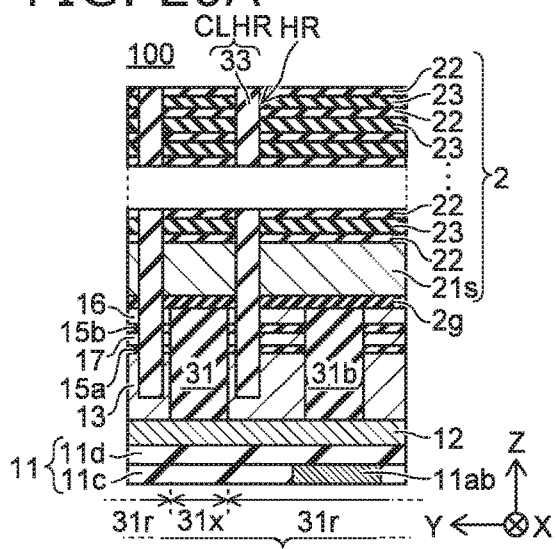
Figure 20C:
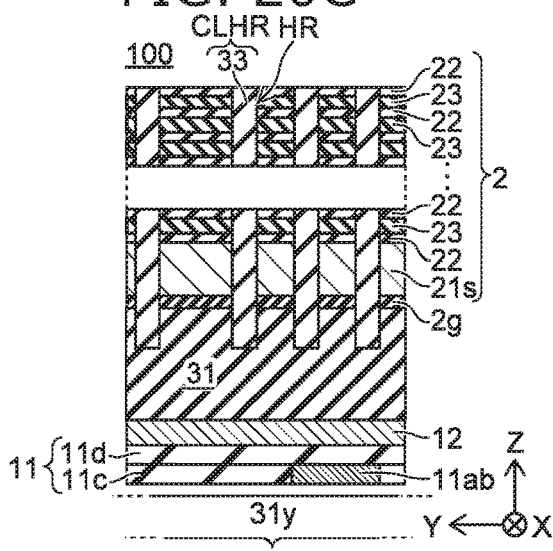
Figure 20B:
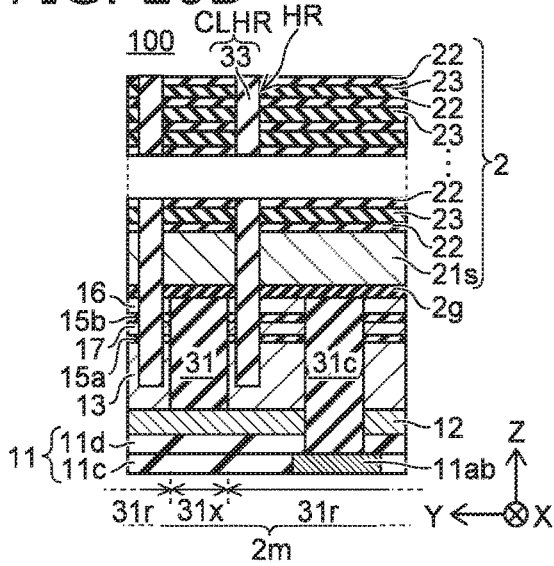
Figure 20D:
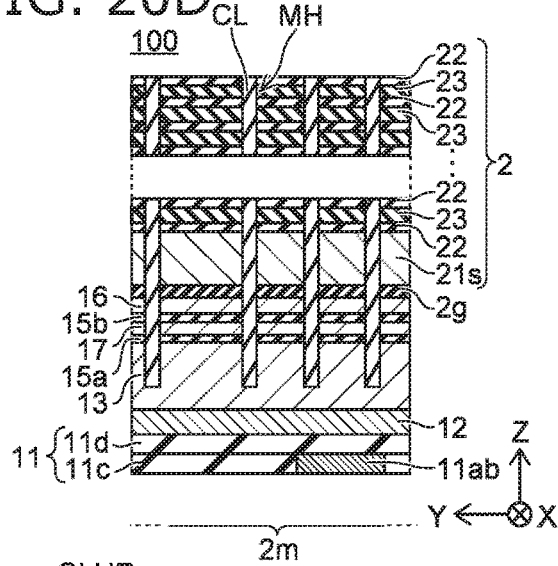
Figure 20E:
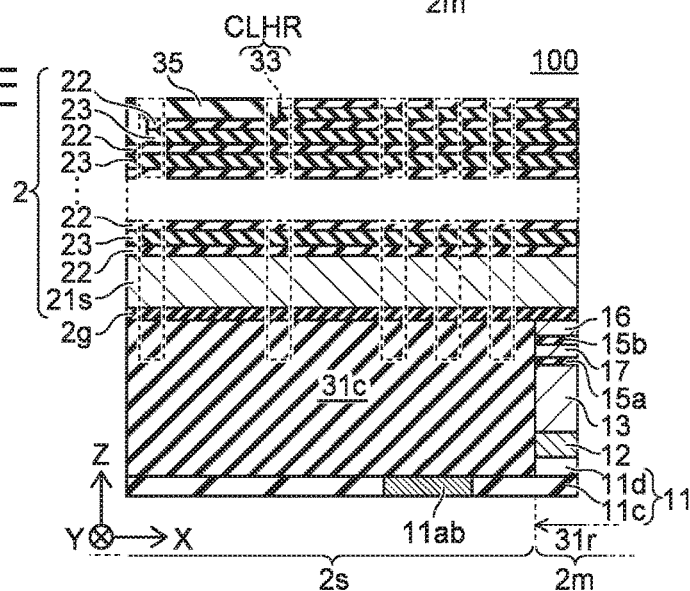
Figure 21A:
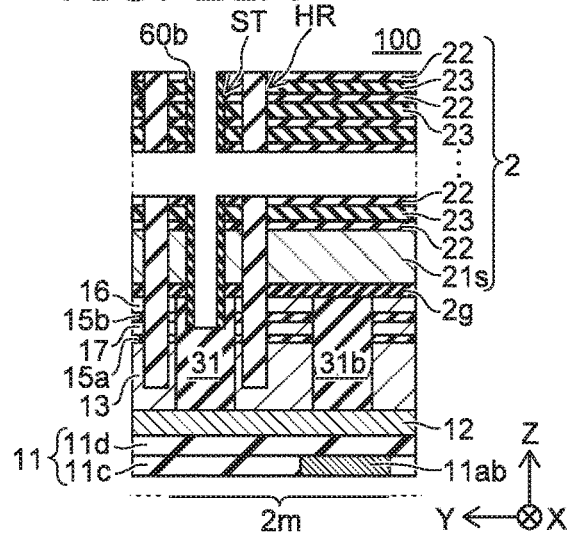
Figure 21C:
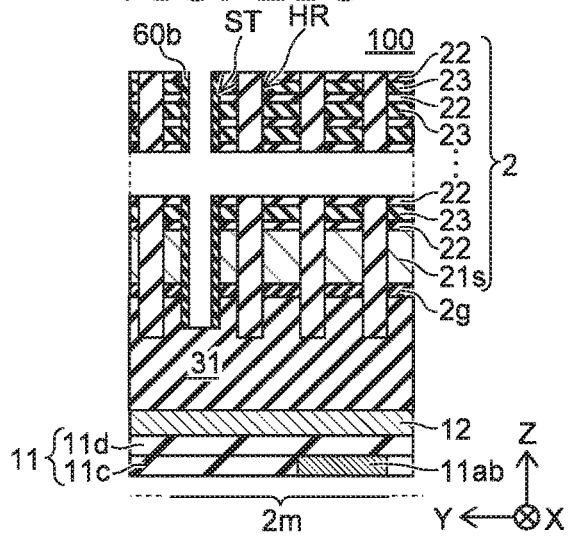
Figure 21B:
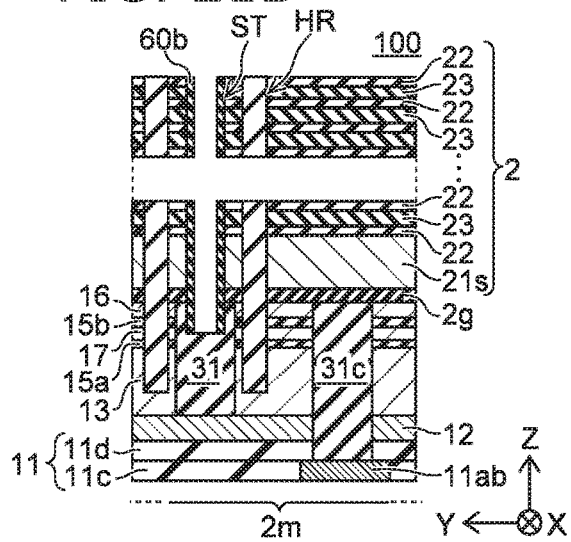
Figure 21D:
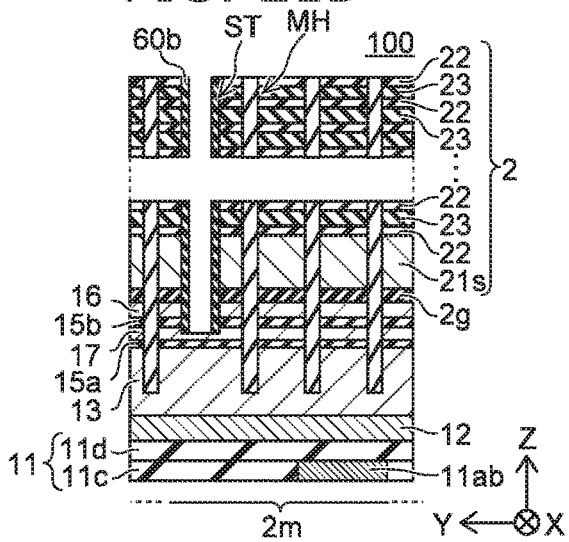
Figure 21E:
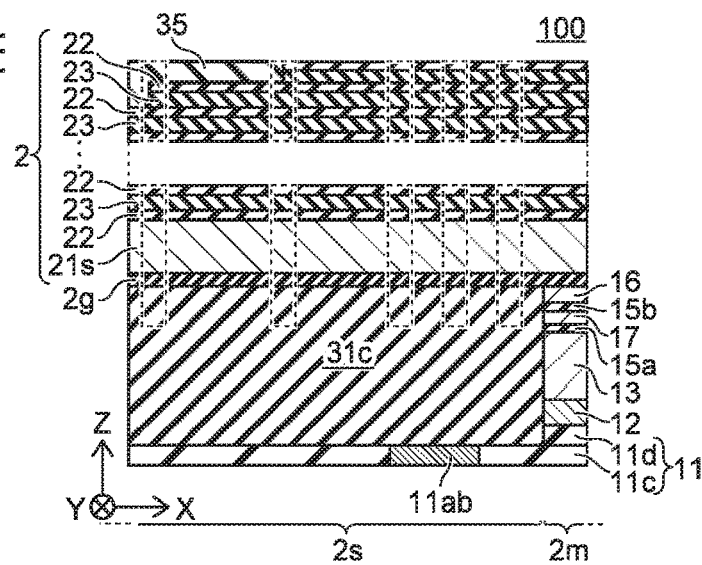
Figure 22A:
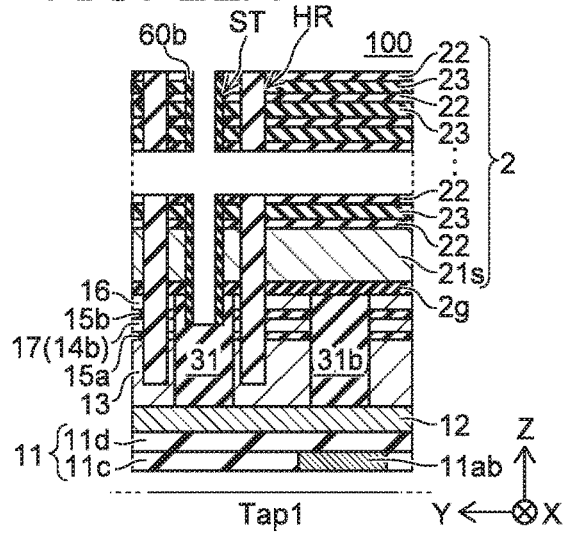
Figure 22C:
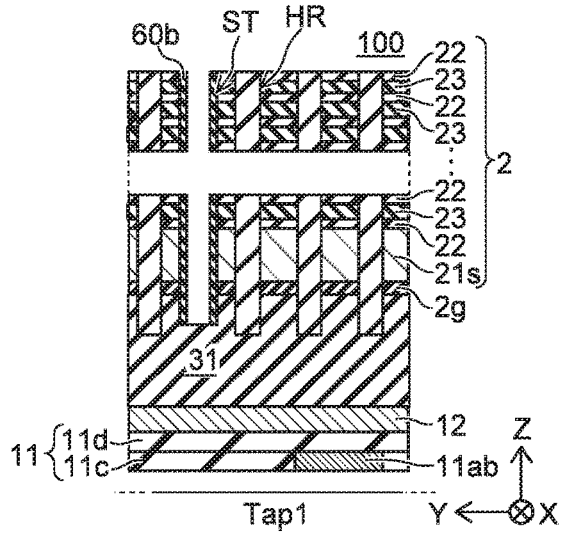
Figure 22B:
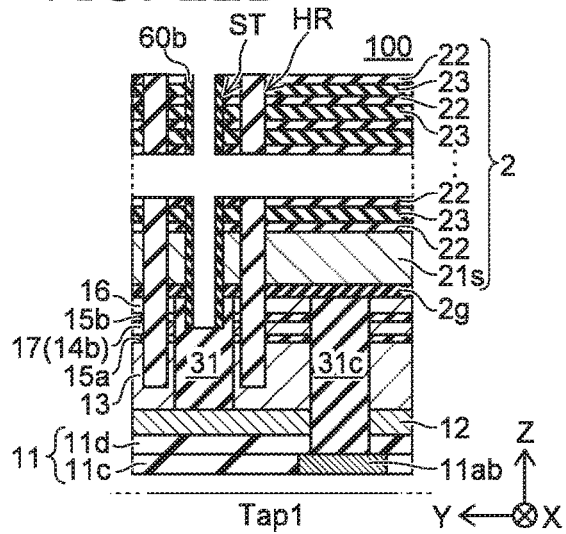
Figure 22D:
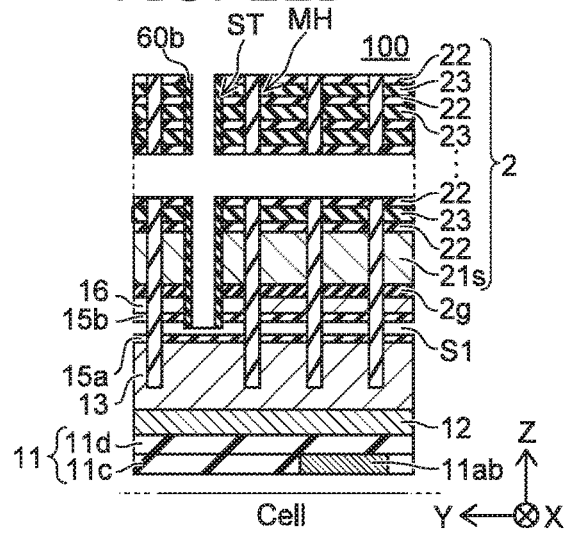
Figure 22E:
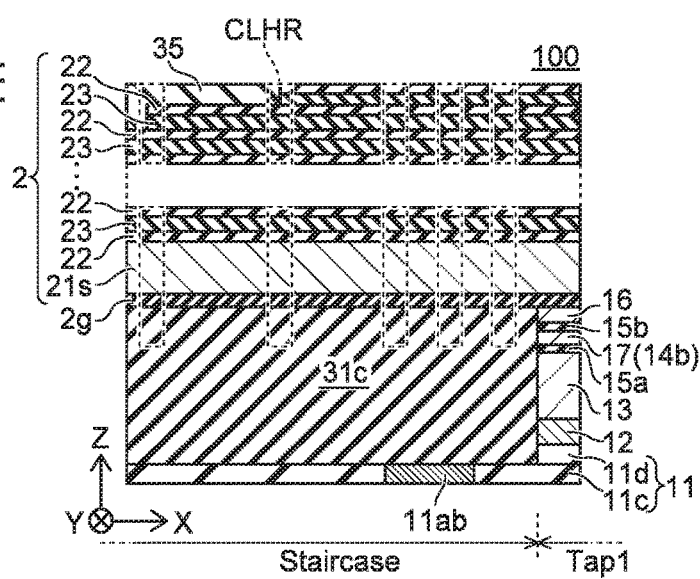
Figure 23A:
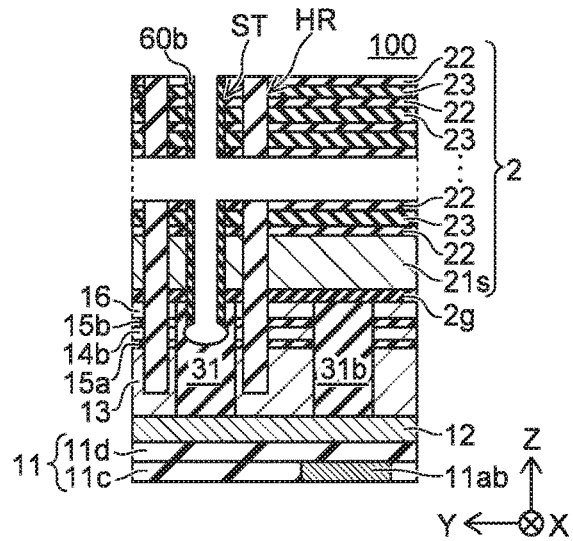
Figure 23C:
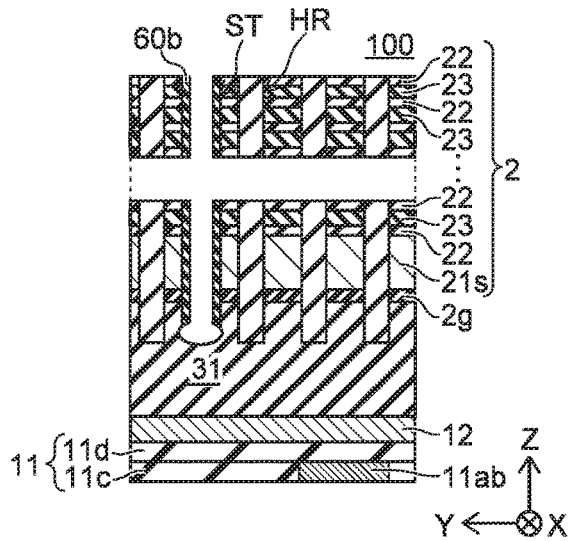
Figure 23B:
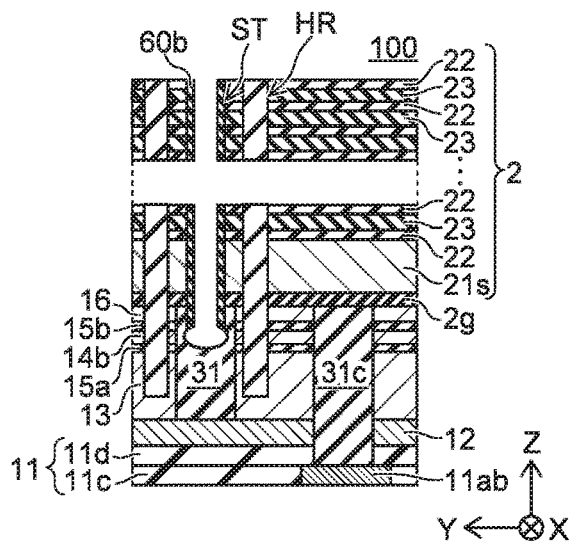
Figure 23D:
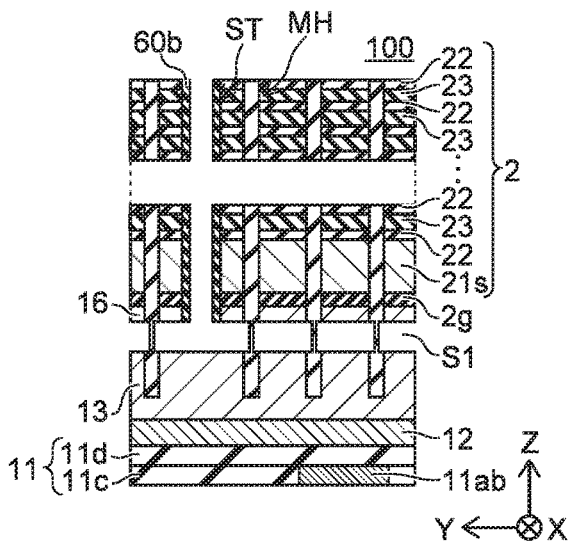
Figure 23E:
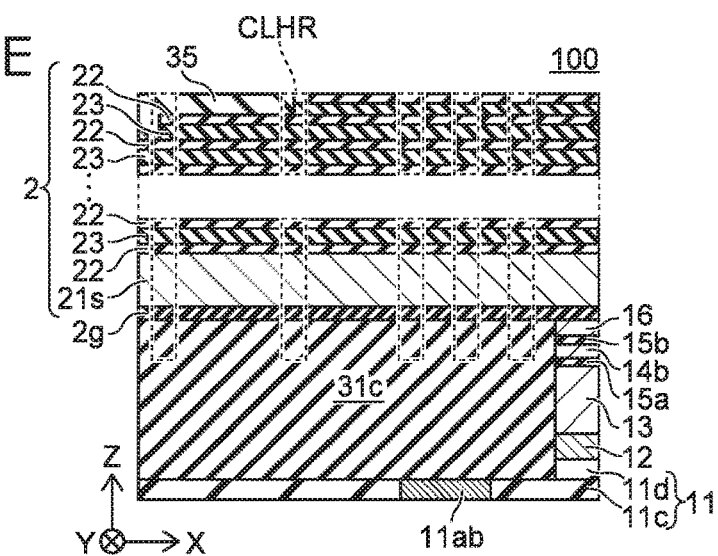
Figure 24A:
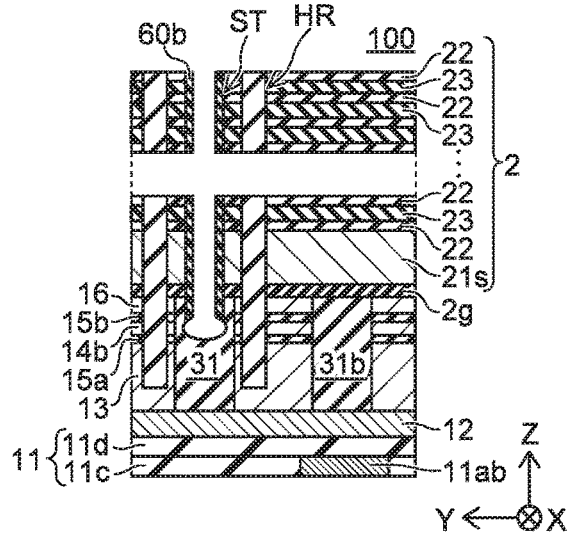
Figure 24C:
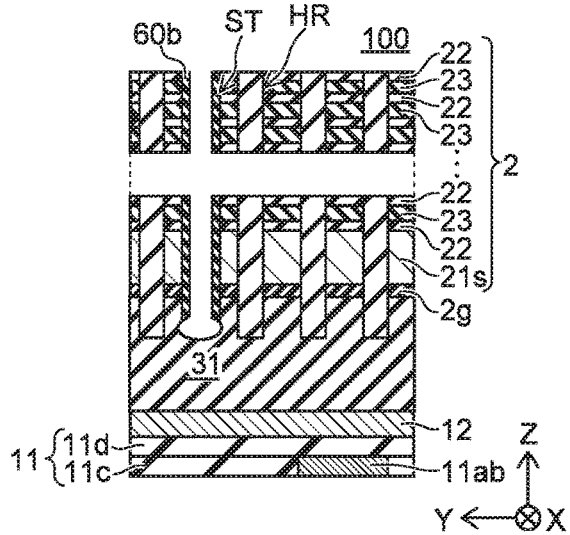
Figure 24B:
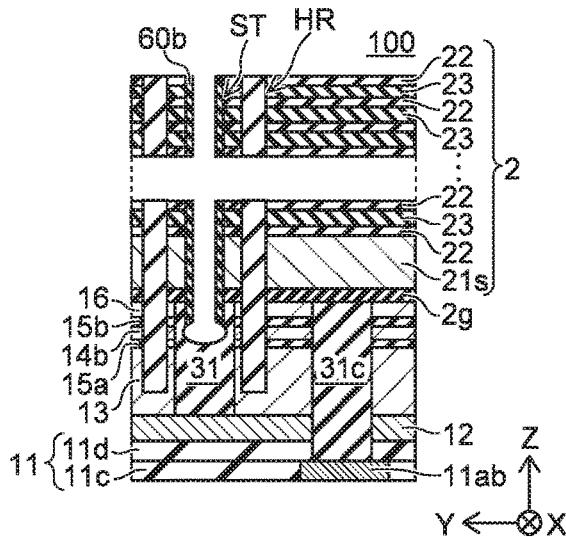
Figure 24D:
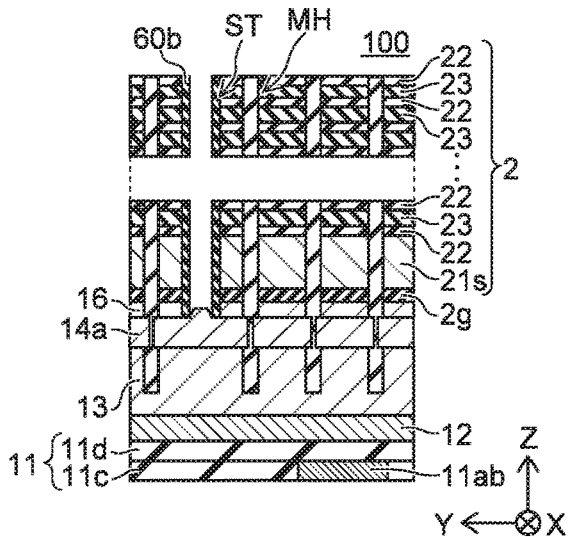
Figure 24E:
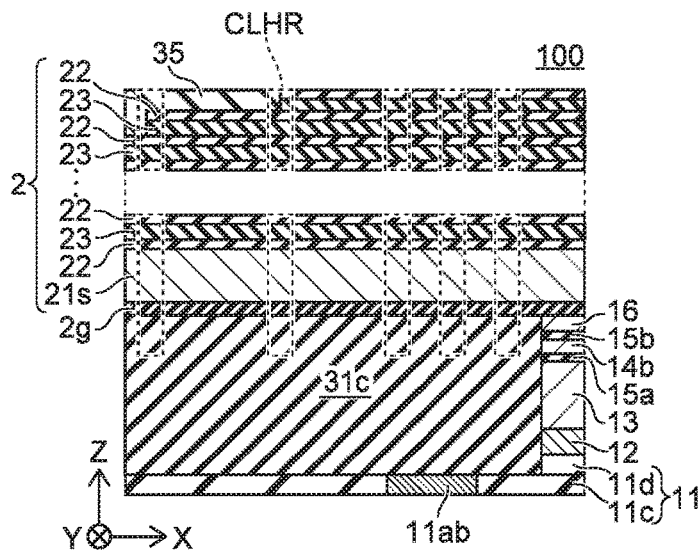
Figure 25A:
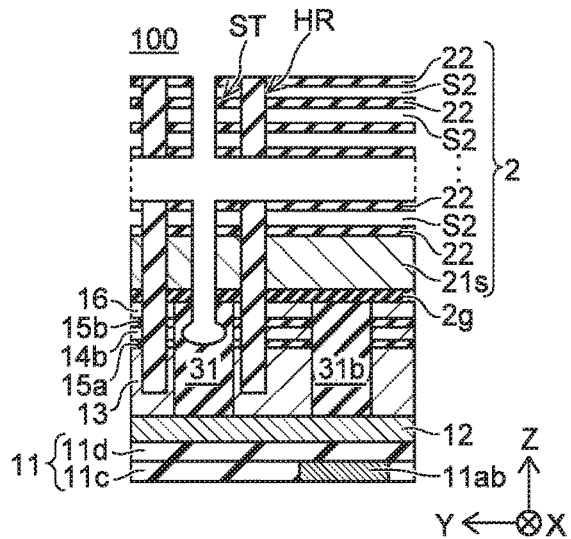
Figure 25C:
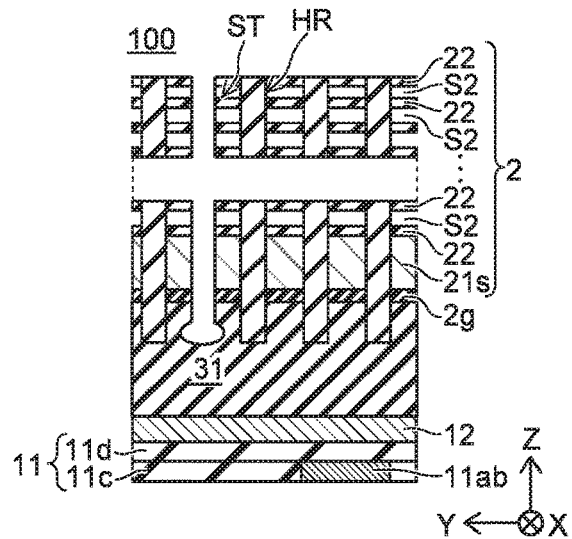
Figure 25B:
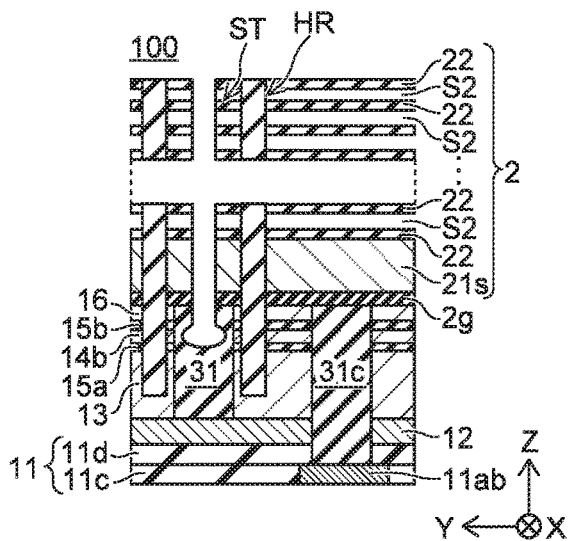
Figure 25D:
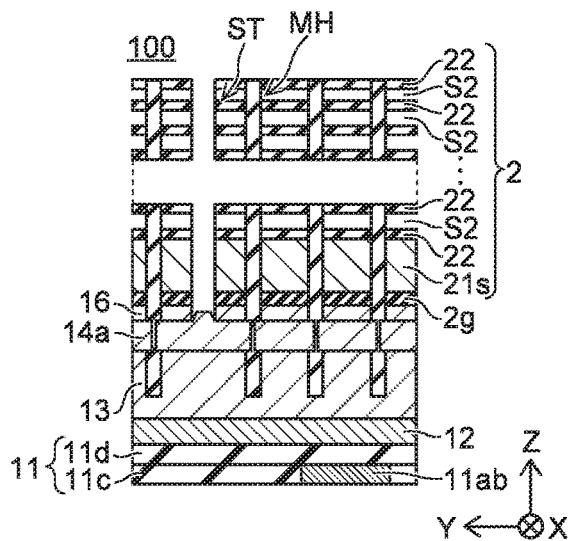
Figure 25E:
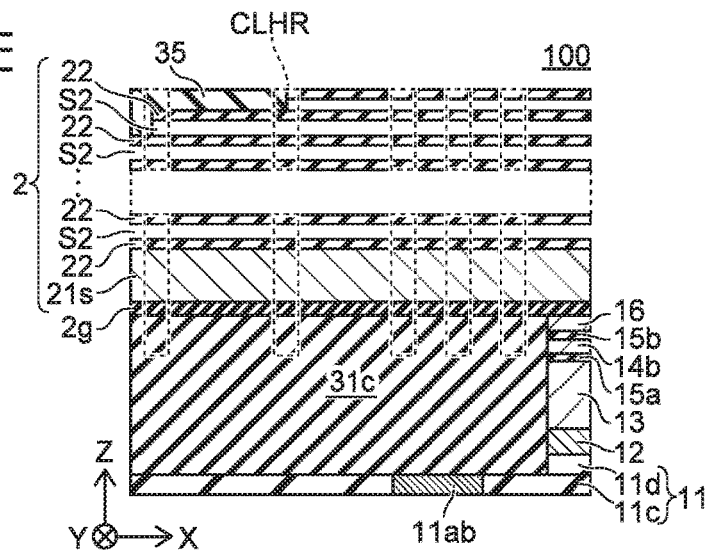
Figure 26A:
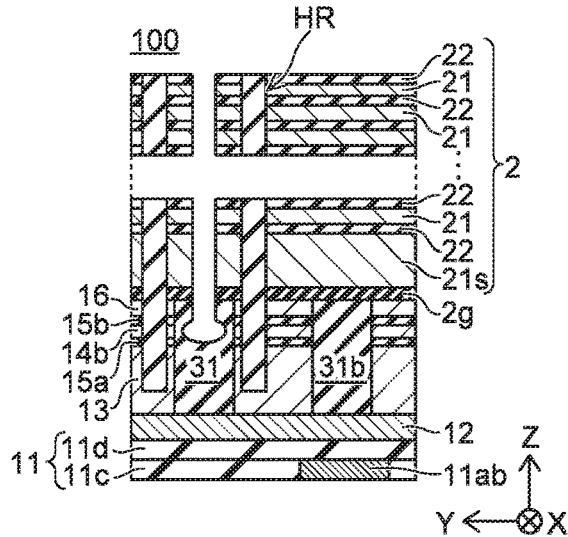
Figure 26C:
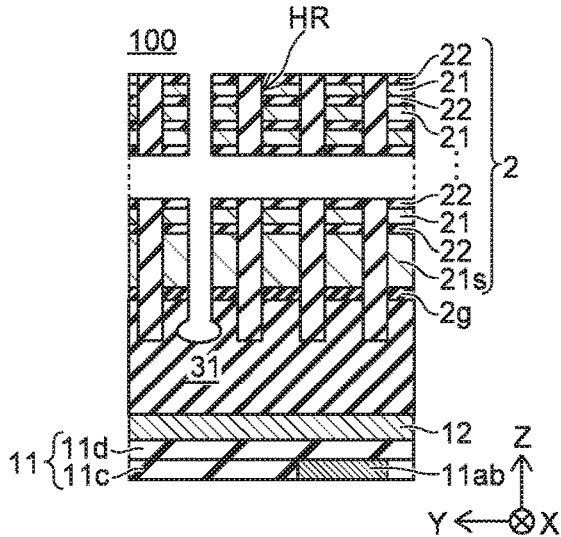
Figure 26B:
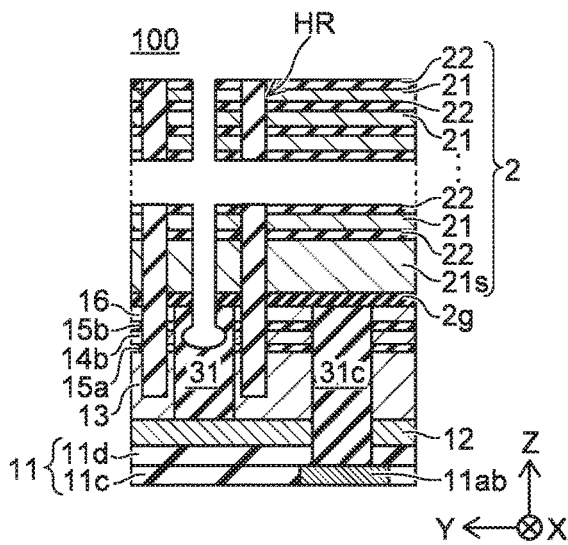
Figure 26D:
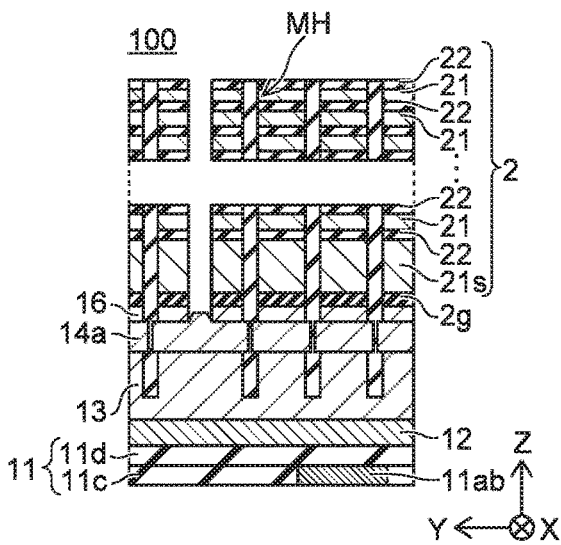
Figure 26E:
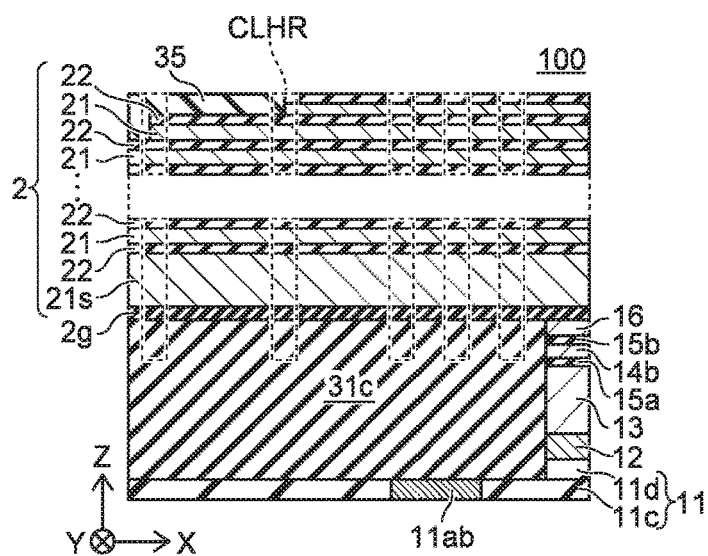
Figure 28A:
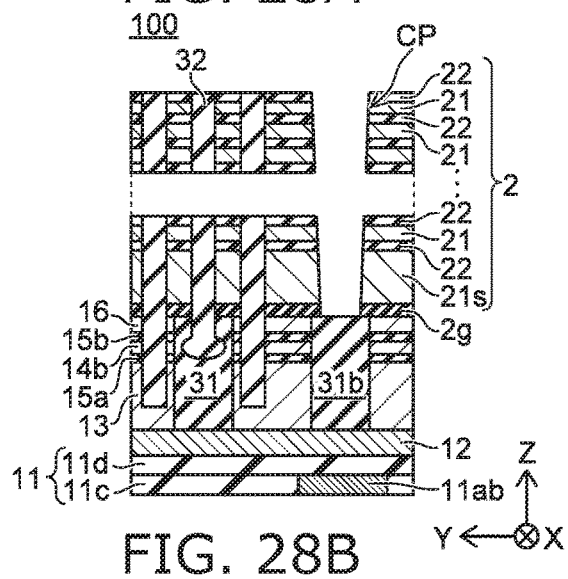
Figure 28C:
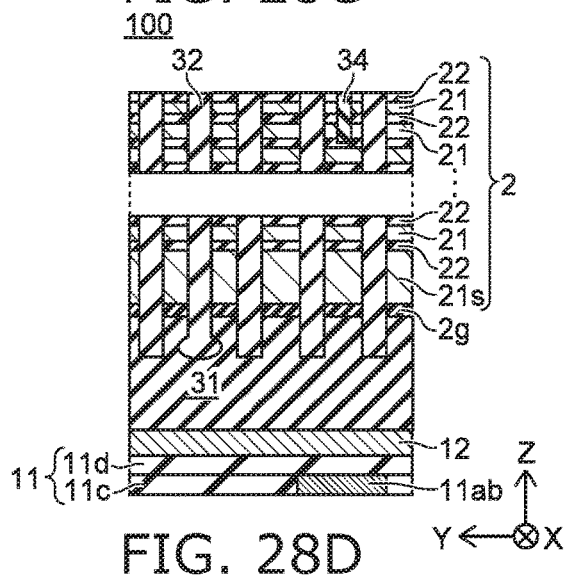
Figure 28B:
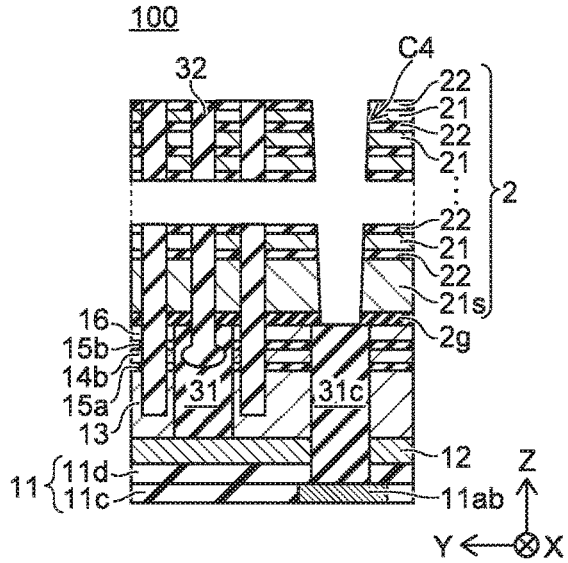
Figure 28D:
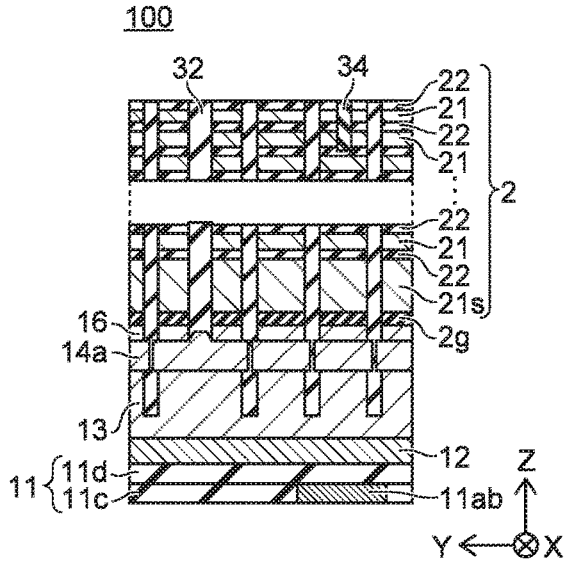
Figure 28E:
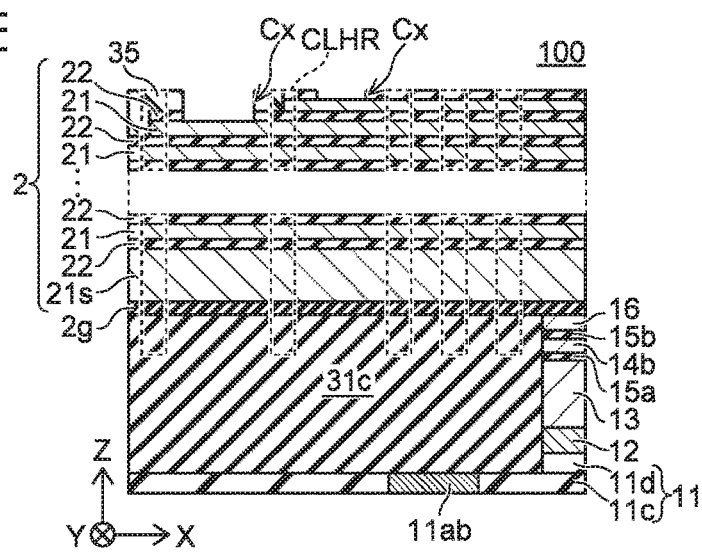
Figure 29A:
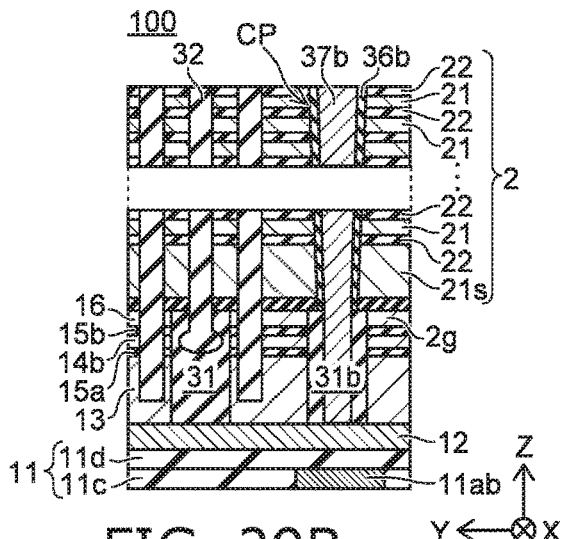
Figure 29C:
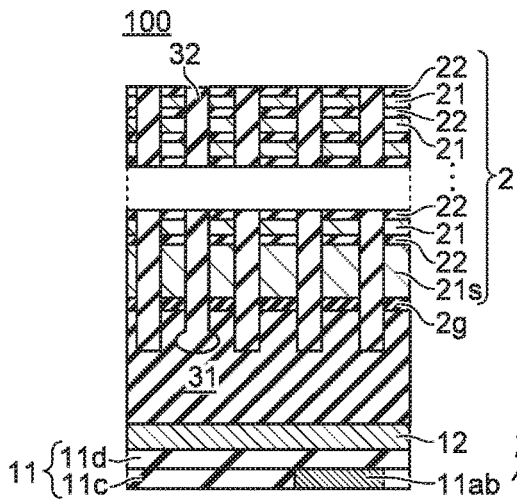
Figure 29B:
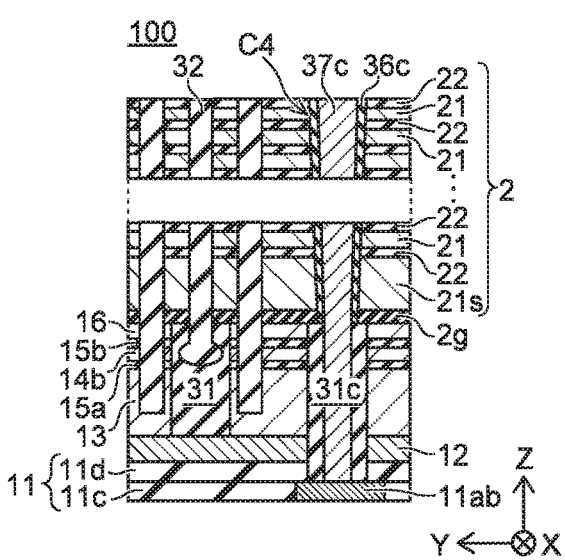
Figure 29D:
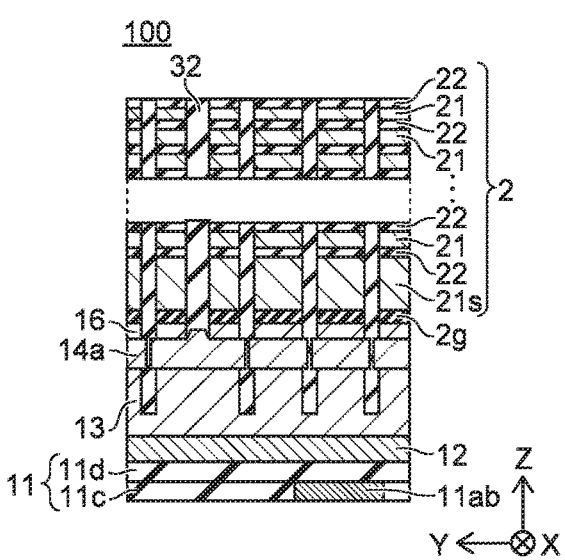
Figure 29E:
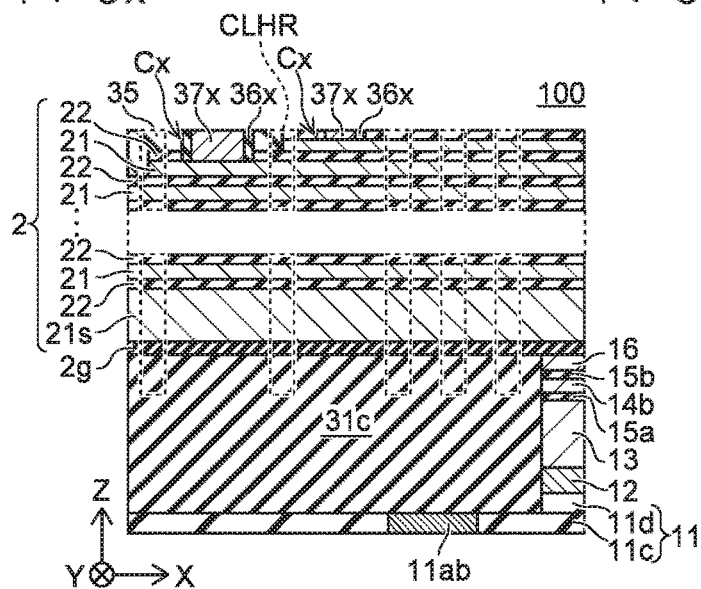

FIG. 17 is a schematic plan view illustrating a plane in the stage shown in FIG. 16A and FIG. 16B. The cross section shown in FIG. 16A corresponds to a cross section along line XVIA-XVIA of FIG. 17; and the cross section shown in FIG. 16B corresponds to a cross section along line XVIB-XVIB of FIG. 17.

As shown in FIG. 17, for example, the ring-like region 31r that is surrounded with the portions 31x and 31y of the first pedestal portion 31 is obtained in the first tap region (Tap1). Although not particularly illustrated, a similar ring-like region 31r is obtained in the second tap region (Tap2) as well. The manufacturing method is an example in which the shallow slit PDS in which the first pedestal portion 31 is formed and the hole CPH in which the second pedestal portion 31b is formed are formed simultaneously. Therefore, the shallow slit PDS overlaps the hole C4S for the third pedestal portion 31c formed after the shallow slit PDS in, for example, the boundary region between the staircase portion 2s and the first tap region (Tap1). In the first tap region, for example, one of the portions 31y of the ring-like region 31r extending in the Y-axis direction is formed of a portion of the third pedestal portion 31c along the Y-axis direction.

As described above, the region occurs where the first pedestal portion 31 and the third pedestal portion 31c overlap. For example, a region 31d that is deeper than the third pedestal portion 31c in the Z-axis direction is formed in the overlapping region. The deep region 31d that is provided at the portion where the contact between the first pedestal portion 31 and the third pedestal portion 31c is, for example, a trace from when the shallow slit PDS and the hole C4S are formed separately. For example, the deep region 31d is a trace from when the hole C4S is formed after forming the shallow slit PDS.

Subsequently, the stacked body 2, the staircase portion 2s, the first columnar portions CL, the second columnar portions CLHR, the deep slit ST, the shallow slit SHE, etc., are formed. It is sufficient for the method for forming these structure bodies to be performed according to well-known manufacturing methods. One example of a method for forming these structure bodies will now be described.

FIG. 18A to FIG. 29E are schematic cross-sectional views in order of the processes, illustrating the method for manufacturing the semiconductor device according to the first embodiment. For better understanding of the invention, the position of the illustrated cross sections in the cross sections describing the following manufacturing method are different from those of FIG. 11A to FIG. 17B. In FIG. 18A to FIG. 29E, FIGS. A to E correspond respectively to cross sections along lines a-a to e-e of FIG. 3.

As shown in FIG. 18A to FIG. 18E, the stopper film 60 that is on the second doped semiconductor film 16 is removed. Then, the stacked body 2 that includes the insulating film 2g, a conductive silicon film 21s, multiple second sacrificial films 23, and the multiple insulating layers 22 is formed on the second doped semiconductor film 16. The stacked body 2 alternately includes the second sacrificial films 23 and the insulating layers 22. The insulating film 2g includes, for example, silicon oxide. The conductive silicon film 21s includes, for example, N-type silicon including phosphorus, arsenic, antimony, etc. The second sacrificial films 23 and the insulating layers 22 each include, for example, silicon nitride and silicon oxide.

Continuing as shown in FIG. 19A to FIG. 19E, the staircase portion 2s is formed by patterning the second sacrificial films 23 and the insulating layers 22 into a staircase configuration. Then, the staircase portion 2s is buried in an insulator 35; and, for example, the stacked body 2 is planarized.

Continuing as shown in FIG. 20A to FIG. 20E, the holes HR are formed inside the stacked body 2. For example, the holes HR reach one of the first doped semiconductor film 13, the first pedestal portion 31, or the third pedestal portion 31c. In the example, in the memory cell array 2m, the holes HR reach the portion 31y of the first pedestal portion 31 and the first doped semiconductor film 13 on the inner side of the ring-like region 31r. In the staircase portion 2s, the holes HR reach the third pedestal portion 31c. For example, the holes HR are arranged in at least one column along the Y-axis direction in the portion 31y. Although an example is shown in the example in which the holes HR overlap the portion 31y of the first pedestal portion 31, the holes HR may not overlap the portion 31y. Also, a portion of the holes HR may overlap the portion 31y.

Then, the interiors of the holes HR are filled with the second insulator 33, e.g., silicon oxide. Thereby, the second columnar portions CLHR are formed. Then, the memory holes MH are formed inside the stacked body 2. In the memory cell array 2m, for example, the memory holes MH are formed on the outer side of the ring-like region 31r. It is sufficient for the memory holes MH to reach at least the first sacrificial film 17. In the example, the memory holes MH reach the first portion 13a of the first doped semiconductor film 13 on the outer side of the ring-like region 31r. Then, at least the memory film 220, the semiconductor body 210, and the core layer 230 are formed inside the memory holes MH. For example, the details of the memory film 220, the semiconductor body 210, and the core layer 230 are shown in FIG. 2A and FIG. 2B.

Thus, the first columnar portions CL and the second columnar portions CLHR are formed inside the stacked body 2. Although an example is shown in the example in which the first columnar portions CL are formed after the second columnar portions CLHR, the first columnar portions CL may be formed before the second columnar portions CLHR. Also, the first columnar portions CL and the second columnar portions CLHR may be formed simultaneously. In such a case, the second columnar portions CLHR have a structure similar to that of the first columnar portions CL.

Continuing as shown in FIG. 21A to FIG. 21E, the deep slit ST is formed inside the stacked body 2. In the memory cell array 2m, the deep slit ST reaches the first sacrificial film 17 and the first pedestal portion 31; and in the staircase portion 2s, the deep slit ST reaches the third pedestal portion 31c. The location where the third pedestal portion 31c is reached is not particularly illustrated. Then, a second stopper film 60b is formed on the side wall of the deep slit ST. The second stopper film 60b includes, for example, silicon nitride. The second stopper film 60b is, for example, the same material as the second sacrificial films 23. For example, the second stopper film 60b is formed by depositing silicon nitride on the stacked body 2 in which the deep slit ST is formed and by performing anisotropic etching after forming the silicon nitride film.

Continuing as shown in FIG. 22A to FIG. 22E, the first sacrificial film 17 is removed via the deep slit ST. Thereby, for example, the first space S1 is formed below the cell region (Cell) of the stacked body 2. At this time, the first space S1 is not formed in the first tap region (Tap1), the second tap region (Tap2), and the staircase region (Staircase) because the first pedestal portion 31 and/or the third pedestal portion 31c is used as a stopper of the etching. Then, the first sacrificial film 17 is caused to remain in the first tap region (Tap1), the second tap region (Tap2), and the staircase region (Staircase) and is used to form the second region 14b of the first semiconductor portion 14.

Continuing as shown in FIG. 23A to FIG. 23E, the first intermediate film 15a, the second intermediate film 15b, and the memory film 220 are removed via the deep slit ST and the first space S1. Thereby, the first space S1 spreads; and the first space S1 reaches the semiconductor body 210 of the first columnar portion CL. The state of the memory film 220, the semiconductor body 210, and the core layer 230 in this process is already shown in FIGS. 8A and 8B. For example, the portions of the first pedestal portion 31 and the third pedestal portion 31c facing the deep slit ST are etched isotropically so that the widths and the depths enlarge. Therefore, for example, the Y-Z cross section of the deep slit ST has a flask configuration. Only the first pedestal portion 31 is illustrated for the flask configuration of the deep slit ST.

Continuing as shown in FIG. 24A to FIG. 24E, the first region 14a of the first semiconductor portion 14 is formed inside the first space S1 via the deep slit ST. The first region 14a is, for example, N-type silicon. The N-type silicon includes, for example, at least one of phosphorus, arsenic, or antimony. The first region 14a contacts the semiconductor body 210. For example, the state in which the first region 14a and the semiconductor body 210 contact each other is already shown in FIGS. 5A and 58. The first region 14a is not formed inside the portion of the first pedestal portion 31 where the Y-Z cross section has a flask configuration because of the selective growth of silicon. The first pedestal portion 31 and the third pedestal portion 31c each are, for example, silicon oxide. The first doped semiconductor film 13 and the second doped semiconductor film 16 are provided inside the first space S1. The first doped semiconductor film 13 and the second doped semiconductor film 16 each are silicon, e.g., N-type silicon. For example, the first region 14a can be formed selectively inside the first space S1 by using a selective growth method using the first doped semiconductor film 13 and the second doped semiconductor film 16 as seed crystals.

Continuing as shown in FIG. 25A to FIG. 25E, the second stopper film 60b and the second sacrificial films 23 are removed via the deep slit ST. Thereby, a second space S2 is formed inside the stacked body 2. When forming the second space S2, if the second stopper film 60b is, for example, the same type of film as the second sacrificial films 23, it is advantageous in that the second stopper film 60b and the second sacrificial films 23 can be removed collectively; and the increase of the number of processes is suppressed. For example, in the case where the second stopper film 60b, the first pedestal portion 31, and the third pedestal portion 31c are different types of films, the etching of the first pedestal portion 31 and the third pedestal portion 31c can be suppressed when removing the second stopper film 60b. Therefore, for example, an advantage can be obtained in that shorts between the conductive layer 21 and the first conductive film 12 formed subsequently can be suppressed, etc.

Continuing as shown in FIG. 26A to FIG. 26E, the conductive layers 21 are formed inside the second space S2 via the deep slit ST. The conductive layers 21 include, for example, tungsten as a conductor. The blocking insulating film 21a and the barrier film 21b may be formed before forming the conductive layers 21. For example, the blocking insulating film 21a and the barrier film 21b are shown in FIGS. 2A and 2B.

Continuing as shown in FIG. 27A to FIG. 27E, an insulator is formed inside the deep slit ST; and the deep slit ST is filled with the insulator. Thereby, the plate portion 32 is formed inside the deep slit ST. Then, the shallow slit SHE is formed inside the stacked body 2. The shallow slit SHE is formed partway through the stacked body 2; and, for example, the bottom of the shallow slit SHE reaches the interior of one of the insulating layers 22. Then, an insulator is formed inside the shallow slit SHE; and the shallow slit SHE is filled with the insulator. Thereby, the insulator 34 is formed inside the shallow slit SHE.

Continuing as shown in FIG. 28A to FIG. 28E, multiple holes CP, C4, and Cx are formed inside the stacked body 2 and the insulator 35. The holes CP each reach the second pedestal portion 31b; and the holes C4 each reach the third pedestal portion 31c. The contact holes Cx are formed in the staircase portion 2s, are formed inside the insulator 35, and respectively reach the conductive layers 21 and the conductive silicon films 21s.

Continuing as shown in FIG. 29A to FIG. 29E, the insulators 36b, 36c, and 36x are formed respectively in the holes CP, C4, and Cx. Then, holes that pierce the insulator 36b and the second pedestal portion 31b, holes that pierce the insulator 36c and the third pedestal portion 31c, and holes that pierce the insulator 36x are formed. Then, the conductors 37b, 37c, and 37d are formed by filling a conductor into the holes. The conductor 37b contacts the first conductive film 12; the conductor 37c contacts the upper layer interconnect 11ab; and a conductor 37x contacts one of the conductive layer 21 or the conductive silicon film 21s.

Subsequently, although not particularly illustrated, it is sufficient to form the bit lines BL, etc., above the stacked body 2 according to well-known methods. Thus, for example, the semiconductor device 100 according to the first embodiment can be manufactured.

First Modification

Semiconductor Device

Figure 30:
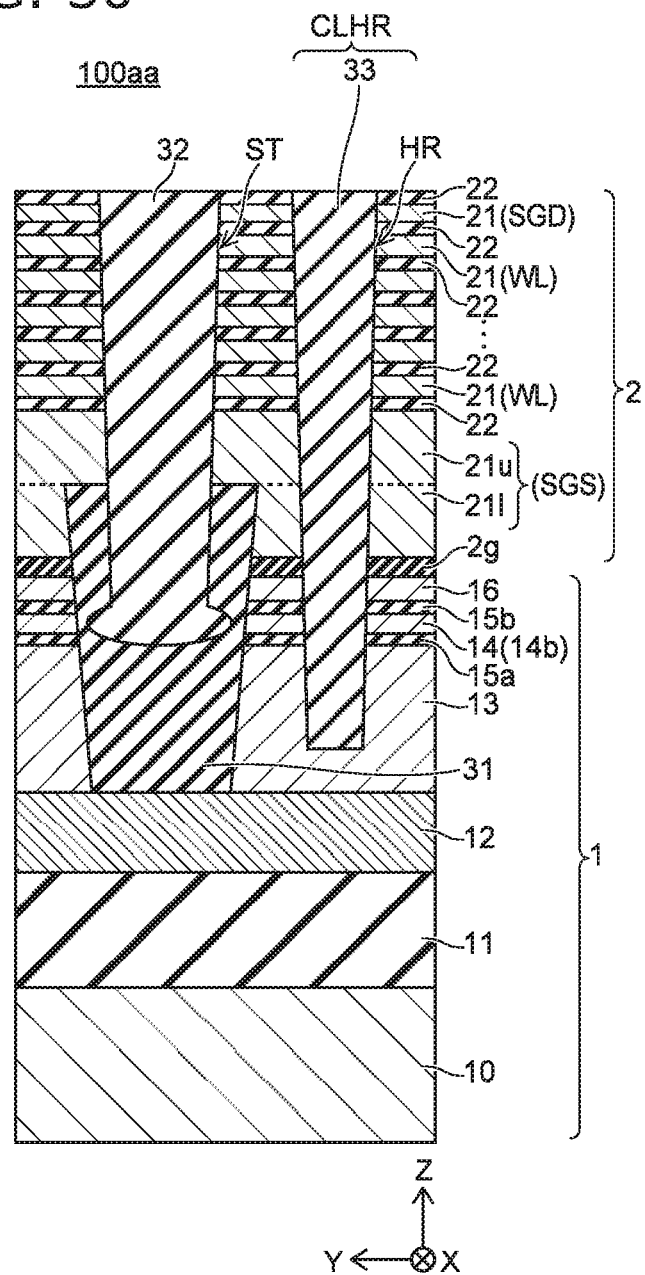
FIG. 30 is a schematic cross-sectional view illustrating a semiconductor device according to a first modification of the first embodiment.

FIG. 30 is a schematic cross-sectional view illustrating a semiconductor device 100aa according to a first modification of the first embodiment. For example, the cross section shown in FIG. 30 corresponds to the cross section shown in FIG. 5B.

In the semiconductor device 100aa according to the first modification as shown in FIG. 30, the upper portion of the first pedestal portion 31 reaches partway through the conductive layers 21 of the stacked body 2. The conductive layer 21 that is reached by the first pedestal portion 31 is, for example, the conductive layer 21 furthest on the base body portion 1 side of the stacked body 2. The conductive layer 21 that is on the base body portion 1 side is, for example, the source-side select gate SGS. The conductive layer 21 that is on the base body portion 1 side of the semiconductor device 100aa includes a lower conductive layer 21l contacting the side surface of the first pedestal portion 31 extending in the Z-axis direction, and an upper conductive layer 21u contacting the upper surface of the first pedestal portion 31 extending in the X-axis direction.

Thus, for example, the upper surface of the first pedestal portion 31 reaches partway through the conductive layers 21 of the stacked body 2 and may contact the conductive layers 21. Although not particularly illustrated, the upper surface of the first pedestal portion 31 may not be formed to the interior of the second doped semiconductor film 16 and may have substantially the same height as, for example, the upper surface of the second intermediate film 15b.

Second Modification

Semiconductor Device

Figure 32:
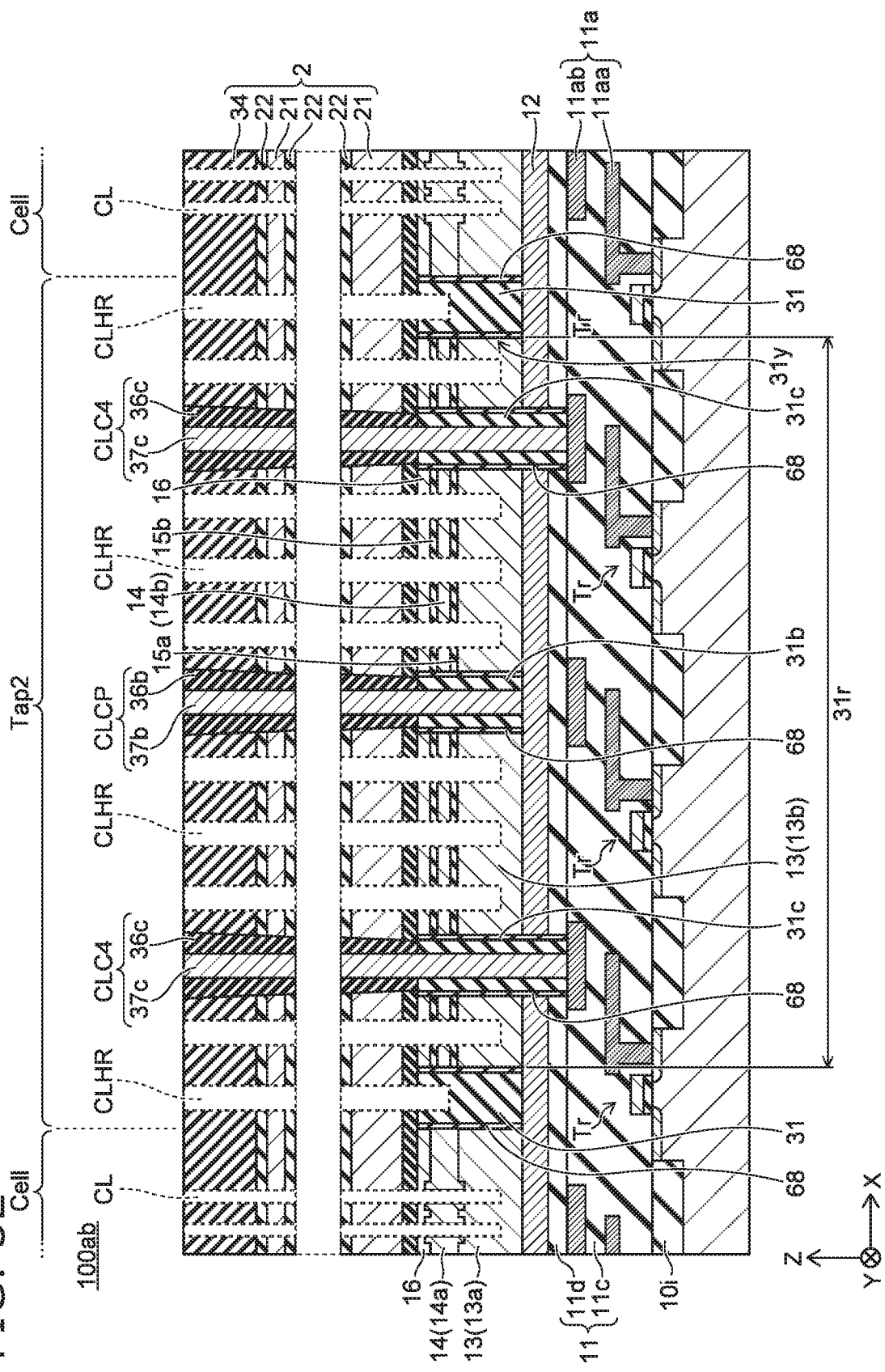
FIG. 32 is a schematic cross-sectional view illustrating the semiconductor device according to the second modification of the first embodiment.

FIG. 31A and FIG. 31B are schematic cross-sectional views illustrating a semiconductor device 100ab according to a second modification of the first embodiment. For example, the cross sections shown in FIG. 31A and FIG. 31B correspond respectively to the cross sections shown in FIG. 5A and FIG. 5B. FIG. 32 is a schematic cross-sectional view illustrating the semiconductor device 100ab according to the second modification of the first embodiment. For example, the cross section shown in FIG. 32 corresponds to the cross section shown in FIG. 9.

As shown in FIG. 31A to FIG. 32, the semiconductor device 100ab according to the second modification further includes a third stopper film 68 on the side surface of the first pedestal portion 31 (particularly, FIG. 31B and FIG. 32). The third stopper film 68 is provided between the side surface of the first pedestal portion 31 and the first doped semiconductor film 13, the first semiconductor portion 14, the first and second intermediate films 15a and 15b, and the second doped semiconductor film 16.

The third stopper film 68 is insulative. The third stopper film 68 is an insulating film that includes an insulator that is different from that of the first pedestal portion 31, and is provided between the first pedestal portion 31 and at least the first semiconductor portion 14. Also, in the second modification, the third stopper film 68 includes an insulator that is different from the first intermediate film 15a and the second intermediate film 15b.

As the material of the third stopper film 68, for example, it is favorable to select an insulating material for which the etching rate can be slower than that of the first semiconductor portion 14 and for which the etching rate also can be slower than those of the first and second intermediate films 15a and 15b. For example, it is favorable to select an insulator further including nitrogen, e.g., silicon nitride as the third stopper film 68 in the case where the first intermediate film 15a, the second intermediate film 15b, and the first pedestal portion 31 include silicon oxide and the second region 14b of the first semiconductor portion 14 includes silicon (e.g., undoped silicon or n-type silicon).

For example, the third stopper film 68 suppresses the progress of the etching to the first pedestal portion 31 in the replacement process in the case where the first region 14a of the first semiconductor portion 14 is formed by replacing the first sacrificial film 17 (the second region 14b), the first intermediate film 15a, the second intermediate film 15b, etc.

Figure 33:
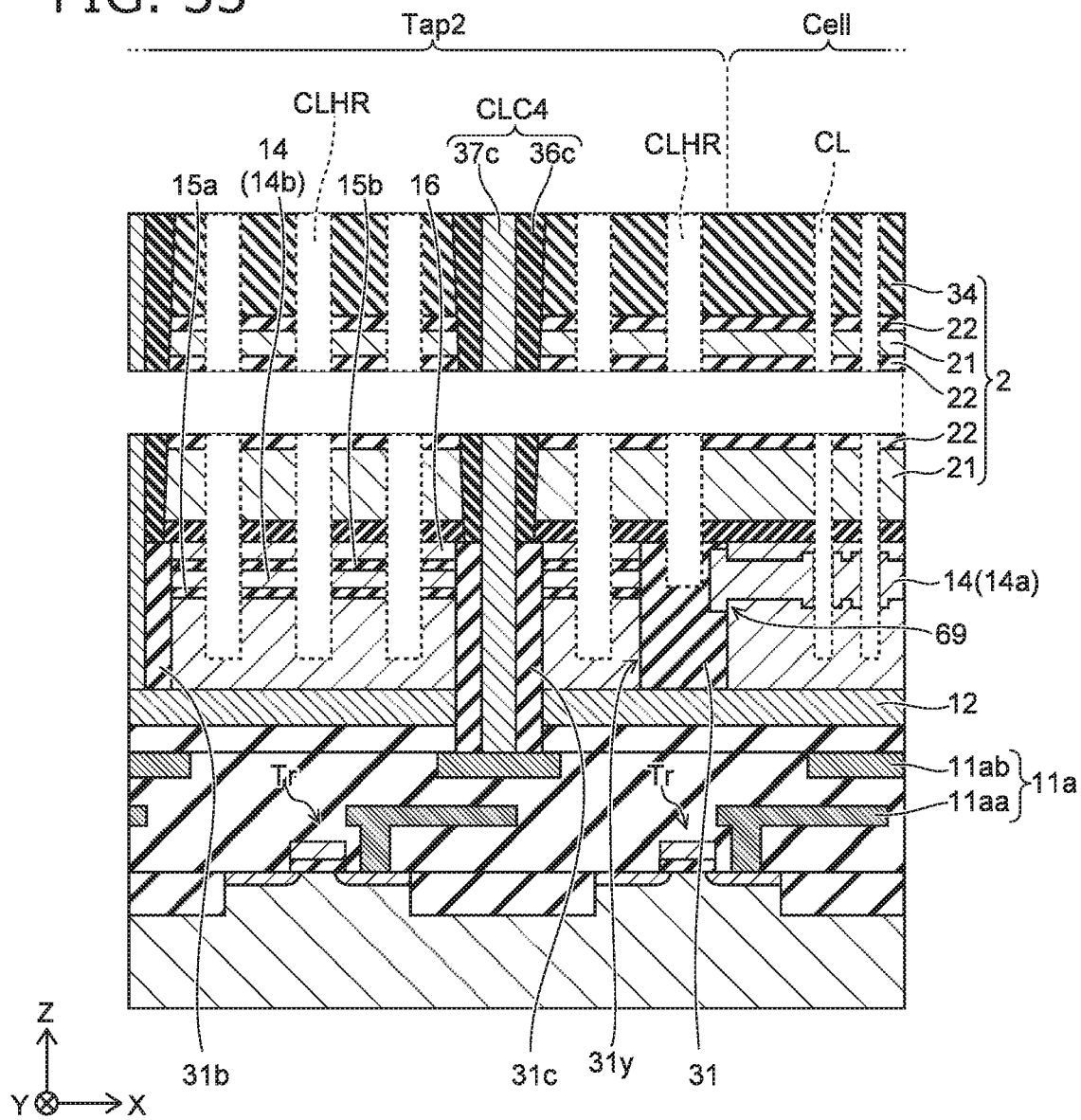
FIG. 33 is a schematic cross-sectional view illustrating a semiconductor device according to a second reference example.
Figure 34:
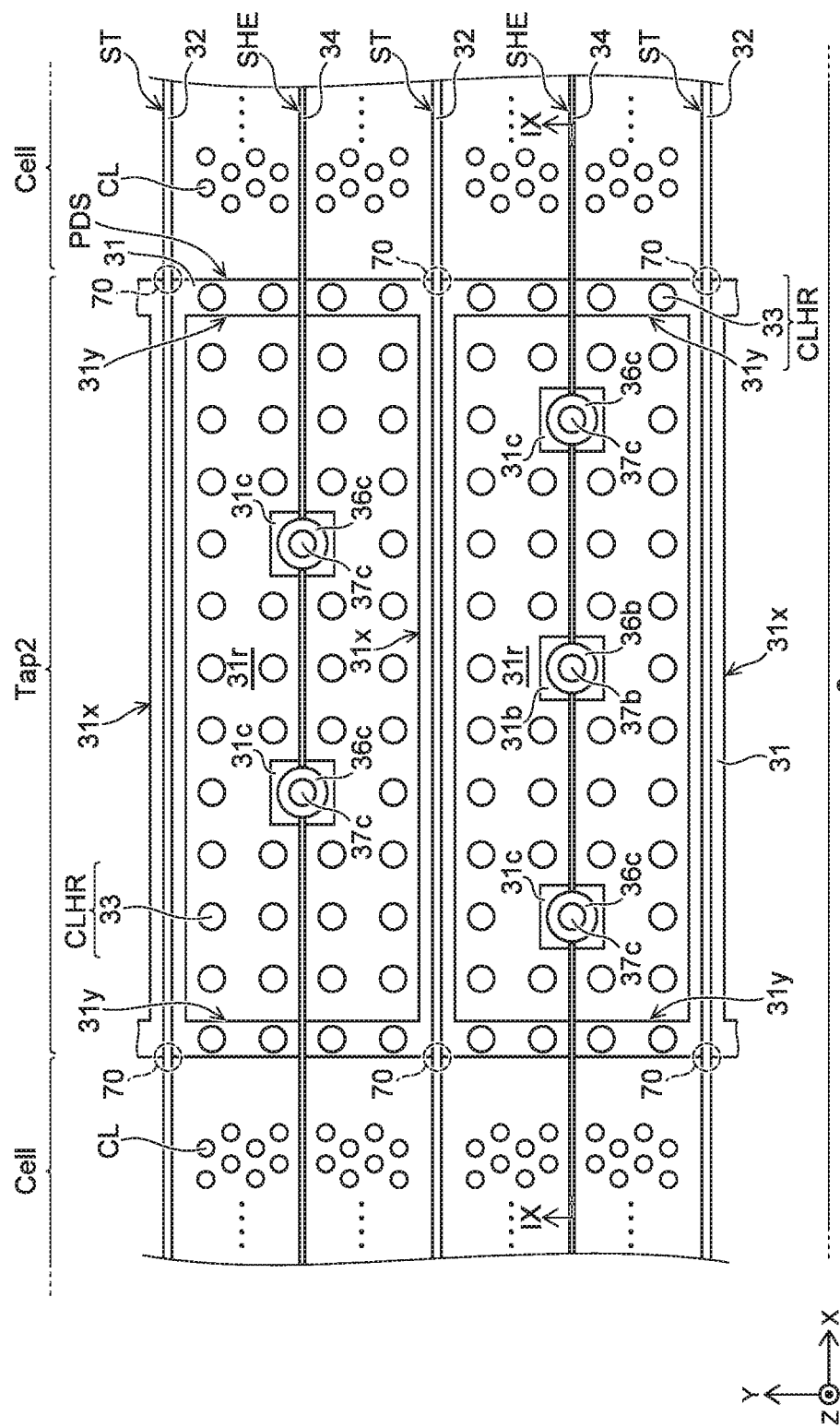
FIG. 34 is a schematic plan view illustrating the semiconductor device according to the second reference example.

FIG. 33 is a schematic cross-sectional view illustrating a semiconductor device (SECOND REFERENCE EXAMPLE) according to a second reference example. FIG. 34 is a schematic plan view illustrating the semiconductor device (SECOND REFERENCE EXAMPLE) according to the second reference example. For example, the cross section shown in FIG. 33 corresponds to the cross section shown in FIG. 9; and the boundary portion between the tap region (Tap2) and the cell region (Cell) is shown as being enlarged. For example, the plane shown in FIG. 34 corresponds to the plane shown in FIG. 4.

As shown in FIG. 33, a portion of the first pedestal portion 31 contacts both the tap region (in FIG. 33, the tap region Tap2 is shown) and the cell region (cell). The portion that contacts both the tap region and the cell region (cell) is, for example, the portion 31y of the first pedestal portion 31 extending in the Y-axis direction.

First, in the replacement process, the cell region side of the portion 31y of the first pedestal portion 31 is exposed to the etching of the second region 14b. Further, in the replacement process, the cell region side of the portion 31y of the first pedestal portion 31 is exposed to the etching of the memory film 220, the first intermediate film 15a, and the second intermediate film 15b.

The cover insulating film 221 and/or the tunneling insulating film 223 of the memory film 220, the first intermediate film 15a, the second intermediate film 15b, and the first pedestal portion 31 each include silicon oxide. Therefore, in the replacement process as shown in FIG. 33, there is a possibility that an etching portion 69 may occur in the first pedestal portion 31. The first region 14a is provided inside the etching portion 69.

If the etching portion 69 spreads and undesirably contacts the conductive layer 21 of the lowermost layer, the first region 14a is undesirably shorted to the conductive layer 21 of the lowermost layer (e.g., the source-side select gate SGS). For example, the etching portion 69 spreads particularly easily at a crossing location 70 between the deep slit ST and the shallow slit PDS as shown in FIG. 34. An etchant that can etch silicon oxide is supplied from the deep slit ST toward the first sacrificial film 17, the first intermediate film 15a, the second intermediate film 15b, etc. Therefore, for example, the time that the first pedestal portion 31 is exposed to the etchant that can etch silicon oxide lengthens easily at the crossing location 70.

For such circumstances, according to the semiconductor device 100ab, the third stopper film 68 that is on the side surface of the first pedestal portion 31 is further included. Therefore, the progress of the etching toward the first pedestal portion 31 can be suppressed in the replacement process in which the first region 14a is formed.

In the case where the third stopper film 68 includes silicon nitride, it is favorable for the thickness along the X-axis direction (or the thickness along the Y-axis direction) of the third stopper film 68 to be set to be, for example, thicker than the overall total value of the thickness along the X-axis direction (or the thickness along the Y-axis direction) of the silicon nitride included in the memory film 220. Thereby, in the replacement process of the first region 14a, the progress of the etching toward the first pedestal portion 31 can be suppressed better.

In the semiconductor device 100ab as shown in FIG. 32, the third stopper film 68 may be further provided on the side surfaces of the second and third pedestal portions 31b and 31c. The third stopper film 68 of the semiconductor device 100ab is further provided between the side surfaces of the second and third pedestal portions 31b and 31c and each of the first doped semiconductor film 13, the first semiconductor portion 14, the first and second intermediate films 15a and 15*b*, and the second doped semiconductor film 16. The third stopper film 68 is further provided between the side surface of the third pedestal portion 31*c* and each of the first conductive film 12 and the insulating layer 11*d* of the first insulating film 11.

Manufacturing Method

FIG. 35A to FIG. 40B are schematic cross-sectional views in order of the processes, illustrating a method for manufacturing the semiconductor device 100*ab* according to the second modification of the first embodiment. FIG. 35A to FIG. 40A correspond to cross sections along line A-A of FIG. 3. FIG. 35B to FIG. 40B correspond to cross sections along line B-B of FIG. 3.

As shown in FIG. 35A and FIG. 35B, similarly to the semiconductor device 100 according to the first embodiment, according to the manufacturing method described with reference to FIG. 11A to FIG. 14B, the photoresist film 66 is formed on the anti-reflection film 65; and the window C4Sw that corresponds to the third pedestal portion 31*c* is formed in the photoresist film 66.

Figures 36A, 36B:
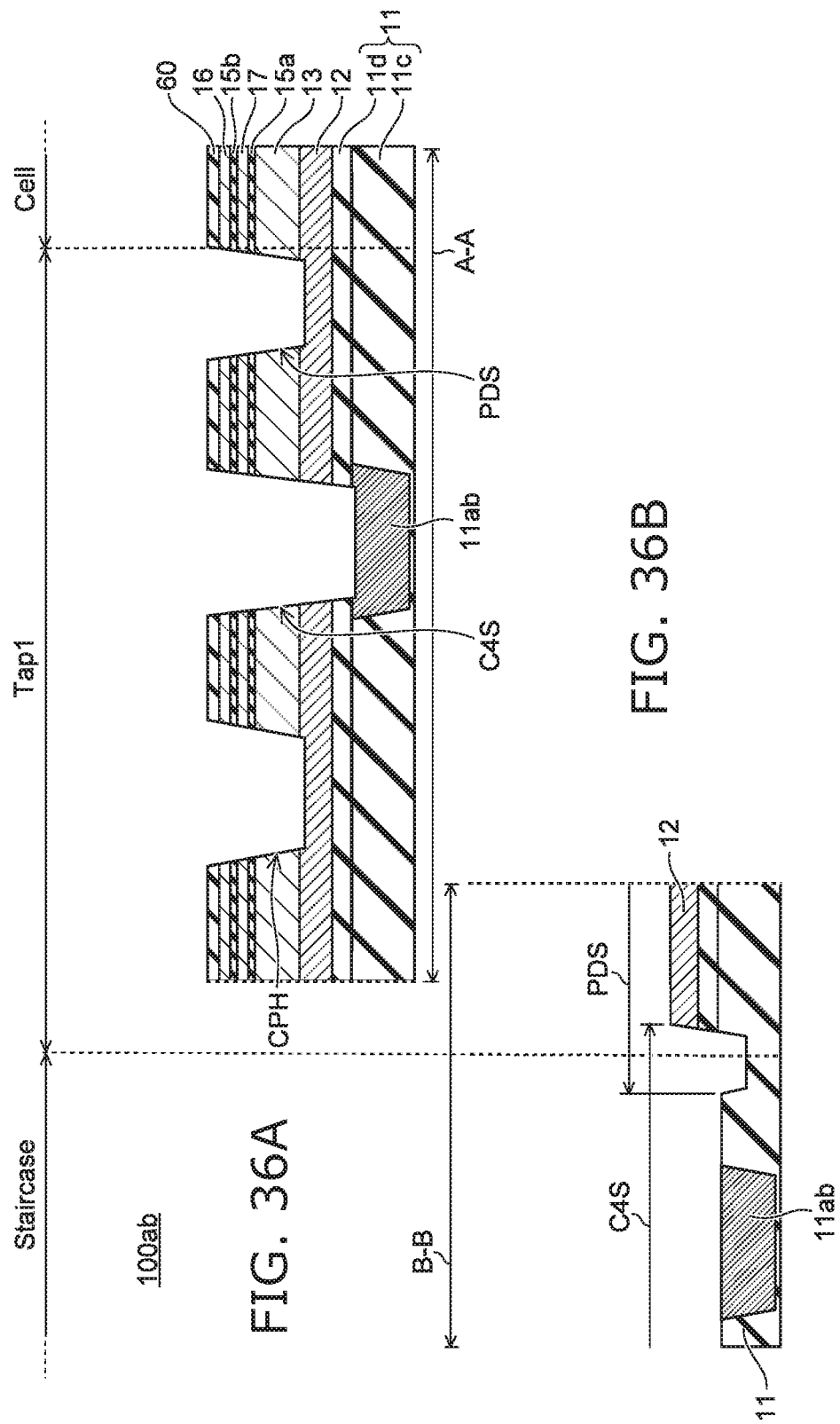

Then, as shown in FIG. 36A and FIG. 36B, the anti-reflection film 65 and the hard mask 64 are etched using the photoresist film 66 as a mask of the etching. Then, the photoresist film 66 is removed by ashing. Then, the stopper film 60, the second doped semiconductor film 16, the second intermediate film 15*b*, the first sacrificial film 17, the first intermediate film 15*a*, the first doped semiconductor film 13, the first conductive film 12, and the insulating layer 11*d* are etched using the hard mask 64 as a mask of the etching. Then, the hard mask 64 is removed. Thereby, the hole C4S that corresponds to the third pedestal portion 31*c* is formed in the stopper film 60, the second doped semiconductor film 16, the second intermediate film 15*b*, the first sacrificial film 17, the first intermediate film 15*a*, the first doped semiconductor film 13, the first conductive film 12, and the insulating layer 11*d*. For example, the manufacturing method shown up to FIG. 36A and FIG. 36B may be common with the method for manufacturing the semiconductor device 100 according to the first embodiment.

Continuing as shown in FIG. 37A and FIG. 37B, the third stopper film 68 is formed on the upper layer interconnect 11*ab*, the first conductive film 12, the side wall of the shallow slit PDS, the side wall of the hole CPH, and the side wall of the hole C4S. The third stopper film 68 includes, for example, silicon nitride.

Continuing as shown in FIG. 38A and FIG. 38B, the third stopper film 68 that is on the upper layer interconnect 11*ab* and the first conductive film 12 is selectively removed by performing anisotropic etching, e.g., RIE (Reactive Ion Etching) of the third stopper film 68. Thereby, the third stopper film 68 remains on the side wall of the shallow slit PDS, the side wall of the hole CPH, and the side wall of the hole C4S.

Figures 39A, 39B:
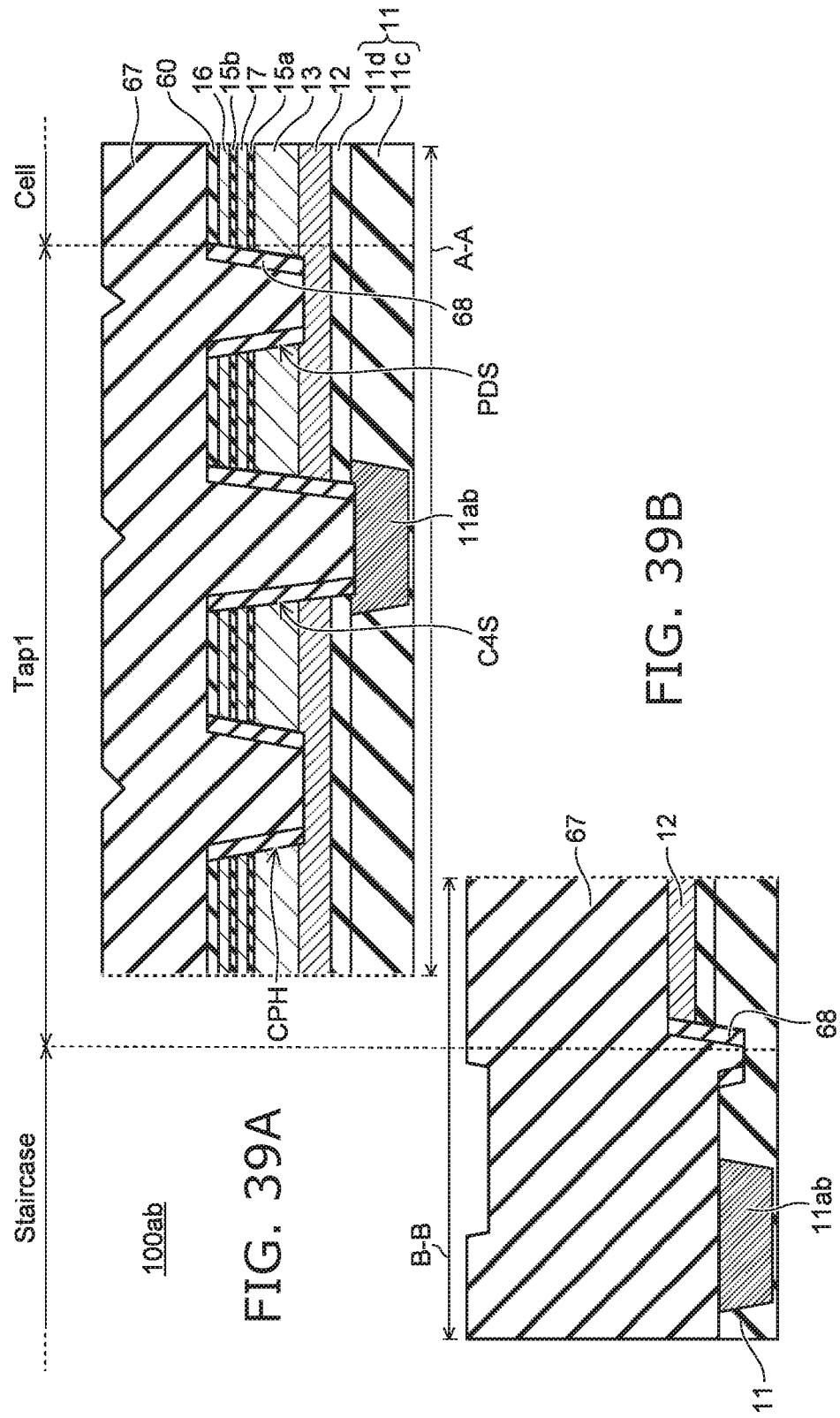

Continuing as shown in FIG. 39A and FIG. 39B, the silicon oxide film 67 is formed on the structure body in which the shallow slit PDS, the hole CPH, the hole C4S, and the third stopper film 68 are formed.

Figure 40A:
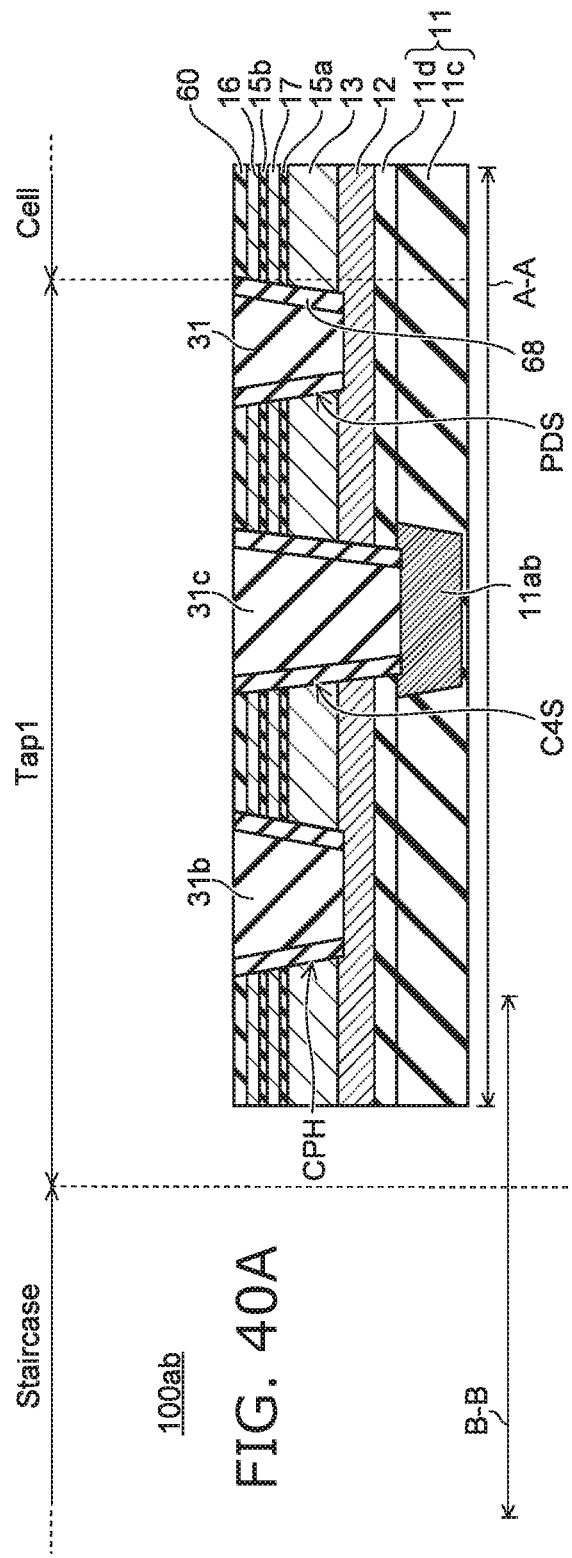
Figure 40B:
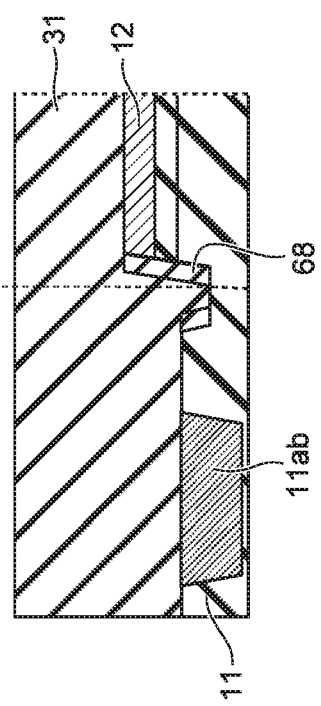

Continuing as shown in FIG. 40A and FIG. 40B, chemical mechanical polishing of the silicon oxide film 67 is performed using the stopper film 60 as a stopper of the chemical mechanical polishing. Thereby, by filling the shallow slit PDS and the holes CPH and C4S with the third stopper film 68 and the silicon oxide film 67, a structure body that includes the first to third pedestal portions 31, 31*b*, and 31*c* having the third stopper film 68 provided at the side surfaces is formed.

Subsequently, although not particularly illustrated, similarly to the semiconductor device 100 according to the first embodiment, the semiconductor device 100*ab* according to the second modification can be manufactured according to the manufacturing method described with reference to FIG. 18A to FIG. 29E.

Second Embodiment

Semiconductor Device

Figure 41:
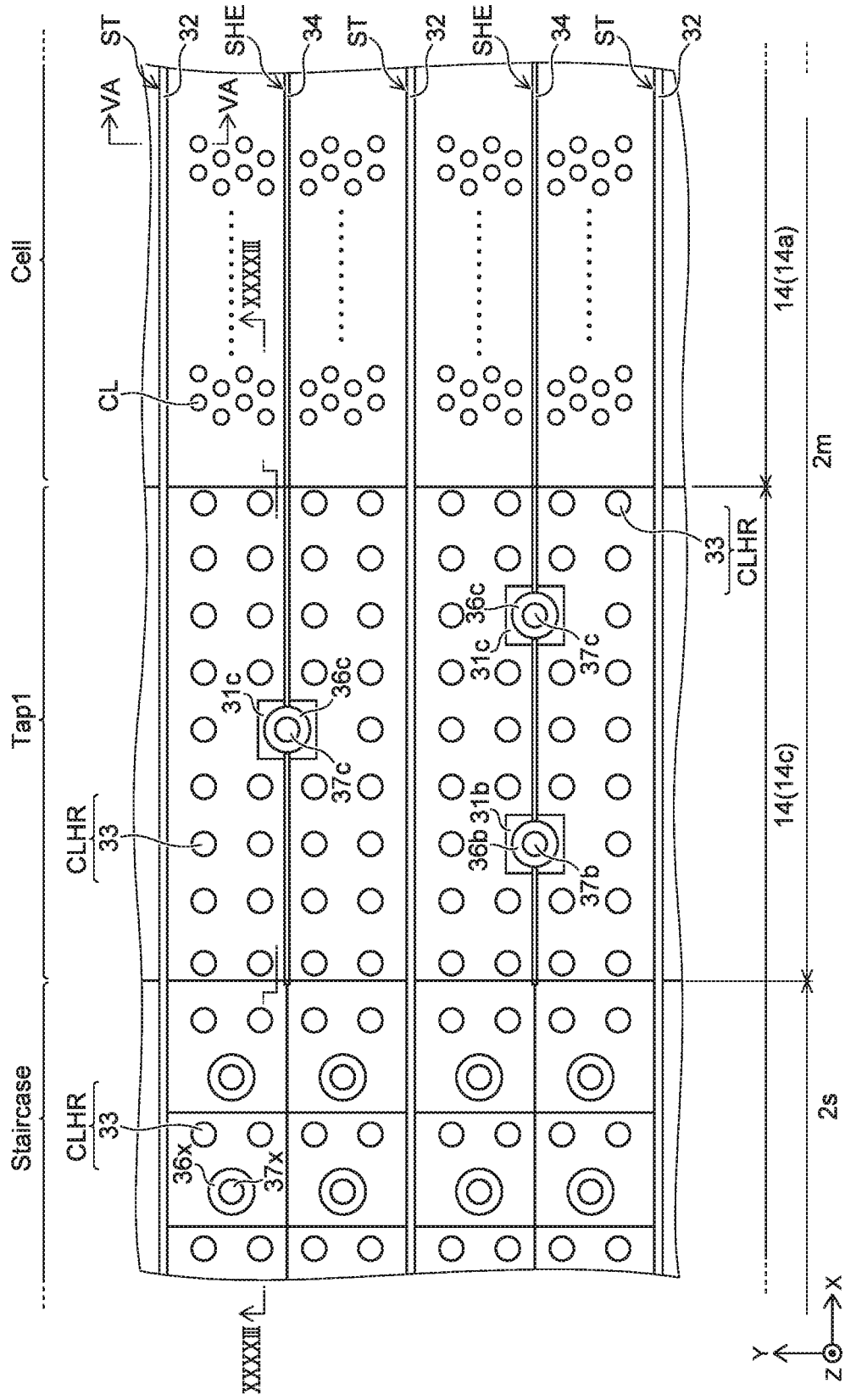
FIG. 41 is a schematic plan view illustrating a periphery of a tap region of a semiconductor device according to a second embodiment.
Figure 42:
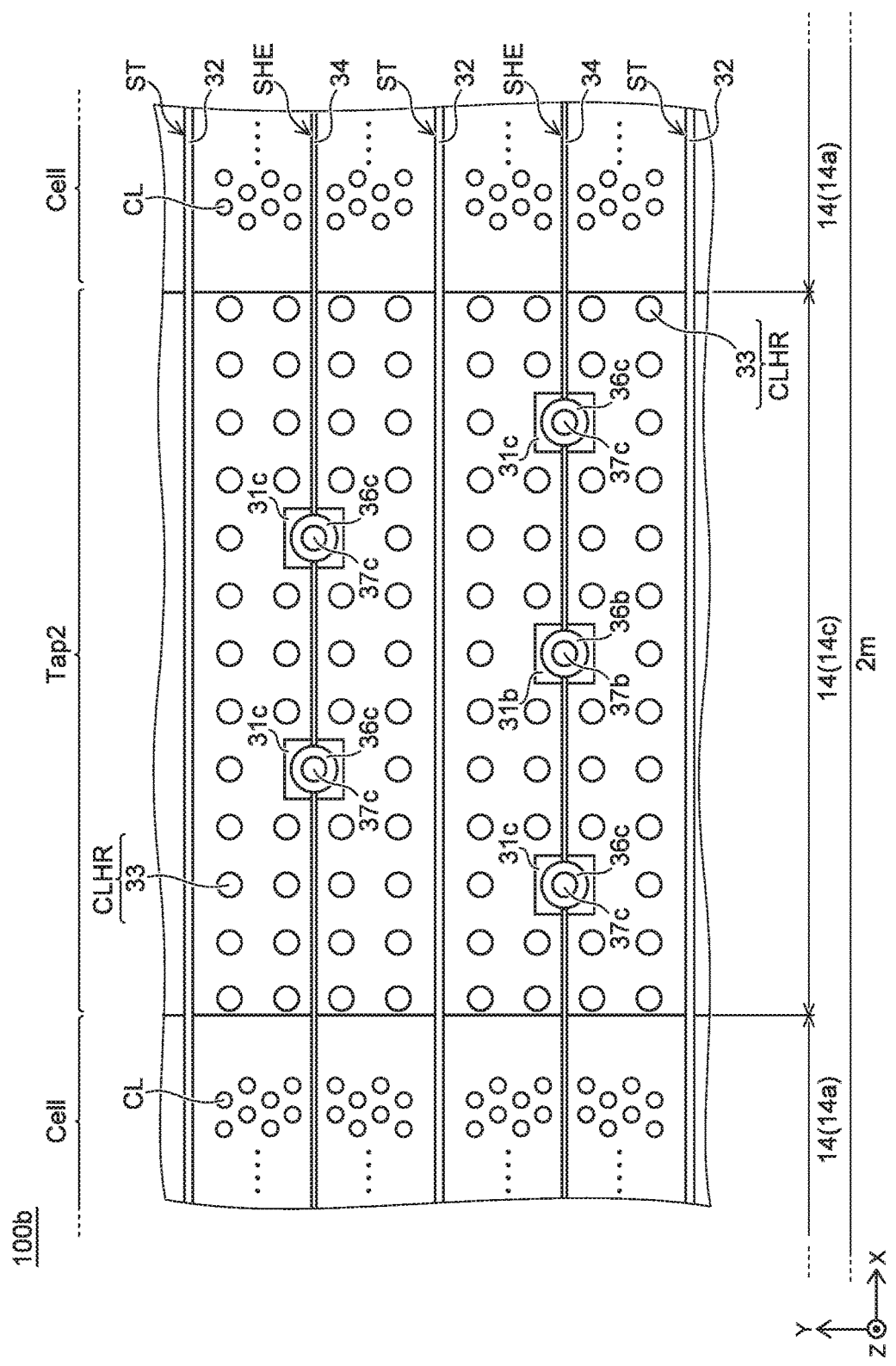
FIG. 42 is a schematic plan view illustrating a periphery of another tap region of the semiconductor device according to the second embodiment.
Figure 43:
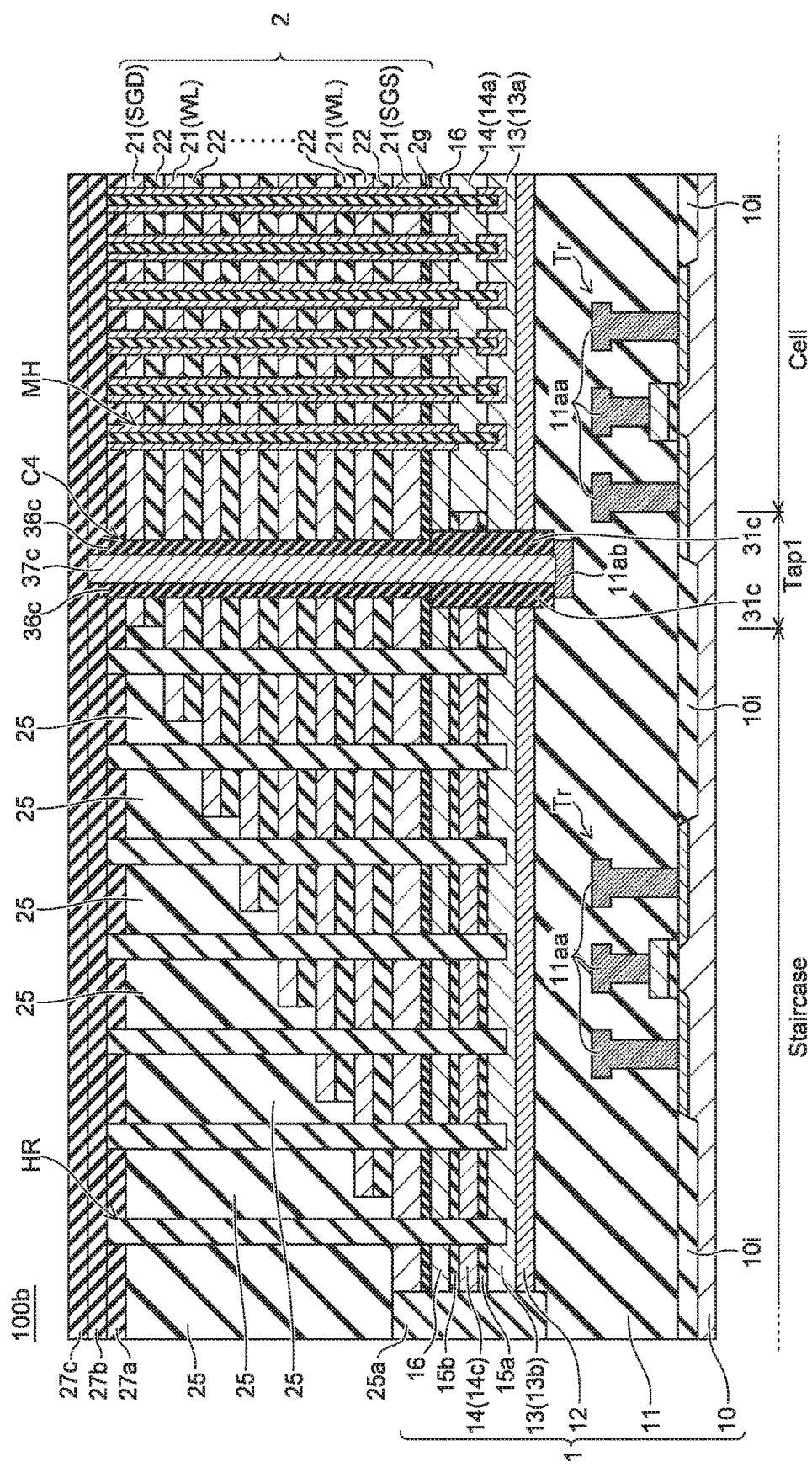
FIG. 43 is a schematic cross-sectional view along line XXXXIII-XXXXIII of FIG. 41.

FIG. 41 is a schematic plan view illustrating the periphery of the tap region Tap1 of a semiconductor device 100*b* according to a second embodiment. FIG. 42 is a schematic plan view illustrating the periphery of another tap region Tap2 of the semiconductor device 100*b* according to the second embodiment. FIG. 41 and FIG. 42 correspond respectively to the planes shown in FIG. 3 and FIG. 4. FIG. 43 is a schematic cross-sectional view along line XXXXIII-XXXXIII of FIG. 41.

As shown in FIG. 41 to FIG. 43, the semiconductor device 100*b* according to the second embodiment particularly differs from the semiconductor device 100 according to the first embodiment in that the first pedestal portion is not formed inside the first semiconductor portion 14; and a third region 14*c* of the first semiconductor portion 14 that is positioned on the second portion 13*b* of the first doped semiconductor film 13 is included. For example, the first portion 13*a* of the first doped semiconductor film 13 is positioned in the cell region (Cell). For example, the second portion 13*b* of the first doped semiconductor film 13 is positioned in the staircase region (Staircase) and the first and second tap regions (Tap1 and Tap2). For example, the third region 14*c* of the first semiconductor portion 14 has a composition that is different from that of the first region 14*a* of the first semiconductor portion 14.

For example, the third region 14*c* of the first semiconductor portion 14 is a P-type semiconductor in the case where the first region 14*a* of the first semiconductor portion 14 is an N-type semiconductor. The P-type semiconductor is, for example, P-type silicon and includes, for example, boron. For example, the etching resistance of silicon including boron is different from that of undoped silicon or that of silicon including one of phosphorus, arsenic, or antimony. Therefore, when forming the first space S1 described in the first embodiment, it is possible to etch only the undoped silicon or the doped silicon including one of phosphorus, arsenic, or antimony used to form the first sacrificial film while causing the third region 14*c* to remain.

Also, for example, the etching resistance of silicon doped with boron is different from that of silicon oxide. Therefore, the third region 14*c* that performs a role similar to that of the first pedestal portion 31 can be provided on the second portion 13*b* of the first doped semiconductor film 13.

Accordingly, in the second embodiment as well, similarly to the first embodiment, the narrowing of the second columnar portions CLHR can be suppressed; and the collapse of the stacked body 2 can be suppressed.

An insulator 25*a* shown in FIG. 43 is not illustrated in the first embodiment and is an insulator that insulates the first conductive film 12, the conductive layer 21 of the lowermost layer, and each layer formed as the source positioned between the first conductive film 12 and the conductive layer 21 of the lowermost layer. Insulators 27*a* to 27*c* also are insulators not illustrated in the first embodiment. For example, the insulator 27*a* insulates the upper portion of the stacked body 2. For example, the insulator 27*b* insulates the upper portions of the memory holes MH and the holes HR. For example, the insulator 27c insulates the upper portion of the conductor 37c.

Manufacturing Method

Figure 44A:
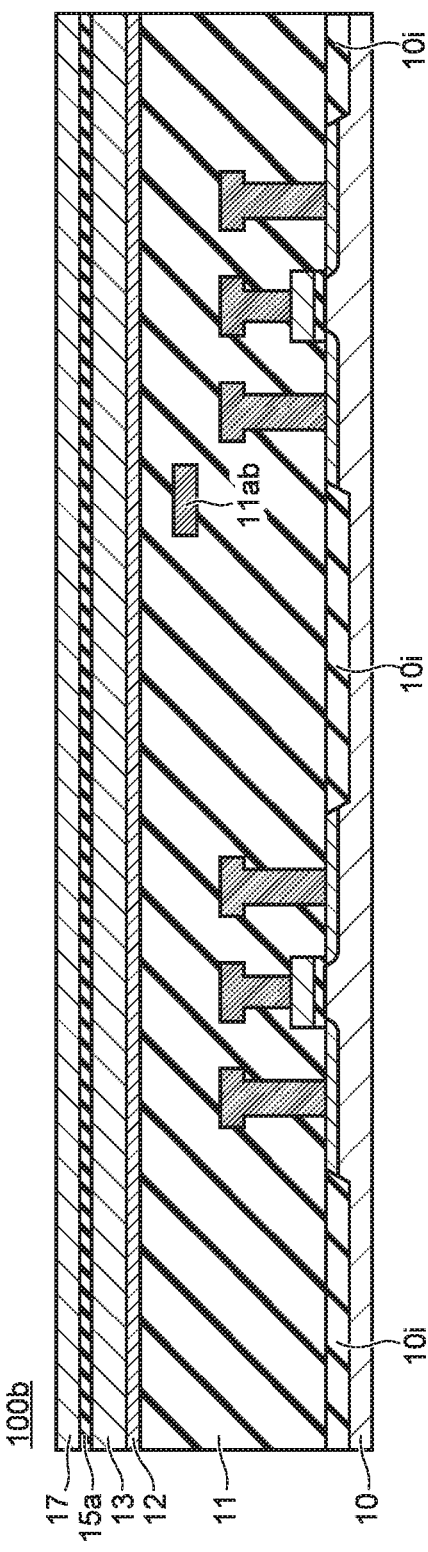
FIG. 44A and FIG. 44B are schematic cross-sectional views in order of the processes, illustrating a method for manufacturing the semiconductor device according to the second embodiment.
Figure 44B:
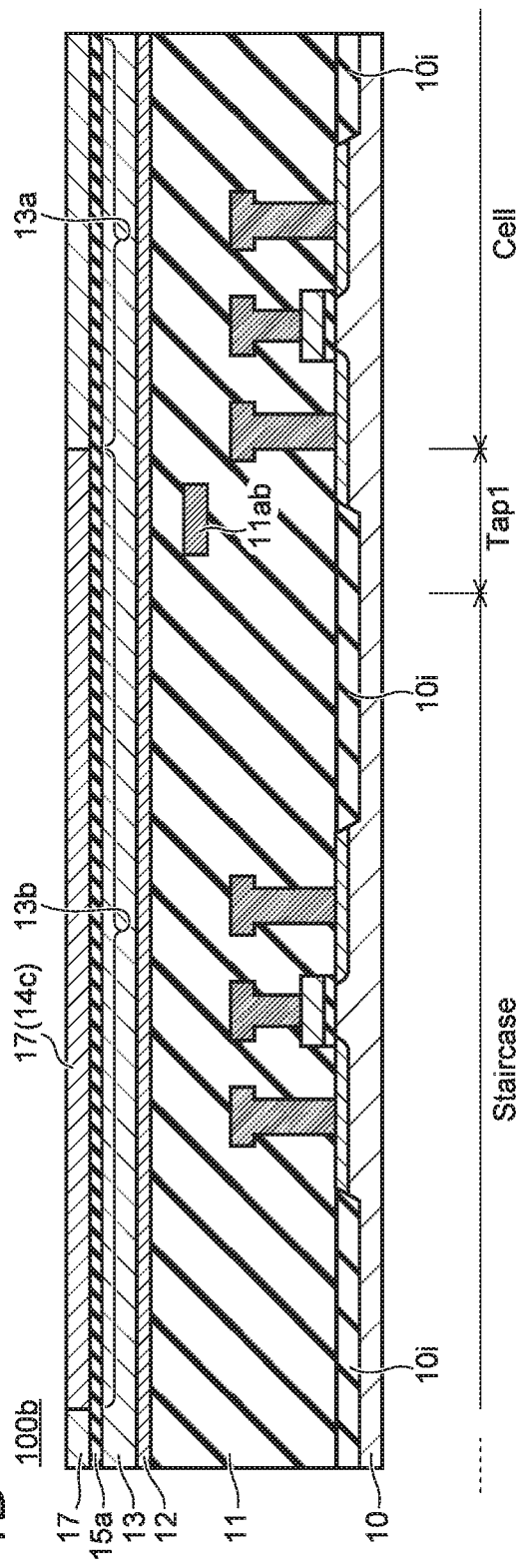

FIG. 44A and FIG. 44B are schematic cross-sectional views in order of the processes, illustrating a method for manufacturing the semiconductor device according to the second embodiment.

As shown in FIG. 44A, the first sacrificial film 17 is formed on the first intermediate film 15a according to the method for manufacturing the semiconductor device according to the first embodiment. The first sacrificial film 17 is, for example, undoped silicon.

Then, as shown in FIG. 44B, a P-type impurity, e.g., boron is introduced to the first sacrificial film 17 positioned on the second portion 13b of the first doped semiconductor film 13; and the doped silicon region is obtained. Thereby, the region that is used to form the third region 14c of the first semiconductor portion 14 is formed in the first sacrificial film 17.

Although the subsequent processes are not particularly illustrated and a description is omitted, it is sufficient to perform the manufacturing according to a manufacturing method similar to that of the first embodiment. Thus, the semiconductor device 100b according to the embodiment can be manufactured.

Thus, according to the embodiments, a semiconductor device can be provided in which it is possible to suppress the collapse of the stacked body.

The embodiments of the invention are described while referring to specific examples and several modifications. However, the embodiments of the invention are not limited to these specific examples and modifications.

One skilled in the art may similarly practice the invention by appropriately selecting specific configurations of components such as the base body portion 1, the stacked body 2, the first columnar portion CL, and the second columnar portion CLHR etc., from known art; and such practice is within the scope of the invention to the extent that similar effects can be obtained.

Any two or more components of the examples may be combined within the extent of technical feasibility and are within the scope of the invention to the extent that the spirit of the invention is included.

All semiconductor devices practicable by an appropriate design modification by one skilled in the art based on the semiconductor devices described above as the embodiments of the invention also are within the scope of the invention to the extent that the spirit of the invention is included.

Various modifications and alterations within the spirit of the invention will be readily apparent to those skilled in the art; and such modifications and alterations also should be seen as being within the scope of the invention.

The embodiments recited above are presented as examples and are not intended to limit the scope of the invention. The novel embodiments recited above may be implemented in other various forms; and various omissions, substitutions, and modifications can be performed without departing from the spirit of the invention. Such embodiments and their modifications are within the scope and spirit of the invention and are included in the invention described in the claims and their equivalents.

What is claimed is:

1. A semiconductor device, comprising:
a base body portion including a first layer and a second layer, the first layer being provided on a substrate with at least a first insulating film interposed, the first layer including a first portion and a second portion arranged along a first direction, the first portion being of a semiconductor, the second portion being of a semiconductor, the second layer including a first region and a second region, the first region being positioned on the first portion, the second region being positioned on the second portion, a portion of a source being formed of the first region;
a stacked body provided above the base body portion, the stacked body alternately including a conductive layer and an insulating layer;
a first pedestal portion provided inside at least the second layer, the first pedestal portion including a portion extending in the first direction in the second region of the second layer;
a plate portion including at least a first insulator, being provided from an upper end of the stacked body to the second layer, extending in the first direction, and contacting the first region of the second layer and the portion of the first pedestal portion extending in the first direction;
a plurality of first columnar portions, the plurality of first columnar portions each including a semiconductor layer and a memory film, being provided from the upper end of the stacked body to the second layer, and being adjacent to the plate portion in a second direction with the stacked body interposed, the second direction crossing the first direction, the semiconductor layer contacting the first region of the second layer, the memory film including a charge trapping portion between the semiconductor layer and the conductive layer; and
a plurality of second columnar portions including at least a second insulator, being provided from the upper end of the stacked body to the second layer, being adjacent to the plate portion in the second direction with the stacked body interposed, and being adjacent to the first pedestal portion in the second direction with the second region of the second layer interposed.

2. The device according to claim 1, wherein the first pedestal portion further includes a portion extending in the second direction between the first region and the second region of the second layer and being connected to the portion extending in the first direction.

* * * * *